(12) United States Patent
Kim et al.

(10) Patent No.: US 12,135,913 B2
(45) Date of Patent: Nov. 5, 2024

(54) DISPLAY APPARATUS

(71) Applicants: SAMSUNG ELECTRONICS CO., LTD., Suwon-si (KR); RESEARCH & BUSINESS FOUNDATION SUNGKYUNKWAN UNIVERSITY, Suwon-si (KR)

(72) Inventors: Jinho Kim, Suwon-si (KR); Yong-Sang Kim, Suwon-si (KR); Jongsu Oh, Suwon-si (KR); Eun Ho Kim, Suwon-si (KR); Seungran Park, Suwon-si (KR); Sara Hong, Suwon-si (KR); Donggun Oh, Suwon-si (KR)

(73) Assignees: SAMSUNG ELECTRONICS CO., LTD., Suwon-si (KR); RESEARCH & BUSINESS FOUNDATION SUNGKYUNKWAN UNIVERSITY, Suwon-si (KR)

(*) Notice: Subject to any disclaimer, the term of this patent is extended or adjusted under 35 U.S.C. 154(b) by 0 days.

(21) Appl. No.: 17/873,948

(22) Filed: Jul. 26, 2022

(65) Prior Publication Data

US 2023/0018546 A1 Jan. 19, 2023

Related U.S. Application Data

(63) Continuation of application No. PCT/KR2022/007407, filed on May 25, 2022.

(30) Foreign Application Priority Data

Jul. 14, 2021 (KR) .................. 10-2021-0092494
Jan. 11, 2022 (KR) .................. 10-2022-0004255

(51) Int. Cl.
  *G09G 3/3266* (2016.01)
  *G06F 3/147* (2006.01)
  (Continued)

(52) U.S. Cl.
  CPC ............... *G06F 3/147* (2013.01); *G09G 3/32* (2013.01); *G09G 2300/0819* (2013.01);
  (Continued)

(58) Field of Classification Search
  CPC .. G06G 3/147; G09G 3/32; G09G 2300/0819; G09G 2310/08;
  (Continued)

(56) References Cited

U.S. PATENT DOCUMENTS 6,774,868 B1   8/2004  Bowen
9,552,770 B2   1/2017  Song et al.
(Continued)

FOREIGN PATENT DOCUMENTS

CN   112652267 A     4/2021
CN   113096589 A  *  7/2021  ............... G09G 3/32
(Continued)

OTHER PUBLICATIONS

Communication dated Sep. 13, 2022, issued by the International Searching Authority in counterpart International Application No. PCT/KR2022/007407 (PCT/ISA/210).
(Continued)

*Primary Examiner* — Lin Li
(74) *Attorney, Agent, or Firm* — Sughrue Mion, PLLC

(57) ABSTRACT

Disclosed is a display apparatus. The display apparatus includes: display modules, each of which includes: a display panel composed of inorganic light emitting elements arranged in row lines, and sub-pixel circuits respectively corresponding to the inorganic light emitting elements; and a driver configured to drive the sub-pixel circuits in an order of the row lines based on a start signal provided from a timing controller. The timing controller is configured to: provide a first start signal to the driver of a first display module to control the inorganic light emitting elements to (Continued)

sequentially emit light from a first row line to a last row line, and provide a second start signal to the driver of a second display module to control the inorganic light emitting elements to sequentially emit light following an emission order of the inorganic light emitting elements included in the last row line of the first display module.

14 Claims, 46 Drawing Sheets

(51) Int. Cl.
  *G09G 3/32* (2016.01)
  *G09G 3/3233* (2016.01)
  *G09G 5/12* (2006.01)
  *H05B 33/02* (2006.01)

(52) U.S. Cl.
  CPC . *G09G 2310/08* (2013.01); *G09G 2320/0233* (2013.01); *G09G 2320/0242* (2013.01); *G09G 2320/0633* (2013.01); *G09G 2320/064* (2013.01)

(58) Field of Classification Search
  CPC .... G09G 2320/0233–0242; G09G 2320/0633; G09G 2320/064
  See application file for complete search history.

(56) References Cited

U.S. PATENT DOCUMENTS

| | | | |
|---|---|---|---|
| 10,741,118 | B2 | 8/2020 | Park et al. |
| 10,818,240 | B2 | 10/2020 | Park |
| 11,056,047 | B2 | 7/2021 | Shigeta et al. |
| 11,205,373 | B2 | 12/2021 | Lee |
| 11,210,995 | B2 | 12/2021 | Kim et al. |
| 2016/0055798 | A1 | 2/2016 | Song et al. |
| 2016/0239249 | A1* | 8/2016 | Lee .......................... G09G 5/12 |
| 2018/0075803 | A1* | 3/2018 | Lee ....................... G09G 3/3266 |
| 2018/0130404 | A1 | 5/2018 | Park et al. |
| 2018/0197481 | A1 | 7/2018 | Choi et al. |
| 2019/0019449 | A1* | 1/2019 | Pappas ...................... G09G 3/32 |
| 2020/0111403 | A1 | 4/2020 | Kim et al. |
| 2020/0160789 | A1 | 5/2020 | Park |
| 2020/0211509 | A1* | 7/2020 | Choi ..................... G09G 3/3233 |
| 2020/0265777 | A1 | 8/2020 | Shigeta et al. |
| 2020/0335034 | A1 | 10/2020 | Lee |
| 2020/0357333 | A1 | 11/2020 | Park et al. |
| 2021/0020732 | A1* | 1/2021 | Watanabe .............. H05B 33/02 |
| 2021/0201782 | A1 | 7/2021 | Jang et al. |
| 2021/0202676 | A1* | 7/2021 | Jeong ................... G09G 3/3266 |
| 2021/0210002 | A1 | 7/2021 | Kim et al. |
| 2021/0210003 | A1 | 7/2021 | Kim et al. |
| 2021/0304670 | A1 | 9/2021 | Shigeta et al. |
| 2022/0208130 | A1* | 6/2022 | Park ....................... G09G 3/3266 |

FOREIGN PATENT DOCUMENTS

| | | |
|---|---|---|
| KR | 10-2016-0022972 A | 3/2016 |
| KR | 10-2018-0050125 A | 5/2018 |
| KR | 10-2020-0058702 A | 5/2020 |
| KR | 10-2020-0101605 A | 8/2020 |
| KR | 10-2020-0114868 A | 10/2020 |
| KR | 10-2020-0123640 A | 10/2020 |
| KR | 10-2021-0085050 A | 7/2021 |
| KR | 10-2021-0085066 A | 7/2021 |
| KR | 10-2021-0087873 A | 7/2021 |
| WO | 2020/236977 A1 | 11/2020 |

OTHER PUBLICATIONS

Communication dated Sep. 13, 2022, issued by the International Searching Authority in counterpart International Application No. PCT/KR2022/007407 (PCT/ISA/237).

Communication issued Aug. 8, 2024 by the European Patent Office in the European Patent application No. 22842274.7.

* cited by examiner

DISPLAY APPARATUS

CROSS-REFERENCE TO RELATED APPLICATION

This application is a bypass continuation of International Application No. PCT/KR2022/007407, filed on May 25, 2022, which is based on and claims priority to Korean Patent Application No. 10-2021-0092494, filed on Jul. 14, 2021, in the Korean Intellectual Property Office, and Korean Patent Application No. 10-2022-0004255, filed on Jan. 11, 2022, in the Korean Intellectual Property Office, the disclosures of which are incorporated by reference herein in their entireties.

TECHNICAL FIELD

The disclosure relates to a display apparatus and, more specifically, to a display apparatus including a pixel array including self-emitting elements.

BACKGROUND ART

An inorganic light emitting element, such as a red light emitting diode (LED), a green LED, and a blue LED (hereinafter, LED refers to an inorganic light emitting element), may be driven as a sub-pixel, and a gray scale of a sub-pixel may be controlled by a pulse amplitude modulation (PAM) driving method.

In the PAM driving method, both wavelength and brightness (i.e., gray scale) of emitted light may change based on a magnitude of a driving current, resulting in decrease in color reproducibility of an image. FIG. 1 illustrates a wavelength change according to the magnitude of a driving current flowing through a blue LED, a green LED, and a red LED.

Accordingly, there is a need for a method of driving a self-emissive display panel with improved color reproduction. At this time, a power consumption problem, a brightness uniformity problem, and the like, need to be considered.

When one modular display panel is configured by combining a plurality of display modules, distortion of an image that may occur at the boundary of the upper and lower display modules should be considered.

DISCLOSURE

Technical Problem

One or more embodiments provide a display apparatus capable of preventing a phenomenon in which a wavelength of light emitted from an inorganic light emitting element changes according to a gray scale, and a driving method thereof.

One or more embodiments provide a display apparatus and a driving method thereof, capable of compensating for a stain that might appear in an image due to a difference in threshold voltage between driving transistors, and correcting a color.

One or more embodiments provide a display apparatus which includes a display module or a display apparatus which includes a modular display panel composed of a plurality of display modules and a driving method thereof, capable of compensating for a stain that might appear in an image due to a difference in threshold voltage between driving transistors, and correcting a color.

One or more embodiments provide a display apparatus capable of reducing power consumption consumed in driving a display panel and a driving method thereof.

One or more embodiments provide a display apparatus and a method for driving the same, capable of compensating an effect of a drop of a driving voltage generated differently for each position of a display panel in a process of setting a data voltage.

One or more embodiments provide a display apparatus with an optimized driving circuit, which is capable of stably and efficiently driving an inorganic light emitting element, and a driving method thereof.

One or more embodiments provide a display apparatus capable of removing distortion of an image which may occur at a boundary of upper and lower display modules when a modular display panel is formed by combining a plurality of display modules, and a driving method thereof.

Technical Solution

In accordance with an aspect of the disclosure, a display apparatus includes: a modular display panel comprising a plurality of display modules disposed in a matrix form; and a timing controller. Each of the plurality of display modules comprises: a display panel comprising a pixel array in which pixels each composed of a plurality of inorganic light emitting elements are arranged in a plurality of row lines, and sub-pixel circuits respectively corresponding to inorganic light emitting elements of the pixel array; and a driver configured to drive the sub-pixel circuits in an order of the plurality of row lines based on a start signal provided from the timing controller. The timing controller is further configured to: provide a first start signal to the driver of a first display module among the plurality of display modules to control the inorganic light emitting elements of the first display module to sequentially emit light from a first row line to a last row line, and provide a second start signal to the driver of a second display module disposed adjacent to a bottom of the first display module to control the inorganic light emitting elements of the second display module to sequentially emit light following an emission order of the inorganic light emitting elements included in the last row line of the first display module.

The driver may be further configured to, based on the start signal, provide a gate signal in the order of the plurality of row lines to the sub-pixel circuits to drive the sub-pixel circuits in the order of the plurality of row lines, and the gate signal may include a scan signal configured to provide an image data voltage to the sub-pixel circuits and an emission signal configured to control inorganic light emitting elements of the pixel array to emit light based on the image data voltage.

The sub-pixel circuits may be driven in an order of a data setting section and a plurality of emission sections for each row line of the plurality of row lines with respect to one image frame, and the driver may be further configured to provide the scan signal to the sub-pixel circuits of a corresponding row line during the data setting section of the corresponding row line, and apply the emission signal to the sub-pixel circuits of the corresponding row line during each of the plurality of emission sections of the corresponding row line.

A first emission section among the plurality of emission sections may be temporally adjacent the data setting section, and the plurality of emission sections may have a preset time interval from each other.

The image data voltage may include a constant current generator data voltage and a pulse width modulation (PWM) data voltage. Each of the sub-pixel circuits may include: a constant current generator circuit which comprises a first driving transistor and is configured to provide a constant current to a corresponding inorganic light-emitting element based on the constant current generator data voltage; and a PWM circuit which comprises a second driving transistor and is configured to control a time during which the constant current is provided to the corresponding inorganic light-emitting element based on the PWM data voltage.

The constant current generator circuit may be further configured to provide, in each of the plurality of emission sections, the constant current to the corresponding inorganic light-emitting element based on a first voltage applied to a gate terminal of the first driving transistor, and the first voltage may be based on the constant current generator data voltage and a threshold voltage of the first driving transistor.

The constant current generator circuit may include: a first transistor comprising a source terminal to which the constant current generator data voltage is applied and a drain terminal connected to a source terminal of the first driving transistor; and a second transistor comprising a source terminal connected to a drain terminal of the first driving transistor, and a drain terminal connected to the gate terminal of the first driving transistor. The constant current generator circuit may be further configured to apply, in the data setting section, based on the first transistor and the second transistor being turned on while the first driving transistor is turned on, a voltage which is a sum of the constant current generator data voltage and the threshold voltage of the first driving transistor to the gate terminal of the first driving transistor.

The PWM circuit may be configured to control, in each of the plurality of emission sections, a time during which the constant current is provided to the corresponding inorganic light-emitting element based on a second voltage applied to a gate terminal of the second driving transistor, and the second voltage may be based on a threshold voltage of the second driving transistor, the PWM data voltage, and a sweep voltage sweeping between two voltages.

The PWM circuit may include a first capacitor having a first end connected to a source terminal of the second driving transistor and a second end connected to the gate terminal of the second driving transistor, the second driving transistor may operate as a source follower while the constant current generator data voltage is applied to a drain terminal of the second driving transistor, and the threshold voltage of the second driving transistor may be obtained at the source terminal of the second driving transistor while the second driving transistor operates as the source follower, and may be coupled to the gate terminal of the second driving transistor through the first capacitor.

The PWM circuit may include a second capacitor having a first end connected to the gate terminal of the second driving transistor and a second end to which the PWM data voltage and the sweep voltage are applied. The PWM data voltage may be applied to the second end of the second capacitor in the data setting section, and based on the sweep voltage being applied to the second end of the second capacitor in each of the plurality of emission sections, may be coupled to the gate terminal of the second driving transistor along with the sweep voltage through the second capacitor.

A drain terminal of the second driving transistor may be connected to a source terminal of the first driving transistor, the constant current generator circuit may be configured to, in each of the plurality of emission sections, provide the constant current to the corresponding inorganic light-emitting element while a driving voltage is applied to the source terminal of the first driving transistor, the PWM circuit may be configured to, in each of the plurality of emission sections, apply the driving voltage to the source terminal of the first driving transistor during a time period in which the second driving transistor is turned on while the second voltage is changed according to a change of the sweep voltage, and the time period in which the second driving transistor is turned on may be based on a magnitude of the PWM data voltage.

The sweep voltage may be a portion of an input sweep signal selected based on the emission signal, the input sweep signal may have a voltage which linearly and repeatedly varies from a first voltage to a second voltage, and the input sweep signal may be commonly applied to each of the sub-pixel circuits of the display panel.

The sweep voltage, in each of the plurality of emission sections, may sweep voltages between the first voltage and the second voltage one time, and a start voltage at which the sweep voltage starts sweeping may vary according to a row line.

The PWM circuit may be configured to, in each of the plurality of emission sections, control a time during which the constant current is provided to the corresponding inorganic light-emitting element based on a third voltage applied to a gate terminal of the second driving transistor, and the third voltage may be based on the PWM data voltage in which a threshold voltage of the second driving transistor is compensated and a sweep voltage sweeping between two voltages.

The plurality of sub-pixel circuits may be driven by a first driving voltage in each of the plurality of emission sections, and may be driven by a second driving voltage separate from the first driving voltage in the data setting section.

The sub-pixel circuits are driven by a first driving voltage in each of the plurality of emission sections, and are driven by a second driving voltage separate from the first driving voltage in the data setting section.

Effect of Invention

According to various embodiments, by driving an inorganic light emitting element by PWM driving in an AM matrix manner, a phenomenon in which the wavelength of light emitted from the inorganic light emitting element changes according to gray scale may be prevented.

In addition, stains that might appear in the image due to a variation in the threshold voltage of the driving transistors may be compensated. In addition, the color correction is facilitated.

In addition, a display apparatus including one display module or a display apparatus including a modular display panel including a plurality of display modules, stain compensation or color correction of the display panel may be facilitated.

In addition, instantaneous peak power consumption may be reduced by driving the display panel such that the inorganic light emitting elements sequentially emit light in the order of row lines.

In addition, the effect of the drop of the driving voltage generated differently for each position of the display panel on the process of setting the data voltage may be compensated.

An optimized driving circuit may be designed, and the inorganic light emitting element may be stably and efficiently driven.

In addition, when configuring the modular display panel by combining the plurality of display modules, distortion of an image that may occur at the boundary of the upper and lower display modules may be removed.

DESCRIPTION OF DRAWINGS

The above and other aspects, features and advantages of certain embodiments of the present disclosure will be more apparent from the following description taken in conjunction with the accompanying drawings, in which.

MODE FOR INVENTION

Figure 1:
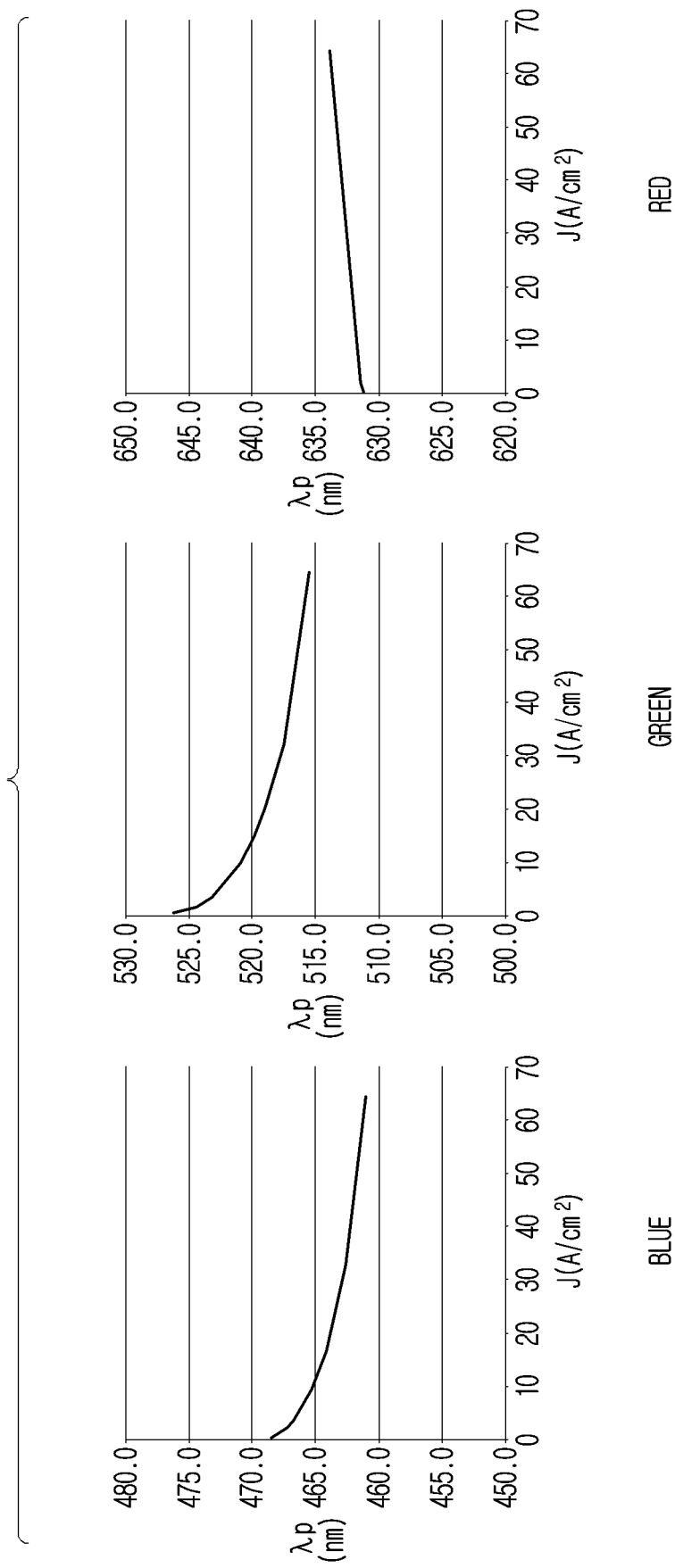
FIG. 1 is a graph illustrating a change in wavelength according to the magnitude of a driving current flowing through a blue light emitting diode (LED), a green LED, and a red LED.

Various embodiments will be described more fully hereinafter with reference to the accompanying drawings. In the drawings, like numerals refer to like elements throughout. As used herein, the terms "1st" or "first" and "2nd" or "second" may use corresponding component regardless of importance or order and are used to distinguish a component from another without limiting the components. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

The terminology used in this disclosure is used to describe embodiments, and is not intended to restrict and/or limit the disclosure to the described embodiments. Further, the singular representation of any configuration used in the disclosure includes a plurality of representations, except a case where the singular representation only refers to a singular number.

It is to be understood that the terms such as "comprise", "include" or "have" may, for example, be used to designate a presence of a characteristic, number, step, operation, element, component, or a combination thereof, and not to preclude a presence or a possibility of adding one or more of other characteristics, numbers, steps, operations, elements, components or a combination thereof.

If it is described that a certain element (e.g., first element) is "connected to" another element (e.g., second element), it should be understood that the first element may be directly connected to the second element or may be connected to the second element through still another element (e.g., third element).

On the other hand, if it is described that a certain element (e.g., first element) is "directly connected to" another element (e.g., second element), it may be understood that there is no element (e.g., third element) between the first element and the second element.

The terms used herein may be interpreted in a meaning commonly known to those of ordinary skill in the art unless otherwise defined.

FIG. 1 illustrates a wavelength change according to the magnitude of a driving current flowing through a blue LED, a green LED, and a red LED.

Figure 2:
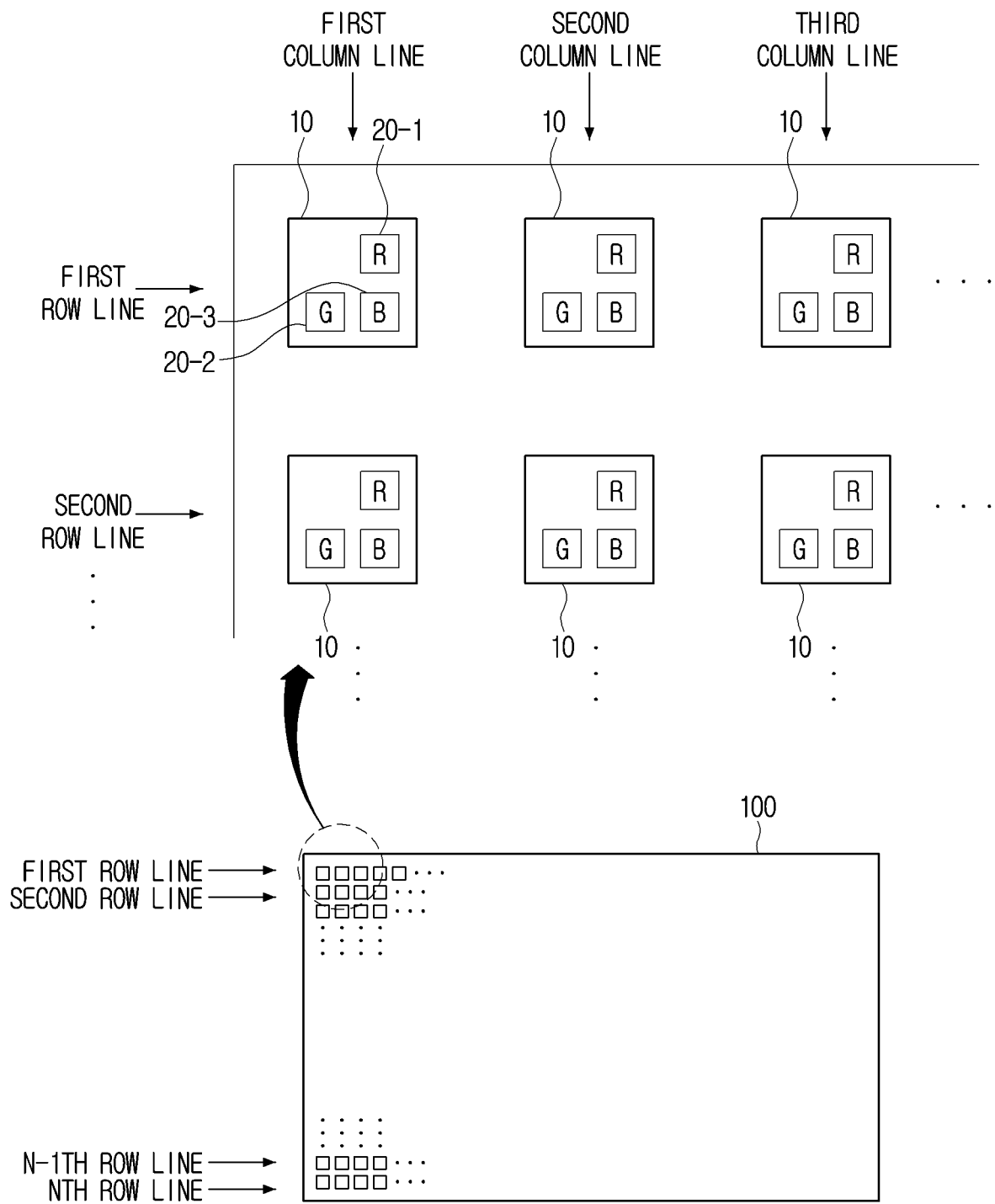
FIG. 2 illustrates a pixel structure of a display panel according to an embodiment.

FIG. 2 illustrates a pixel structure of a display panel according to an embodiment.

Referring to FIG. 2, a display panel 100 includes a plurality of pixels 10 disposed or arranged in a matrix form, which may be referred to as a pixel array.

The pixel array includes a plurality of row lines or a plurality of column lines. The row line may also be referred to as a horizontal line, a scan line, or a gate line, and the column line may also be referred to as a vertical line or a data line.

According to an example, a term such as a row line, a column line, a horizontal line, and a vertical line may be used as a word to refer to a line formed by pixels on a pixel array, and the term scan line, gate line, and data line may be used as a word to refer to the actual wiring on the display panel 100 to which data or signals are transmitted.

Each pixel 10 of the pixel array may include three types of sub-pixels including a red (R) sub-pixel 20-1, a green (G) sub-pixel 20-2, and a blue (B) sub-pixel 20-3.

Each pixel 10 may include a plurality of inorganic light emitting elements respectively constituting a plurality of sub-pixels 20-1, 20-2, and 20-3.

For example, each pixel 10 may include three types of inorganic light-emitting elements, such as an R-inorganic light-emitting element constituting R-sub-pixels 20-1, a G-inorganic light-emitting element constituting G-sub-pixels 20-2, and a B-inorganic light-emitting element constituting B-sub-pixels 20-3.

Each pixel 10 may include three blue inorganic light emitting elements. In this example, a color filter for implementing R, G, or B colors may be provided on each inorganic light emitting element. The color filter may be a quantum dot (QD) color filter, but embodiments are not limited thereto.

A sub-pixel circuit for driving an inorganic light-emitting element may be provided on the display panel 100 for each inorganic light-emitting element.

Each sub-pixel circuit may provide a driving current to a corresponding inorganic light emitting element based on image data voltage applied from the outside.

In detail, the image data voltage includes a constant current generator (CCG) data voltage and a pulse width modulation (PWM) data voltage. Each sub-pixel circuit may represent a gray scale of an image by providing a driving current of magnitude corresponding to a constant current generator data voltage to an inorganic light emitting element for a time corresponding to a PWM data voltage. The detailed description will be described later.

The sub pixel circuits included in each row line of the display panel 100 may be driven in the order of "setting (or programming) image data voltage" and "providing driving current based on the set image data voltage".

According to an embodiment, the sub-pixel circuits included in each row line of the display panel 100 may be sequentially driven in the order of row lines.

For example, the image data voltage setting operation of the sub-pixel circuits included in one row line (e.g., the first row line) and the image data voltage setting operation of the sub-pixel circuits included in the next row line (e.g., the second row line) may be sequentially performed in the order of row lines. Further, the driving current providing operation of the sub-pixel circuits included in one row line (e.g., the first row line) and the driving current providing operation of the sub-pixel circuits included in the next row line (e.g., the second row line) may also be sequentially performed in the order of the row lines.

Referring to FIG. 2, the sub-pixels 20-1 to 20-3 in one-pixel region are arranged in an inverted L-shape. However, an embodiment is not limited thereto, and the R, G, and B sub-pixels 20-1 to 20-3 may be arranged in a line inside a pixel region, and may be arranged in various shapes according to an embodiment.

Referring to FIG. 2, three-types of sub-pixels may form one pixel as an example. However, according to an embodiment, a pixel may include other numbers of sub-pixels. For example, one pixel may include four kinds of sub-pixels such as R, G, B, and white (W), other any other number of sub-pixels.

Figure 3A:
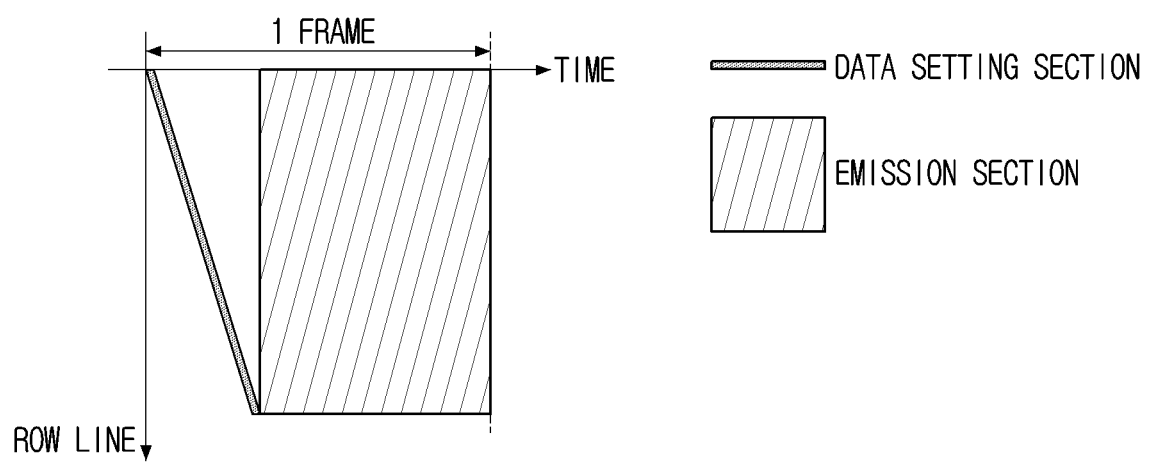
FIG. 3A is a conceptual diagram illustrating a driving method of a related art display panel.
Figure 3B:
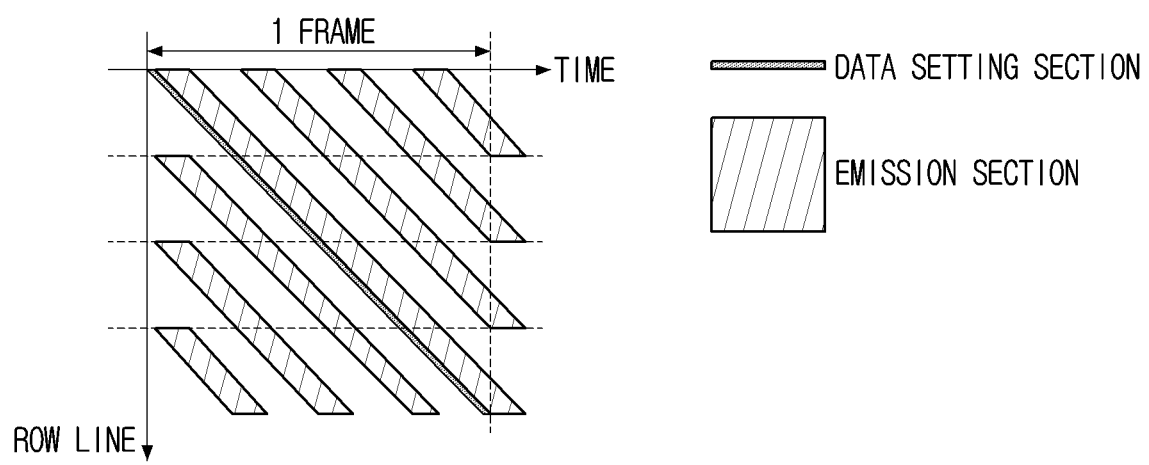
FIG. 3B is a conceptual diagram illustrating a driving method of a display panel according to an embodiment.
Figure 3C:
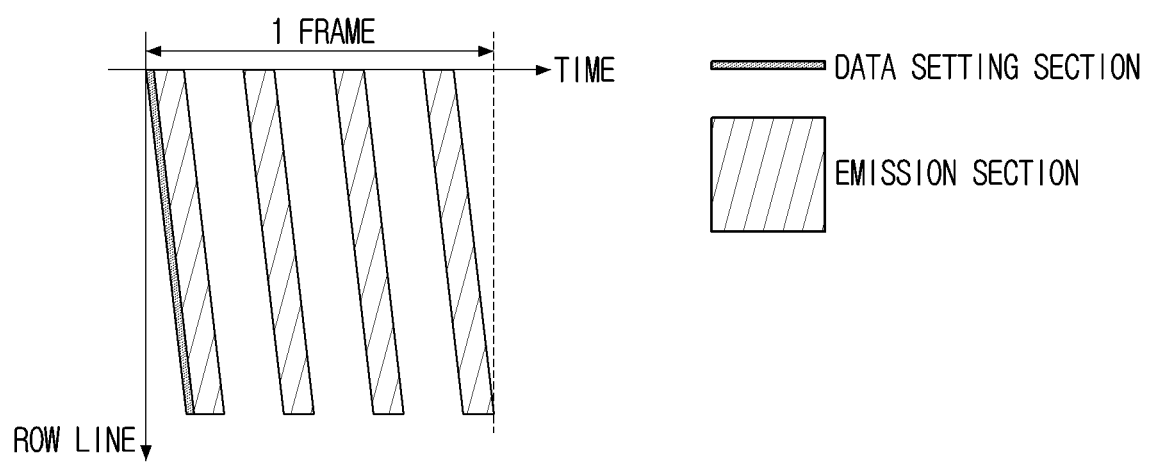
FIG. 3C is a conceptual diagram illustrating a driving method of a display panel according to an embodiment.

FIG. 3A is a conceptual diagram illustrating a driving method of a related art display panel; and FIGS. 3B and 3C are conceptual diagrams illustrating a driving method of a display panel according to an embodiment.

FIGS. 3A to 3C illustrate a method of driving a display panel for one image frame time. Referring to FIGS. 3A to 3C, the vertical axis represents the row line of the display panel 100 and the horizontal axis represents time. The data setting section may represent a driving period of the display panel 100 in which the image data voltage is set to the sub-pixel circuits included in each row line, and the emission section may represent a driving period of the display panel 100 in which the sub-pixel circuits included in each row line provide a driving current to the inorganic light-emitting element based on the image data voltage set in the data setting section. The inorganic light emitting elements emit light according to the driving current in the emission section.

Referring to FIG. 3A, in the related art, after the settings of the image data voltage for all row lines of the display panel are completed in the order of row lines, the emission sections for all row lines collectively proceeds at once.

In this example, the entire row lines of the display panel emit light simultaneously during the emission section, requiring high peak current, and thus, there is a problem in that peak power consumption required for a product is increased. When peak power consumption increases, a capacity of a power supply device such as a switched mode power supply (SMPS) installed in a product increases, resulting in an increase in cost and size, which causes design restriction.

According to an embodiment, on the contrary, a data setting section and an emission section (specifically, a plurality of emission sections) of row lines may sequentially proceed in the order of row lines.

FIGS. 3B and 3C illustrate two embodiments in which the data setting section and the emission section sequentially proceed in the order of row lines.

Referring FIG. 3B, data setting sections for entire row lines may proceed for one frame time. Referring to FIG. 3C, data setting sections for entire row lines may proceed for a time that is much shorter than one frame time. In both embodiments, both the data setting section and the emission section sequentially proceed in the order of row lines.

Hereinafter, as shown in FIG. 3B and FIG. 3C, a driving method in which a data setting section and an emission section are sequentially performed in the order of row lines is referred to as a "progressive driving method" as distinguished from the batch driving method of FIG. 3A.

In the case of the progressive driving method, because the number of row lines which simultaneously emit light is reduced compared to the related art, the required peak current amount may be lowered, and accordingly, peak power consumption may be reduced.

As described above, according to embodiments, the display panel 100 may be driven by an active matrix (AM) method, and each sub-pixel may represent a gray scale of an image in a PWM scheme. Therefore, unlike the related art for expressing the gray scale in the PAM method, it is possible to prevent a problem in which the wavelength of the light emitted from the inorganic light emitting element changes according to the gray scale. In addition, instantaneous peak power consumption may be reduced by driving the display panel 100 so that sub-pixels sequentially emit light in the order of row lines.

Figure 4:
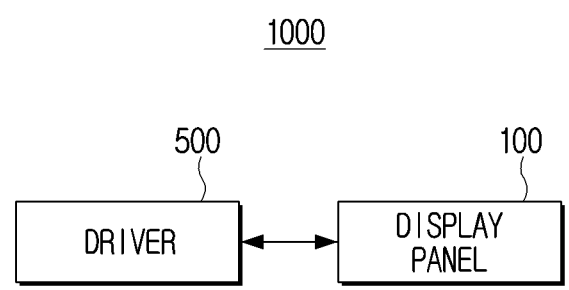
FIG. 4 is a block diagram illustrating a display module according to an embodiment.

FIG. 4 is a block diagram illustrating a display module according to an embodiment. Referring to FIG. 4, a display module 1000 includes the display panel 100 and the driver 500.

The driver 500 drives the display panel 100. The driver 500 may provide various control signals, data signals, driving voltages, or the like, to the display panel 100 to drive the display panel 100.

As described above, according to an embodiment, the display panel 100 may be driven in the order of row lines. For this, the driver 500 may include a gate driver for driving the pixels on the pixel array on a row-line basis. The gate driver may drive the pixels by row lines by providing a scan signal (e.g., VST(n), SP(n), SCCG(n), SPWM(n), Vcomp(n), Vini(n), Vini2($n$)) and an emission signal (e.g., Emi(n)) for each row line. At this time, a gate driver providing a scan signal may be referred to as a scan driver, distinguished from a gate driver providing an emission signal referred to as an emission driver.

The driver 500 may also include a data driver (or source driver) for providing a PWM data voltage (e.g., VPWM_R/G/B) to each pixel (or each sub-pixel) of the display panel 100.

The driver 500 may include a demultiplexer circuit for selecting each of the plurality of sub-pixels 20-1 to 20-3 included in one pixel 10.

The driver 500 may include a power integrated circuit (IC) (or a DC voltage providing circuit) for providing various DC voltages (e.g., first driving voltage (VDD_PAM), second driving voltage (VDD_PWM), ground voltage (VSS), reference voltage (Vref), or the like) or the constant current generator data voltage (e.g., VCCG_R/G/B) to each sub-pixel circuit included in the display panel 100.

The driver 500 may include a level shifter for shifting levels of various signals provided by a timing controller (TCON) to a level used in the driver (e.g., a gate driver or a data driver) or a level used by the display panel 100.

The level shifter may shift the level of the start signal VST or various clock signals provided from the TCON to be provided to the gate driver. It should be noted that the start signal VST is different from the VST(n), which is one of the scan signals described above. The VST(n) is one kind of the scan signal applied to the sub-pixel circuit from the gate driver, while the VST is the control signal provided to the gate driver from the TCON through the level shifter. The details of the VST(n) and the VST will be described below, respectively.

The level shifter may shift the level of the sweep signal (Sweep) or the test signal (TEST) generated in the TCON and provide the shifted signal to the sub-pixel circuits of the display panel 100. The detailed description of test signals or sweep signals will be described later.

According to an embodiment, at least some of the various elements of the driver 500 described above may be mounted on a printed circuit board (PCB) separate from the display panel 100 and may be connected to sub-pixel circuits formed on a thin film transistor (TFT) layer of the display panel 100 through the film on glass (FOG) wiring.

At least some of the various elements described above may be arranged on a chip on film (COF) formed on a film, and may be connected to sub-pixel circuits formed on the TFT layer formed on the display panel 100 through the FOG wiring.

At least some of the various elements described above may be arranged on a COG form (that is, arranged on a rear surface (an opposite side of a surface on which the TFT layer is formed with respect to the glass substrate) of the glass substrate (described below) of the display panel 100), and may be connected to the sub-pixel circuits formed on the TFT layer of the display panel 100 through the connection wiring.

At least some of the various elements described above may be formed in the TFT layer together with the sub-pixel circuits formed in the TFT layer in the display panel 100 and may be connected to the sub-pixel circuits.

For example, among various elements described above, the gate driver circuit and the demultiplexer circuit may be formed in the TFT layer of the display panel 100, the data driver may be arranged on the rear surface of the glass substrate of the display panel 100, and the level shifter may be arranged on a film in a COF format, and the power IC and a timing controller (TCON) may be arranged on a separate external PCB, but embodiments are not limited thereto.

The driver 500 may drive the display panel 100 in a progressive driving manner. The driver 500 may set the image data voltage in the order of row lines to the sub-pixel circuits of the display panel 100 during the data setting section, and may drive the sub-pixel circuits such that the pixels of the pixel array emit light in the order of the row lines based on the set image data voltage during the emission section.

The display panel 100 may include the pixel array as described in FIG. 2 and may display an image corresponding to the applied image data voltage.

Each sub-pixel circuit included in the display panel 100 may provide a driving current in which magnitude and driving time (or pulse width) are controlled based on an image data voltage, to a corresponding inorganic light emitting element.

The inorganic light emitting elements constituting the pixel array may emit light according to a driving current provided from a corresponding sub-pixel circuit, and thus an image may be displayed on the display panel 100.

Figure 5A:
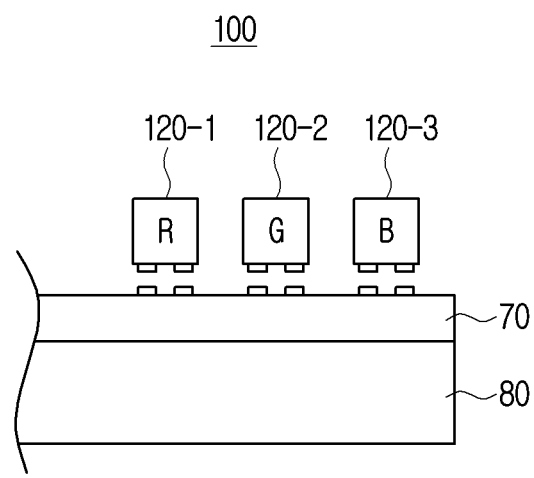
FIG. 5A is a cross-sectional view of a display panel according to an embodiment.

FIG. 5A is a cross-sectional view of the display panel 100 according to an embodiment. Referring to FIG. 5A, for convenience, only one pixel included in the display panel 100 is illustrated.

Referring to FIG. 5A, the display panel 100 may include a glass substrate 80, a TFT layer 70, and an inorganic light emitting element R, G, B (120-1, 120-2, and 120-3). In this example, the sub-pixel circuit 110 may be implemented as a thin film transistor (TFT), and may be included in the TFT layer 70 on the glass substrate 80.

Each of the inorganic light emitting element R, G, B (120-1, 120-2, and 120-3) may be mounted on the TFT layer 70 so as to be electrically connected to the corresponding sub-pixel circuit 110 to form the sub-pixel described above.

The sub-pixel circuit 110 for providing a driving current to the inorganic light-emitting elements 120-1, 120-2, and 120-3 may exist for each inorganic light-emitting elements 120-1, 120-2, and 120-3, and each of the inorganic light-emitting elements 120-1, 120-2, and 120-3 may be mounted or arranged on the TFT layer 70 to be electrically connected to the corresponding sub-pixel circuit 110.

Referring to FIG. 5A, the inorganic light-emitting devices R, G, and B (120-1, 120-2, and 120-3) are flip-chip type micro LEDs. However, embodiments are not limited thereto, and the inorganic light-emitting devices R, G, and B (120-1, 120-2, and 120-3) may be a lateral type or a vertical type micro LED according to an embodiment.

Figure 5B:
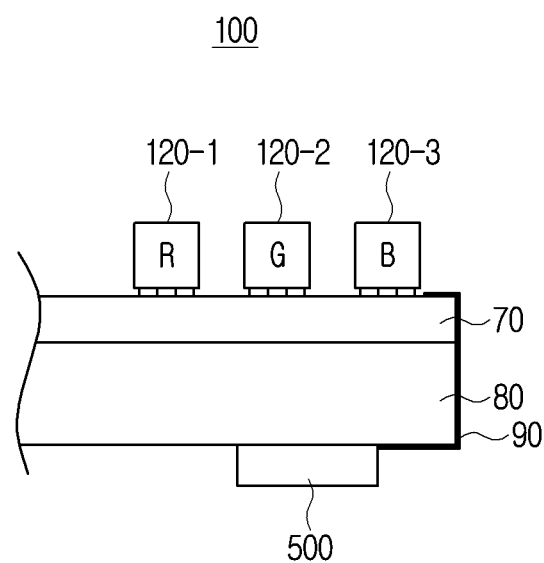
FIG. 5B is a cross-sectional view of a display panel according to an embodiment.

FIG. 5B is a cross-sectional view of the display panel 100 according to an embodiment.

Referring to FIG. 5B, the display panel 100 may include a TFT layer 70 formed on one surface of the glass substrate 80, an inorganic light emitting element R, G, B (120-1, 120-2, 120-3) mounted on the TFT layer 70, a driver 500, and a connection line 90 for electrically connecting the sub pixel circuit 110 and the driver 500 formed on the TFT layer 70.

As described above, according to an embodiment, at least some of the various components, which may be included in the driver 500, may be disposed on the rear surface of the glass substrate 80, and may be connected to the sub-pixel circuits 110 formed in the TFT layer 70 through the connection wiring 90.

Referring to FIG. 5B, the sub-pixel circuits 110 included in the TFT layer 70 are electrically connected to the driver 500 (specifically, at least some of the various components described above) through the connection wiring 90 formed at the edge (or side) of the TFT panel (hereinafter, the TFT layer 70 and the glass substrate 80 in combination will be referred to as a TFT panel).

The reason why the sub-pixel circuits 110 and the driving unit 500 are connected through the connection wiring 90 formed in the edge area of the display panel 100 is that a problem such as cracks may occur in the glass substrate 80 due to the temperature difference between the process of manufacturing the TFT panels 70 and 80 and the process of filling the holes with the conductive material, when the sub-pixel circuits 110 and the driver 500 are connected by forming a hole penetrating the glass substrate 80.

Figure 5C:
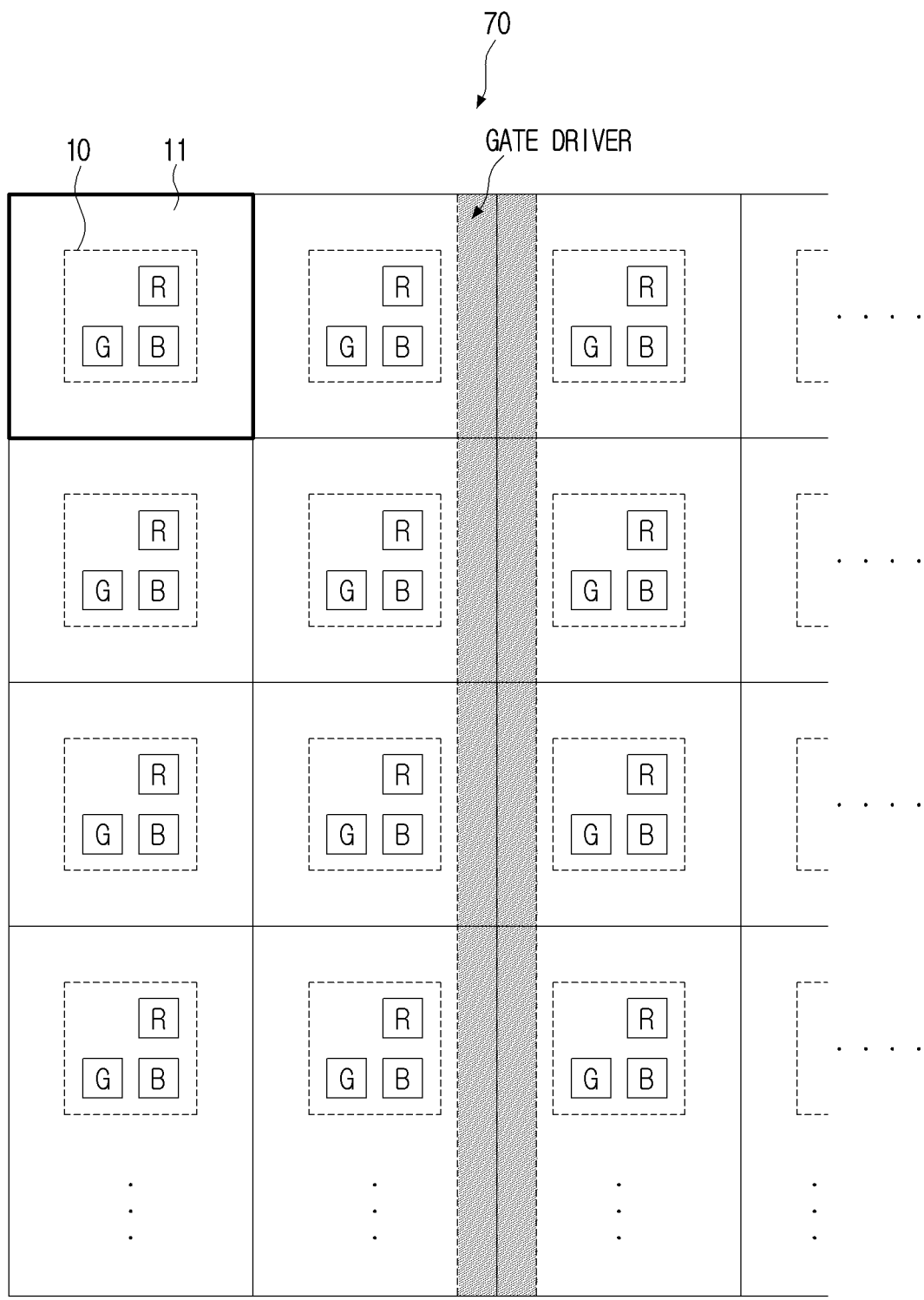
FIG. 5C is a plan view of a TFT layer according to an embodiment.

As described above, according to another embodiment, at least some of the various components that may be included in the driver 500 may be formed on the TFT layer along with the sub-pixel circuits to be connected to the sub-pixel circuits. FIG. 5C illustrates such an embodiment.

FIG. 5C is a plan view of the TFT layer 70 according to an embodiment. Referring to FIG. 5C, a remaining region 11 other than a region occupied by one pixel 10 (there are sub-pixel circuits 110 corresponding to each of the R, G, and B sub-pixels included in the pixel 10 in this region) is present in the TFT layer 70, and some of the various components described above may be formed in the remaining region 11.

FIG. 5C illustrates an example in which the gate driver of FIG. 5C is implemented in the remaining region 11 of the TFT layer 70. As described above, the structure in which the gate driver is formed in the TFT layer 70 may be referred to as a gate in panel (GIP) structure, but the name is not limited thereto. Also, the position of the gate driver formed on the TFT layer 70 is not limited to that shown in FIG. 5C.

FIG. 5C is only an example, and the components that may be included in the remaining region 11 of the TFT layer 70 are not limited to the gate driver. According to an embodiment, the TFT layer 70 may further include a demultiplex circuit for selecting R, G, and B sub-pixels, and an electrostatic discharge (ESD) protection circuit for protecting the sub-pixel circuit 110 from static electricity, or the like.

It has been described that the substrate on which the TFT layer 70 is formed is the glass substrate 80, but embodiments are not limited thereto. For example, the TFT layer 70 may be formed on a synthetic resin substrate. In this example, the sub-pixel circuits 100 and the driver 500 of the TFT layer 70 may be connected through a hole passing through the synthetic resin substrate.

As an example, it is described that the sub-pixel circuit 110 is implemented in the TFT layer 70. However, embodiments are not limited thereto. That is, according to another embodiment, the sub-pixel circuit 110 may be implemented as a pixel circuit chip in the form of an ultra-small micro-IC without using the TFT layer 70. In this case, the sub-pixel circuit 110 may be implemented in units of sub-pixels or pixels. The pixel circuit chip may be mounted on the substrate. In this example, the position where the sub-pixel circuit chip is mounted may be, for example, the periphery of the corresponding inorganic light-emitting element 120, but embodiments are not limited thereto.

It has been described that the gate driver is formed in the TFT layer 70, but embodiments are not limited thereto. According to another embodiment, the gate driver may be implemented as a gate driver chip in a ultra-small micro-IC form and may be mounted on the TFT layer 70.

In various embodiments, the TFT constituting the TFT layer (or TFT panel) is not limited to a specific structure or type. The TFT recited in various examples of the disclosure may be implemented as a low temperature poly silicon (LTPS) TFT, an oxide TFT, a poly silicon or a-silicon TFT, an organic TFT, a graphene TFT, or the like, and may be applied only with a P-type (or N-type) MOSFET in a Si-wafer CMOS process.

Figure 6A:
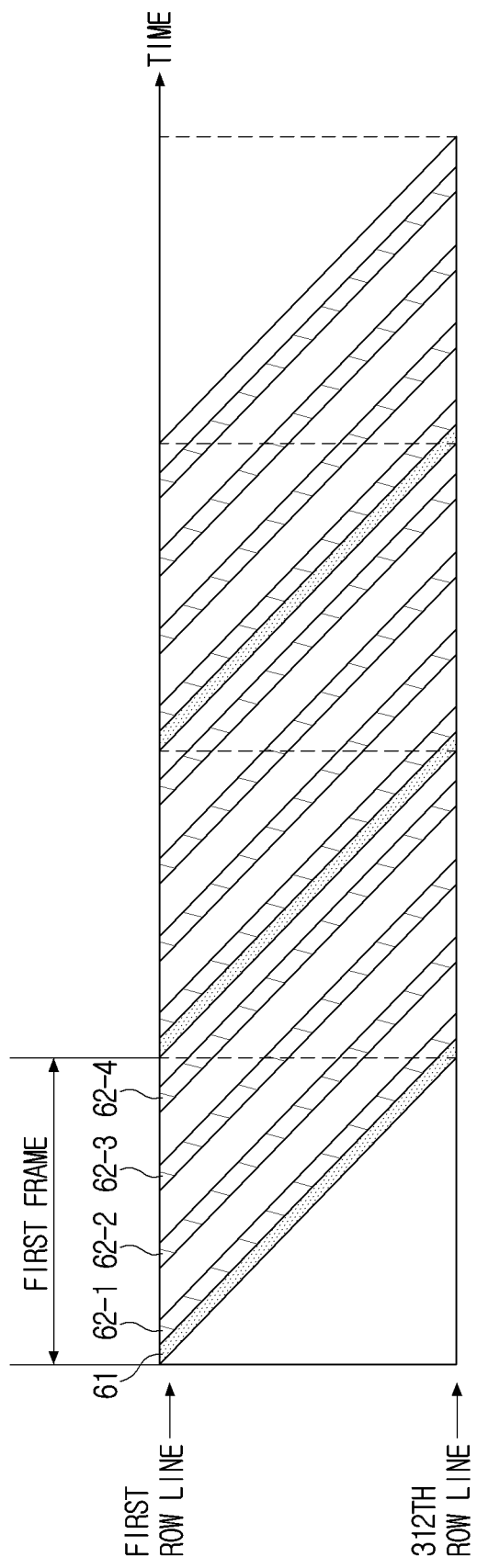
FIG. 6A is a diagram illustrating a progressive driving method of a display panel according to an embodiment.
Figure 6B:
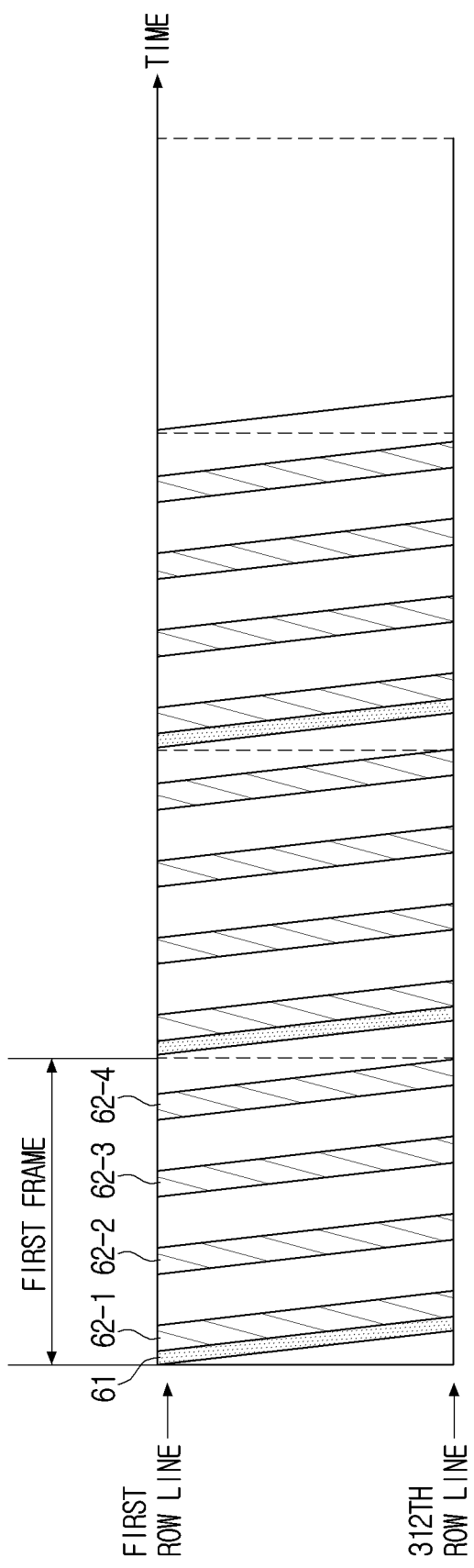
FIG. 6B is a diagram illustrating a progressive driving method of a display panel according to an embodiment.

FIGS. 6A and 6B are diagrams illustrating a progressive driving method of the display panel 100 according to various embodiment. FIG. 6A corresponds to FIG. 3B, and FIG. 6B corresponds to FIG. 3C.

FIG. 6A conceptually illustrates a driving method of the display panel 100 for three consecutive image frames. Referring to FIG. 6A, a vertical axis represents a row line of the display panel 100 and a horizontal axis represents time.

Referring to FIG. 6A, the display panel 100 includes 312 row lines, and four emission sections 62-1 to 62-4 are performed based on the image data voltage set in the data setting section 61. However, the number of row lines or the number of emission sections is not limited thereto.

More specifically, referring to FIG. 6A, for one image frame, one data setting section 61 and a plurality of emission sections 62-1 to 62-4 may be performed for each row line.

During the data setting section 61, the image data voltage for the image frame may be set to the sub-pixel circuits included in the row line. In each of the emission sections 62-1 to 62-4, a driving current may be provided to the corresponding inorganic light-emitting element based on the image data voltage set during the data setting section 61.

During the data setting section 61, the driver 500 may apply a control signal for setting an image data voltage (hereinafter, referred to as a scan signal, for example, VST(n), SP(n), SCCG(n), SPWM(n), Vcomp(n), Vini(n) and Vini2(n), which will be described below, may be included) to the sub-pixel circuits of each row line.

During each of the emission sections 62-1 to 62-4, the driver 500 may apply a control signal for controlling the driving current providing operation (hereinafter, referred to as an emission signal. For example, Emi(n) described below is included) to the sub-pixel circuits of each row line.

Referring to FIG. 6A, the data setting section 61 and each of the emission sections 62-1 to 62-4 may be sequentially performed in the order of row lines for the entire row line of the display panel 100.

For this purpose, the driver 500 may apply a scan signal to the sub-pixel circuits from the first row line to the last row line of the display panel 100 in the order of the row lines. The driver 500 may apply an emission signal to the sub-pixel circuits from the first row line to the last row line of the display panel 100 in the order of the row lines.

According to an embodiment, as shown in FIG. 6A, the first emission section 62-1 of each row line may be temporally continuous with the data setting section 61, and the plurality of emission sections 62-1 to 62-4 may have a predetermined time interval from each other.

The number of emission sections performed in each row line for one image frame and the predetermined time interval between emission sections may be set based on the size of the display panel 100, a frame rate and/or the shutter speed of a camera. However, embodiments are not limited thereto.

In general, because the shutter speed of the camera is faster than one image frame time by several times, the image displayed on the display panel 100 captured by the camera may be distorted when the display panel 100 is driven such that one emission section from the first row line to the last row line is performed in the order of row lines during one image frame time.

Accordingly, according to an embodiment, the display panel 100 may be driven such that the plurality of emission sections are performed at a predetermined time interval during one image frame time, and the predetermined time interval may be set on the basis of the speed of the camera, so that even if the display panel 100 is captured at any moment, the image displayed on the display panel 100 captured by the camera may not be distorted.

A blanking interval may exist between one image frame time and the next image frame time. The blanking interval may be a time period between consecutive image frame times.

According to an embodiment, the blanking interval may include a non-emission section in which all inorganic light-emitting elements of the display panel 100 do not emit light. Because no current flows into the display panel 100 in the non-emission section, an operation such as a failure detection of the display panel 100 may be performed.

For example, the failure of the display panel 100 may be determined based on whether a current flows to the display panel 100 during a non-emission section. Because no sub-pixels of the display panel 100 emit light in the non-emission section, no current flows into the display panel 100. However, when a short occurs in a sub-pixel circuit, a current may flow to the display panel 100 during the non-emission section. Accordingly, when a current flows in the display panel 100 during the non-emission section, the processor or the timing controller may determine that the display panel 100 fails.

According to an embodiment, an operation for discharging the charge remaining in the inorganic light emitting element may be performed during the blanking interval. The detailed description of will be described later.

FIG. 6B is different from FIG. 6A in that data setting sections 61 for 312 total row lines are performed for a much shorter time than one frame time, but the description of FIG. 6A may be applied to FIG. 6B as it is, so a duplicate description will be omitted. The difference between the two embodiments is described below.

Figure 7:
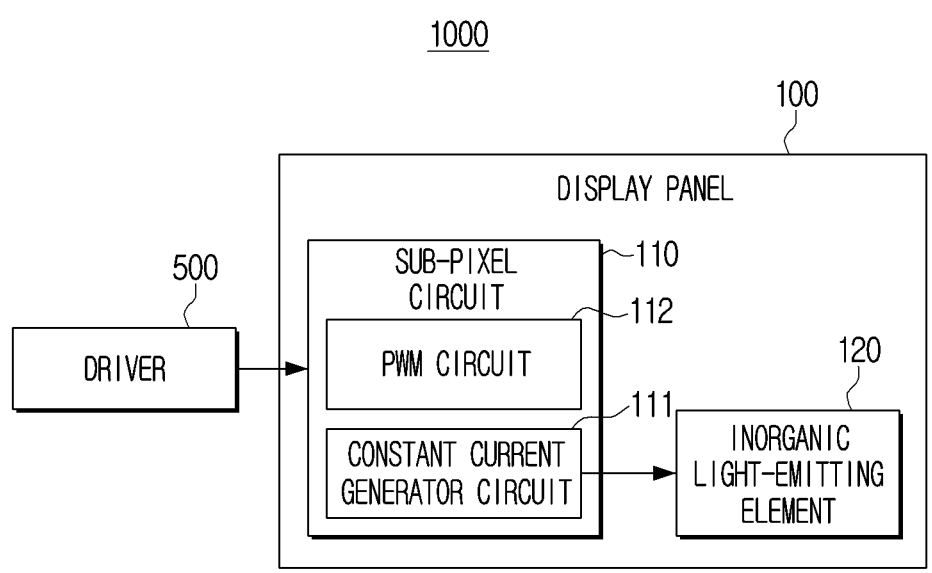
FIG. 7 is a detailed block diagram of a display module according to an embodiment.

FIG. 7 is a detailed block diagram illustrating a display module 1000 according to an embodiment. In describing FIG. 7, description overlapped with the foregoing will be omitted.

Referring to FIG. 7, the display module 1000 includes the display panel 100 including the sub-pixel circuit 110 and the inorganic light emitting element 120, and the driver 500.

The display panel 100 may have a structure in which a sub-pixel circuit 110 is formed on the glass substrate, and the inorganic light emitting element 120 is mounted on the sub-pixel circuit 110, but embodiments are not limited thereto. Referring to FIG. 7, only one sub-pixel-related structure included in the display panel 100 is illustrated for convenience, but the sub-pixel circuit 110 and the inorganic light emitting element 120 are provided for each sub-pixel.

The inorganic light emitting element 120 may be mounted on the sub-pixel circuit 110 so as to be electrically connected to the sub-pixel circuit 110, and may emit light based on the driving current provided from the sub-pixel circuit 110.

The inorganic light emitting element 120 may constitute a sub-pixel of the display panel 100, and there may be a plurality of types depending on the color of the emitted light. For example, the inorganic light emitting element 120 may be one of an R inorganic light emitting element emitting red color light, a G inorganic light emitting element emitting a green color light, or a B inorganic light emitting element emitting blue light.

The type of sub-pixel described above may be determined according to the type of the inorganic light emitting element 120. The R inorganic light emitting element may constitute the R sub-pixel 20-1, G inorganic light emitting element may constitute the G sub-pixel 20-2, and the B inorganic light emitting element may constitute the B sub-pixel 20-3.

The inorganic light emitting element 120 may refer to a light emitting element that is manufactured using an inorganic material, which is different from organic light emitting diode (OLED) manufactured using an organic material.

According to an embodiment, the inorganic light emitting element 120 may be a micro light emitting diode (micro LED or μLED) having a size that is less than or equal to 100 micrometers (μm).

The display panel in which each sub-pixel is implemented with the micro LED may be referred to as a micro LED display panel. The micro LED display panel may be a flat display panel and may include a plurality of inorganic light emitting diodes, each of which is less than or equal to 100 micrometers. The micro LED display panel may provide better contrast, response time, and energy efficiency compared to a liquid crystal display (LCD) panel which requires backlight. The organic light emitting diode (OLED) and the micro LED have good energy efficiency, but the micro LED may provide better performance than the OLED in terms of brightness, light emission efficiency, and operating life.

The inorganic light emitting element 120 may represent various gray scales depending on the magnitude or the pulse width of the driving current provided from the sub-pixel circuit 110. The pulse width of the driving current may be referred to as a duty ratio of the driving current or the duration of the driving current.

For example, the inorganic light emitting element 120 may express a brighter gray scale as the magnitude of the driving current is increased. The inorganic light emitting element 120 may express a brighter gray scale as the pulse width of the driving current increases (i.e., the duty ratio of the driving current increases or the duration of the driving current increases).

The sub-pixel circuit 110 may provide a driving current to the inorganic light emitting element 120.

The sub-pixel circuit 110 may provide, to the inorganic light emitting element 120, a driving current having a controlled magnitude and a controlled driving time based on an image data voltage (e.g., a constant current generator data voltage, a PWM data voltage), a driving voltage (e.g., a first driving voltage, a second driving voltage, a ground voltage), various control signals (e.g., a scan signal, an emission signal, a test signal), various input signals (e.g., a sweep signal, a reference voltage), etc.

The sub-pixel circuit 110 may drive the inorganic light emitting element 120 by pulse amplitude modulation (PAM) method and/or pulse width modulation (PWM) method.

The sub-pixel circuit 110 may include a constant current generator circuit 111 for providing a constant current of a magnitude based on a constant current generator data voltage to the inorganic light-emitting element 120, and a PWM circuit 112 for controlling the time during which the constant current is provided to the inorganic light-emitting device 120 based on the PWM data voltage. Here, the constant current provided to the inorganic light emitting element 120 becomes the aforementioned driving current.

According to an embodiment, the same constant current generator data voltage may be applied to each of the constant current generator circuits 111. Therefore, because the driving current (i.e., constant current) of the same magnitude is provided to all the inorganic light emitting elements 120 of the display panel 100, the wavelength variation problem of the LED according to the change in the magnitude of the driving current may be solved.

According to an embodiment, the constant current generator circuits 111 of the display panel 100 may be applied with the same constant current generator data voltage for each kind of sub-pixel. Because characteristics may be different according to the type of the inorganic light-emitting device 120, a constant current generator data voltage having a different magnitude may be applied to different types of sub-pixel circuits. Even in this example, the same constant current generator data voltage may be applied to the same kind of sub-pixel circuits.

The PWM data voltage corresponding to a gray level value of each sub-pixel may be applied to each PWM circuit 112 of the display panel 100. Accordingly, the driving time of the driving current (i.e., constant current) provided to the inorganic light emitting element 120 of each sub-pixel may be controlled by the PWM circuit 112. Accordingly, the gray level of the image may be represented.

According to an embodiment, the display module 1000 may be applied to a wearable device, a portable device, a handheld device, and various electronic products or electronic parts requiring a display, in a single unit.

Also, according to another embodiment, one display panel may be configured by combining or assembling a plurality of display modules. As described above, one display panel in which a plurality of display modules are combined may be referred to as a "modular display panel". However, the name is not limited thereto. In this example, each display module 1000 becomes a component constituting the modular display panel. The modular display panel may be applied to small display products such as monitors and TVs, or large display products such as digital signage and electronic displays.

In the modular display panel, the same constant current generator data voltage is applied to the sub-pixel circuits included in one display module 1000, but a constant current generator data voltage of different magnitude may be applied to the sub-pixel circuits included in another display module 1000. Accordingly, when a plurality of display modules are combined to form one display panel, brightness deviation or color deviation between display modules that may be generated may be compensated by adjusting the constant current generator data voltage.

Figure 8:
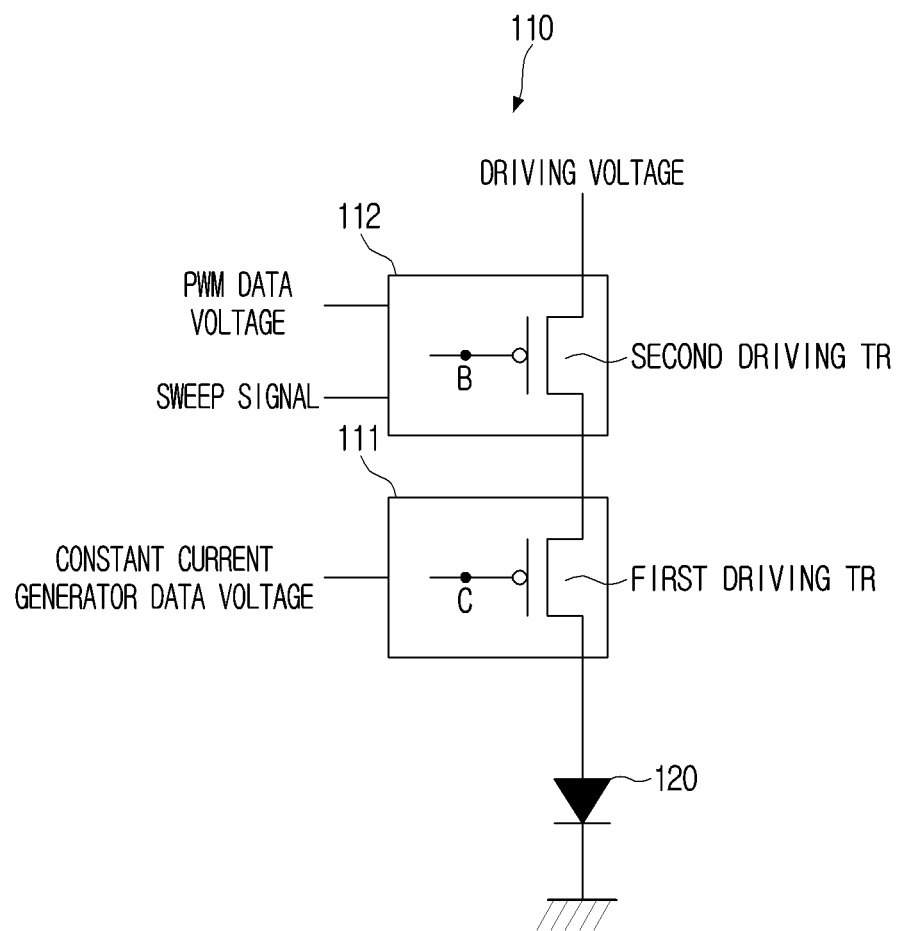
FIG. 8 is a schematic block diagram of a sub-pixel circuit according to an embodiment.

FIG. 8 is a schematic block diagram of a sub-pixel circuit 110 according to an embodiment. Referring to FIG. 8, the sub-pixel circuit 110 includes the constant current generator circuit 111 and the PWM circuit 112.

The constant current generator circuit 111 may include a first driving transistor and may provide a constant current to the inorganic light emitting element 120 based on a constant current generator data voltage applied from the driver 500.

In detail, when the driving voltage is applied through the second driving transistor of the PWM circuit 112 in the emission section, the constant current generator circuit 111 may apply a driving voltage to the inorganic light emitting element 120 through the first driving transistor. Accordingly, a constant current may flow through the inorganic light emitting element 120.

The magnitude of the constant current may vary depending on the magnitude of the constant current generator data voltage applied to the constant current generator circuit 111. The constant current generator circuit 111 may have capability of performing PAM driving of the inorganic light emitting element 120. Thus, the constant current generator data voltage may be referred to as the PAM data voltage, and the constant current generator circuit 111 may be referred to as a PAM circuit.

As described above, according to an embodiment, the constant current generator data voltage of a same magnitude may be applied to all the constant current generator circuits 111 of the display panel 100, and in this example, the constant current generator circuit 111 may provide a constant current of a constant magnitude (or a same magnitude) to all the inorganic light emitting elements 120 of the display panel 100.

The names of "constant current generator circuit" and "constant current generator data voltage" may indicate that when the same PAM data voltage is applied to all PAM circuits of the display panel 100, the PAM circuit operates as a constant current generator, but the capability is not limited by the name.

A deviation may exist between the threshold voltages Vth of the first driving transistors included in the sub-pixel circuits of the display panel 100. Theoretically, the threshold voltages Vth of the first driving transistors should be identical to each other, but in practice, a deviation may occur due to various factors such as process deviation or change over time. This deviation causes degradation of image quality and thus needs to be compensated.

More specifically, if the threshold voltage of the first driving transistor is not compensated, a driving current of a different magnitude is provided to the inorganic light emitting element 120 by a deviation of the threshold voltage even when the same constant current generator data voltage is applied to the constant current generator circuit 111 of each sub-pixel, and this appears as stain of an image or the like.

In order to compensate the threshold voltage deviation among the first driving transistors, according to an embodiment, the constant current generator circuit 111 may, when the constant current generator data voltage is applied during the data setting section, apply a voltage in which the constant current generator data voltage and the threshold voltage of the first driving transistor are combined, to the gate terminal (C node) of the first driving transistor.

In the emission section, the constant current generator 111 may provide, to the inorganic light emitting element 120, the constant current of the magnitude based on a value corresponding to a square of a voltage which is obtained by subtracting the threshold voltage of the first driving transistor from the voltage between the gate terminal and the source terminal of the first driving transistor, that is, the constant current of the magnitude based on $(|Vgs|-|Vth|)^2$.

The voltage (VCCG+Vth) in which the constant current generator data voltage (e.g., VCCG) and the threshold voltage (e.g., Vth) are combined is applied to the gate terminal of the first driving transistor during the data setting section, so it can be seen that when the threshold voltage of the first driving transistor is subtracted from the voltage between the gate terminal and the source terminal of the first driving transistor, the threshold voltage of the first driving transistor is erased.

More specifically, the first driving transistor may be a PMOS TFT, so $(|Vgs|-|Vth|)^2=(Vsg+Vth)^2$. At this time, Vsg=Vs−(VCCG+Vth), so Vsg+Vth=Vs−(VCCG+Vth)+Vth, and Vth is deleted.

Accordingly, the magnitude of the constant current provided by the constant current generator circuit 111 is independent of the threshold voltage of the first driving transistor, and thus the threshold voltage deviation between the first driving transistors may be compensated.

The PWM circuit 112 includes a second driving transistor, and may control the time during which the constant current is provided to the inorganic light emitting element 120 based on the PWM data voltage and the sweep signal applied from the driver 500.

In detail, the PWM circuit 112 may control the time in which the constant current flows to the inorganic light emitting element 120 by applying a driving voltage to the constant current generator circuit 111 (specifically, the source terminal of the first driving transistor) only during the time period in which the second driving transistor is turned on in the emission section.

As described above, the constant current generator circuit 111 may provide constant current to the inorganic light emitting element 120 by applying the driving voltage applied through the second driving transistor of the PWM circuit 112 to the inorganic light emitting element 120.

At this time, the driving voltage is provided to the constant current generator circuit 111 from the PWM circuit 112 only while the second driving transistor is turned on in the emission section. Also, a time period in which the second driving transistor is turned on in the emission section is determined on the basis of the PWM data voltage and the sweep voltage as described below.

The PWM circuit 112 may control the time during which the constant current is provided to the inorganic light emitting element 120 based on the PWM data voltage and the sweep signal.

The problem due to the deviation of the threshold voltage of the first driving transistors described above may occur similarly for the second driving transistors. That is, if the threshold voltage of the second driving transistor is not compensated, a constant current is provided to the inorganic light emitting element 120 for a different time by the difference between the threshold voltages, even if the same PWM data voltage is applied to the PWM circuit 112 of each sub-pixel, which results in a stain of an image, or the like.

In order to compensate the deviation of the threshold voltage of the second driving transistors, according to an embodiment, while the second driving transistor operates as a source follower in the data setting section, the PWM circuit 112 may obtain the threshold voltage of the second driving transistor.

The threshold voltage obtained as such may be applied to the gate terminal of the second driving transistor, and the threshold voltage of the second driving transistor may be compensated therethrough.

More specifically, during the emission section, the voltage of the gate terminal of the second driving transistor may change from the voltage (−VPWM+Vth) in which the PWM data voltage component (e.g., −VPWM) and the threshold voltage component (e.g., +Vth) of the second driving transistor are added according to the sweep voltage. (In practice, the reference voltage component+Vref is also present as described below, but is omitted for convenience of description.)

Here, the sweep voltage is a voltage signal that sweeps between two different voltages one time. In addition, the sweep voltage may be selected based on an emission signal Emi(n), which will be described later, among a sweep signal in which a voltage repeatedly and linearly changes from a first voltage to a second voltage. The sweep signal is a global signal applied to all the sub-pixel circuits 110 of the display panel 100, and the change rate of the sweep voltage according to time is constant.

The second driving transistor is turned on when the voltage of the gate terminal is lower than the voltage corresponding to the sum of the voltage of the source terminal and the threshold voltage. As described below, because the driving voltage (e.g., VDD_PAM) is applied to the source terminal of the second driving transistor in the emission section, the second driving transistor is turned on when the voltage of the gate terminal becomes lower than the sum (VDD_PAM+Vth) of the driving voltage VDD_PAM and the threshold voltage Vth.

Accordingly, in the emission section, the voltage of the gate terminal of the second driving transistor changes from −VPWM+Vth according to the sweep voltage, and the second driving transistor is turned on when the voltage of the gate terminal becomes VDD_PAM+Vth, so that the threshold voltage value (i.e., Vth value) of the second driving transistor does not affect the time at which the second driving transistor is turned on. The time at which the second driving transistor is turned on in the emission section is determined regardless of the threshold voltage value (Vth value) of the second driving transistor.

As such, the threshold voltage deviation among the second driving transistors may be compensated.

Figure 9A:
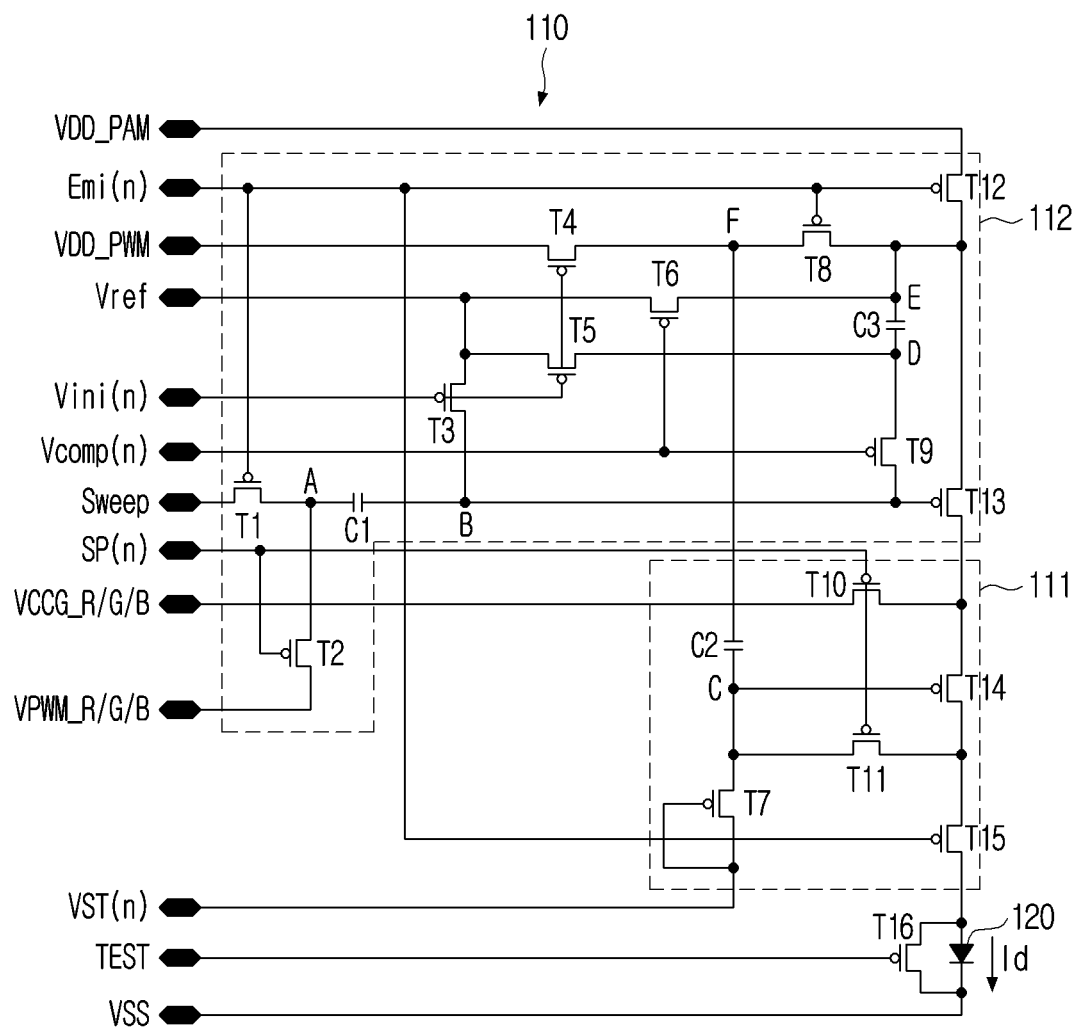
FIG. 9A is a detailed circuit diagram of a sub-pixel circuit according to an embodiment.

FIG. 9A is a detailed circuit diagram of a sub-pixel circuit according to an embodiment.

Referring to FIG. 9A, the sub-pixel circuit 110 includes the constant current generator circuit 111, the PWM circuit 112, and a transistor T16. As described above, the constant current generator circuit 111 includes a first driving transistor T14, and the PWM circuit 112 includes a second driving transistor T13, respectively.

The transistor T16 is connected between the anode terminal and the cathode terminal of the inorganic light emitting element 120. The transistor may be used for different purposes, before and after the inorganic light-emitting element 120 is mounted on the TFT layer, and is electrically connected to the sub-pixel circuit 110.

For example, before the inorganic light-emitting device 120 and the sub-pixel circuit 110 are electrically connected to each other, the transistor T16 may be turned on according to the TEST signal to check whether the sub-pixel circuit 110 is abnormal. After the inorganic light-emitting device 120 and the sub-pixel circuit 110 are connected to each other, the transistor T16 may be turned on according to the TEST signal to discharge the charge remaining in the junction capacitance of the inorganic light-emitting device 120.

The TEST signal is a control signal provided from the TCON through the level shifter to control on/off of the transistor T16, and is a global signal applied equally to all the sub-pixel circuits 110 of the display panel 110.

VDD_PAM refers to a first driving voltage (e.g., +12[V]), VDD_PWM refers to a second driving voltage (e.g., +12[V]), and VSS refers to a ground voltage (e.g., 0[V]). The Vref represents a reference voltage (e.g., +5[V]). Vref may be used to obtain a threshold voltage of the second driving transistor T13, as will be described later. The VDD_PAM, VDD_PWM, VSS, and Vref may be provided from the aforementioned power IC, but are not limited thereto.

The Vini(n) represents the scan signal applied to the sub-pixel circuit 110 to apply the reference voltage Vref to the B node and the D node in the data setting section and apply the second driving voltage VDD_PWM to the F node. The Vref voltage applied to the B node and the D node is used to obtain the threshold voltage of the second driving transistor T13, and the second driving voltage VDD_PWM applied to the F node may be a reference potential when the constant current generator data voltage is set.

The VST(n) denotes a scan signal applied to the sub-pixel circuit 110 in the data setting section, in order to initialize the voltage of the C node. When the voltage of the C node is initialized according to the VST(n) signal, the first driving transistor T14 is in a turned-on state.

The SP(n) refers to a scan signal applied to the sub-pixel circuit 110 in the data setting section, in order to apply a constant current generator data voltage (VCCG_R/G/B) to the C node and apply the PWM data voltage (VPWM_R/G/B) to the A node.

The Vcomp(n) represents the scan signal applied to the sub-pixel circuit 110 in the data setting section, in order to apply the threshold voltage of the second driving transistor to the B node.

The Emi(n) refers to an emission signal applied to the sub-pixel circuit 110 in the emission section, in order to apply the first driving voltage VDD_PAM to the E node and the F node, apply the sweep voltage to the A node, and turn on the transistor T15.

In the above gate signals (scan signal and emission signal), n represents the n$^{th}$ row line. As described above, the driver 500 may drive the display panel 110 for each row line (or scan line or gate line), and each of Vini(n), VST(n), SP(n), Vcomp(n), and Emi(n) may be equally applied to the sub-pixel circuits 110 included in the n$^{th}$ row line.

The Sweep represent a sweep signal. The sweep signal may be generated in the TCON and applied equally to all sub-pixel circuits 110 of the display panel 100 through a level shifter. The same sweep signal may be applied to all sub-pixel circuits 110 of the display panel 100. At this time, the sweep signal may be in a form in which a voltage that varies linearly from the first voltage to the second voltage is continuously repeated.

As described above, the scan signal or the emission signal may be separately applied for each row line from the gate driver to drive the pixels of the pixel array in a row line unit. In this way, signals applied separately for each row line may be referred to as a local signal. On the contrary, because the sweep signal is equally applied to all row lines of the display panel, the sweep signal may be referred to as a global signal separately from the local signal.

A portion of the sweep signal is applied to the A node while the transistor T1 is turned on according to the emission signal Emi(n). As described above, a portion of the sweep signal selectively applied to the A node may be a sweep voltage described above.

At this time, because the transistors T1 of the display panel 100 are turned on in the order of the row lines according to the emission signal, apart that the sweep signal is a global signal equally applied to all the row lines, the waveform of the sweep voltage applied to the A node of the sub-pixel circuits 110 may vary depending on the row lines. The detailed description will be given later.

The VPWM_R/G/B denotes the PWM data voltage applied to the sub-pixel circuit 110. The PWM data voltage may be applied from a data driver. According to an embodiment, the PWM data voltages for each of the R, G, and B sub-pixels constituting one pixel may be time division multiplexed and applied from the data driver. In this way, the time division multiplexed PWM data voltages may be respectively applied to the corresponding sub-pixels through a demultiplexer circuit.

The sub-pixel circuit 110 shown in FIG. 9A shows a sub-pixel circuit 110 corresponding to one of R, G, and B sub-pixels (e.g., R sub-pixels). Accordingly, in the sub-pixel circuit 110 of FIG. 9A, only the PWM data voltage (e.g., VPWM_R) for the R sub-pixel among the time division multiplexed PWM data voltages may be selected and applied through a demultiplexer circuit.

The VCCG_R/G/B may refer to the constant current generator data voltage applied to the sub-pixel circuit 110.

As described above, according to an embodiment, a constant current generator data voltage having the same magnitude may be applied to the display panel 100 for each type of sub-pixel. At this time, because the same constant current generator data voltage may be applied to the same type of sub-pixel regardless of the column line or the row line, the DC voltage may be used as the constant current generator data voltage. Thus, for example, three types of DC voltages (e.g., +3.1[V], +2.8[V], +3.0[V]) corresponding to each of the R, G, and B sub-pixels may be directly applied to each of the R, G, and B sub-pixel circuits of the display panel 100 from the power IC.

In this example, in order to apply a constant current generator data voltage to the sub-pixel circuit 110, a separate data driver or a demultiplexer circuit is not required.

According to another embodiment, the same constant current generator data voltage may be applied from the power IC to all the sub-pixel circuits 110 of the display panel 100, regardless of the type of the sub-pixel.

According to still another embodiment, the constant current generator data voltage may be applied from the data driver.

There is a resistance component in the display panel 100. Therefore, when a driving current flows in the emission section, an IR drop occurs, which causes a voltage drop in the driving voltage. As described below, because the driving voltage is a reference even when the constant current generator data voltage is set, the drop of the driving voltage interferes with the accurate setting of the constant current generator data voltage.

In various embodiments, as described above, because a data setting section and emission sections proceed in the order of row lines, while the sub-pixel circuits of some row lines of the display panel 100 operate in the emission section, the sub-pixel circuits of other row lines operate in the data setting section.

Accordingly, when the same driving voltage applied through one wire is applied to the constant current generator circuits 111 of the display panel 100 regardless of which section the row lines is driven in, the drop of the driving voltage due to the sub-pixel circuits operating in the emission section affects the constant current generator data voltage setting operation of the sub-pixel circuits operating in the data setting section.

In order to address the problem above, according to various embodiments, a separate driving voltage applied through separate wiring is applied to the constant current generator circuits in the data setting section and emission section, respectively.

In the example of FIG. 9A, the second driving voltage VDD_PWM is applied to the constant current generator circuit 111 according to the Vini(n) signal in the data setting section, and the first driving voltage VDD_PAM is applied to the constant current generator circuit 111 according to the Emi(n) signal in the emission section.

Accordingly, even if a voltage drop occurs in the first driving voltage VDD_PAM due to the sub-pixel circuits operating in the emission section, a separate second driving voltage VDD_PWM, regardless of the driving current, is applied to the sub-pixel circuits operating in the data setting section, thereby setting a stable constant current generator data voltage is available.

Figure 9B:
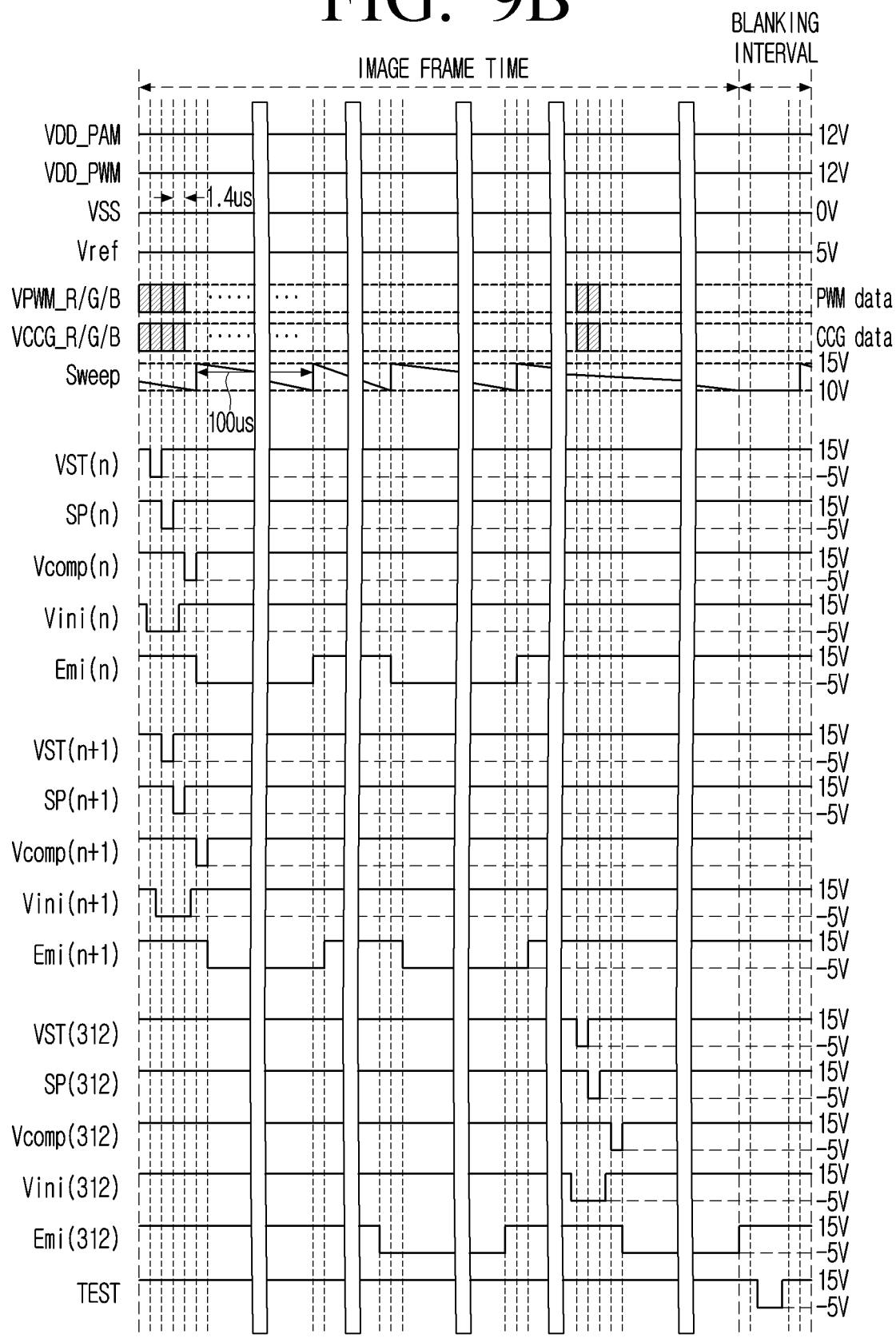
FIG. 9B is a timing diagram of various signals for driving a display panel including the sub-pixel circuit of FIG. 9A during an image frame time and a blanking interval according to an embodiment.

FIG. 9B is a timing diagram of various signals for driving the display panel 100 including the sub-pixel circuit 110 of FIG. 9A during an image frame time and a blanking interval. In FIG. 9B, for example, the display panel 100 includes 312 row lines.

As described above, according to an embodiment, one image frame, each row line may include one data setting section and a plurality of emission sections. For this purpose, referring to FIG. 9B, during the image frame time, the scan signals VST, SP, Vcomp, and Vini for the data setting operation are applied once for each row line, and the emission signal Emi for the light emitting operation may be applied multiple times with respect to each row line.

In other words, the time interval in which the low level VST, SP, Vcomp, Vini signals are applied becomes a data setting section of the corresponding row line, and the time interval in which the low level Emi signal is applied becomes an emission section of the corresponding row line.

As described above, according to an embodiment, the data setting section and the emission sections may proceed in the order of row lines. For this purpose, referring to FIG. 9B, each of the gate signals VST, SP, Vcomp, Vini, Emi may be sequentially applied in the order of row lines. That is, for example, a low level VST(n) signal and a low level VST (n+1) signal are applied with a difference of 1H time (1.4 μs in the example of FIG. 9B). This is the same for the remaining gate signals SP signal (SP(n) and SP(n+1)), the Vcomp signal (Vcomp(n) and Vcomp(n+1)), Vini signal (Vini(n) and Vini(n+1)), and Emi signal (Emi(n) and Emi (n+1)).

Referring to FIG. 9B, the test signal (TEST) of a low level is applied in the blanking interval. Because the TEST signal is a global signal, the signal is equally applied to all sub-pixel circuits 110 of the display panel 100, and accordingly, charges remaining on all the inorganic light-emitting elements 120 of the display panel 100 may be discharged.

Referring to FIGS. 10A to 10D, a specific operation of the sub-pixel circuit 110 will be described.

Figure 10A:
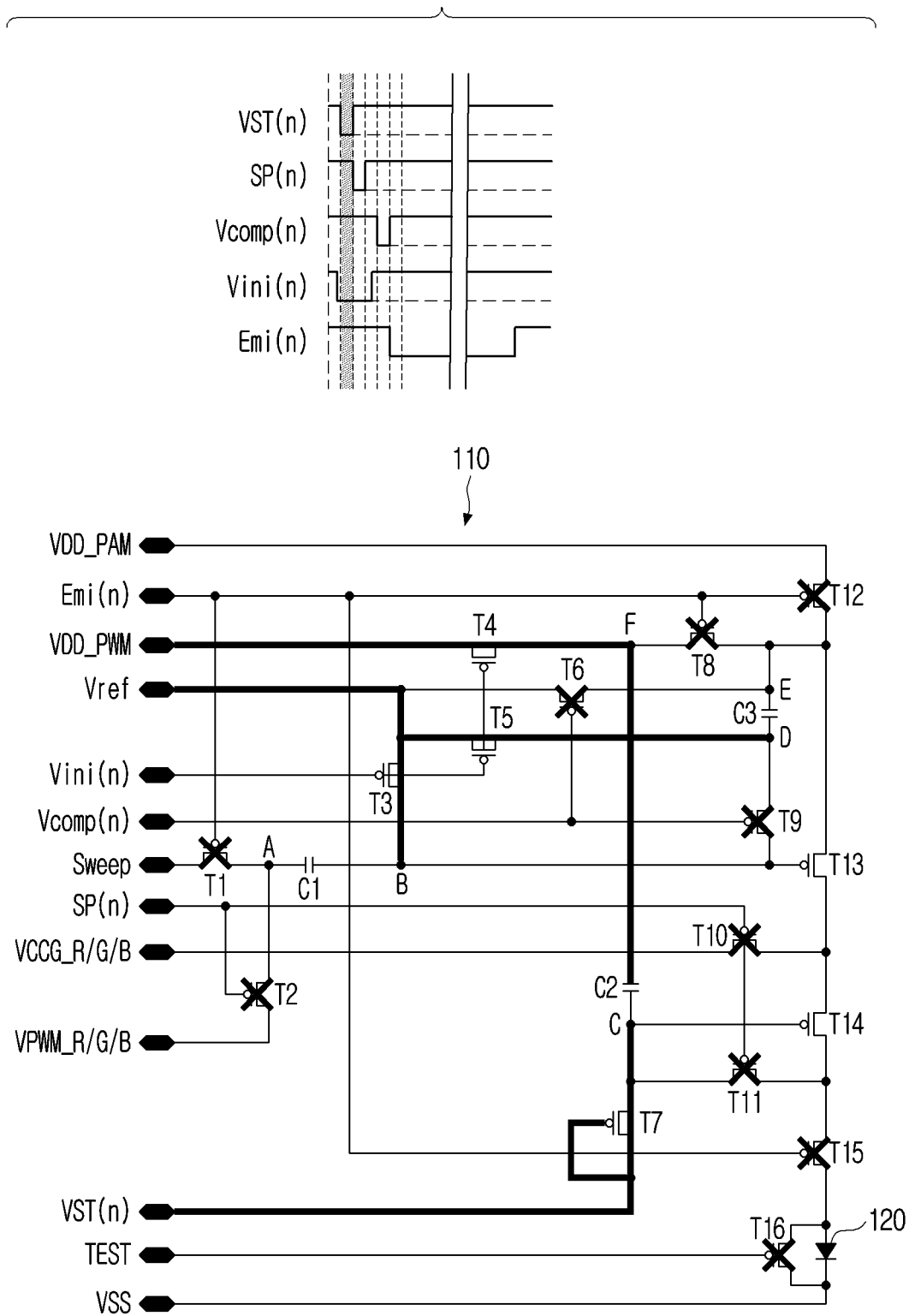
FIG. 10A illustrates the operation of the sub-pixel circuit according to Vini(n) and VST(n) among the scan signals according to an embodiment.

FIG. 10A illustrates the operation of the sub-pixel circuit 110 according to Vini(n) and VST(n) among the scan signals.

When the data setting section starts, the driver 500 may apply a reference voltage Vref (e.g., +5[V]) to one end (D node) of the capacitor C3 and the gate terminal (B node) of the second driving transistor T13, and may apply the second driving voltage VDD_PWM (e.g., +12[V]) to one end (F node) of the capacitor C2.

For this, the driver 500 may apply Vini(n) signals as shown in FIG. 10A. Referring to FIG. 10A, Vref may be applied to the B node and the D node through the turned-on transistor T3 and the transistor T5 according to the Vini(n) signal. At this time, because the first driving voltage VDD_PAM (e.g., +12[V]) is floated in accordance with the progress of the emission section for the previous image frame in the E node (that is, the source terminal of the second driving transistor T13), the second driving transistor T13 is turned on when Vref (+5[V]) is applied to the B node if the threshold voltage of the second driving transistor T13 is assumed to be −2.2[V].

Referring to FIG. 10A, the second driving voltage VDD_PWM may be applied to the F node through the turned-on transistor T4 according to the Vini(n) signal. At this time, the second driving voltage VDD_PWM applied to the F node is a reference potential when a constant current generator data voltage is set to the C node.

When the second driving voltage VDD_PWM is applied to the F node through the Vini(n) signal, the driver 500 may initialize the voltage of the gate terminal C node of the first driving transistor T14.

To this end, the driver 500 may apply a low voltage (e.g., −5[V]) to the sub-pixel circuit 110 through the VST(n) signal as shown in FIG. 10A. When the voltage of the C node is initialized to a low voltage (e.g., −5[V]), the first driving transistor T14 may be in a turned-on state (e.g., a state in which a channel is formed).

Figure 10B:
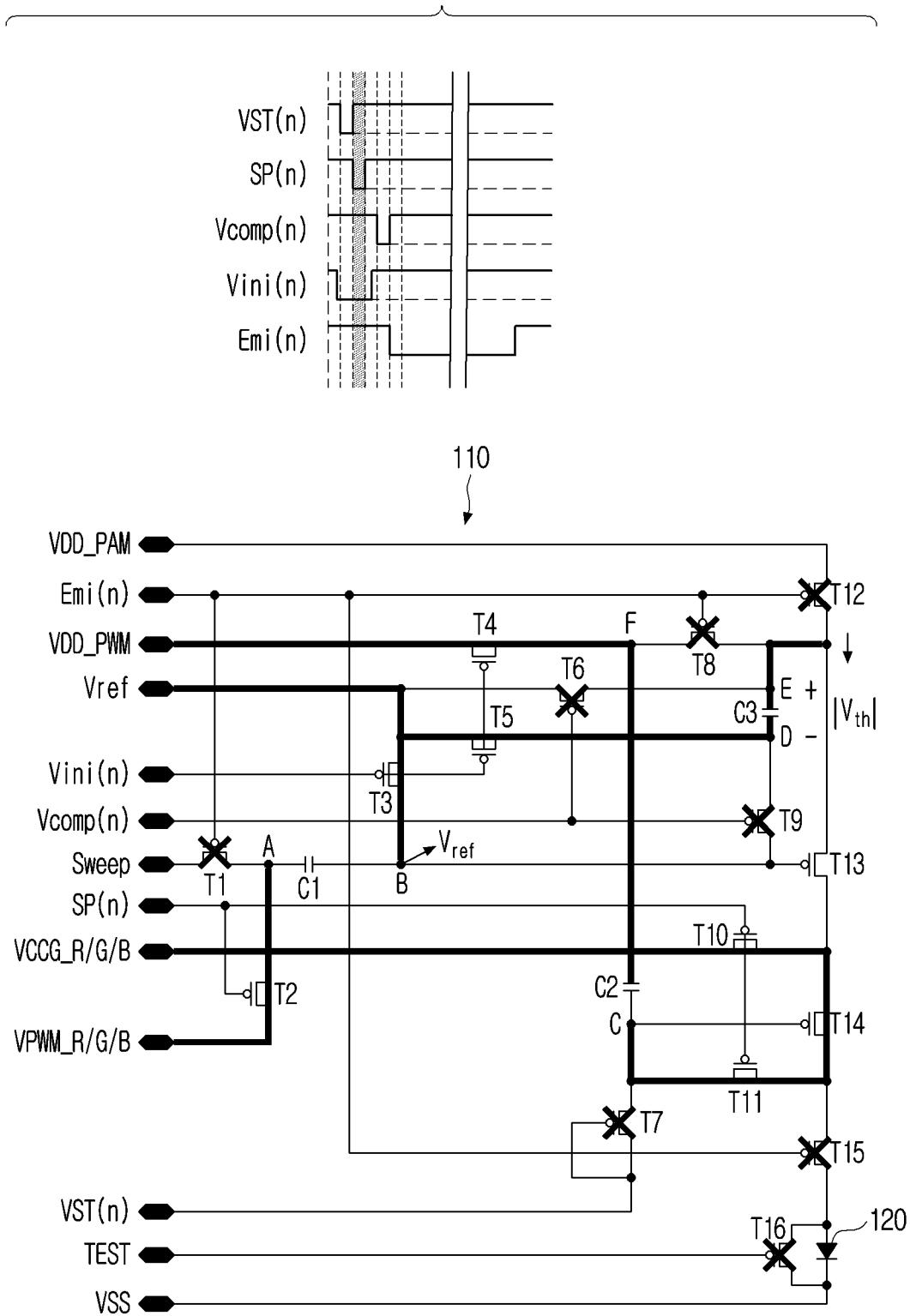
FIG. 10B is a diagram illustrating the operation of the sub-pixel circuit according to SP(n) among the scan signals according to an embodiment.

FIG. 10B is a diagram illustrating the operation of the sub-pixel circuit according to SP(n) among the scan signals.

The SP(n) signal is a scan signal for applying an image data voltage to the sub-pixel circuit 110. In the data setting section, when a low voltage (e.g., −5[V]) is applied to the sub-pixel circuit 110 through the SP(n) signal line, the transistor T2, the transistor T10, and the transistor T11 are turned on.

When the transistor T2 is turned on, the PWM data voltage (VPWM_R/G/B) may be applied to one end (A node) of the capacitor C1 through the turned-on transistor T2.

When the transistor T10 and the transistor T11 are turned on, a constant current generator data voltage (VCCG_R/G/B) may be applied to the C node through the turned-on transistor T10, the first driving transistor T14 turned on based on the VST(n) signal, and the turned-on transistor T11.

At this time, in the C node, the constant current generator data voltage (VCCG_R/G/B) is not applied (or set) as it is. Rather, a constant current generator voltage in which the threshold voltage Vth of the first driving transistor T14 is compensated (that is, a voltage (VCCG_R/G/B+Vth) obtained by adding the threshold voltage of the first driving transistor T14 to the constant current generator data voltage) is applied.

When the transistor T10 and the transistor T11 are turned on according to the SP(n) signal while the first driving transistor T14 is turned on according to the VST(n) signal, the constant current generator data voltage is input to the C node through the transistor T10, the first driving transistor T14, and the transistor T11. That is, the voltage of the C node begins to rise from the low voltage (e.g., −5[V]).

However, the voltage of the C node may not rise up to a constant current generator data voltage (e.g., +3[V]), and may rise up to the voltage (that is, +0.8[V]) which is obtained by the sum of the constant current generator data voltage (+3[V]) and the threshold voltage (e.g., −2.2[V]) of the first driving transistor T14.

This is because, when the voltage difference between the gate terminal and the source terminal of the first driving transistor T14 decreases as the voltage of the C node increases and becomes the threshold voltage of the first driving transistor T14, the first driving transistor T14 is turned off and the current flow is stopped.

That is, because the constant current generator data voltage is applied to the source terminal of the first driving transistor T14 through the turned-on transistor T10, the voltage of the C node increases only up to the voltage (VCCG_R/G/B+Vth).

When the constant current generator data voltage is applied to the source terminal of the first driving transistor T14 while the transistor T10 is turned on according to the SP(n) signal, the second driving transistor T13 may operate as a source follower.

The source follower is also referred to as a common drain amplifier because the DC voltage is applied to the drain terminal, and the gate terminal may be used as input and the source terminal may be used as output. The source follower, when an input voltage is applied to the gate terminal, has a DC characteristic in which a voltage corresponding to the difference between the input voltage and the threshold voltage of the source follower is output from the source terminal, and for this reason, the source follower is also referred to as a level shifter.

Referring to FIG. 10B, because the source terminal of the first driving transistor T14 is directly connected to the drain terminal of the second driving transistor T13, the second driving transistor T13 operates as a source follower when a constant current generator data voltage, which is a DC voltage, is applied to the source terminal of the first driving transistor T14 (i.e., the drain terminal of the second driving transistor T13).

At this time, because the reference voltage Vref is applied to the gate terminal of the second driving transistor T13, the voltage Vref-Vth corresponding to the difference between the reference voltage Vref and the threshold voltage Vth of the second driving transistor may be output from the source terminal of the second driving transistor T13 (i.e., the other end (E node) of the capacitor C3).

More specifically, in the second driving transistor T13, the voltage of the source terminal may change as current flows until the second driving transistor T13 is turned off when the DC voltage is applied to the drain terminal while the reference voltage Vref is applied to the gate terminal and is turned on. The second driving transistor T13 is turned off when the voltage Vref-Vth corresponding to the difference between the reference voltage Vref and the threshold voltage Vth of the second driving transistor is applied to the source terminal, so that a Vref-Vth is output at the source terminal.

According to an embodiment, the threshold voltage of the second driving transistor T13 may be obtained at the source terminal of the second driving transistor T13 while the second driving transistor T13 operates as a source follower. The threshold voltage of the second driving transistor T13 may then be coupled through the capacitor C3 and be applied to the B node.

When the voltage of the source terminal of the second driving transistor T13 becomes Vref-Vth, Vref is applied to one end (D node) of the capacitor C3, so that a voltage difference between both ends of the capacitor C3 (i.e., a voltage difference between the E node and the D node) becomes −Vth. The +|Vth| shown in FIG. 10B is another representation of −Vth. Because the threshold voltage of the PMOS TFT has a negative value, +|Vth| is equal to −Vth.

Figure 10C:
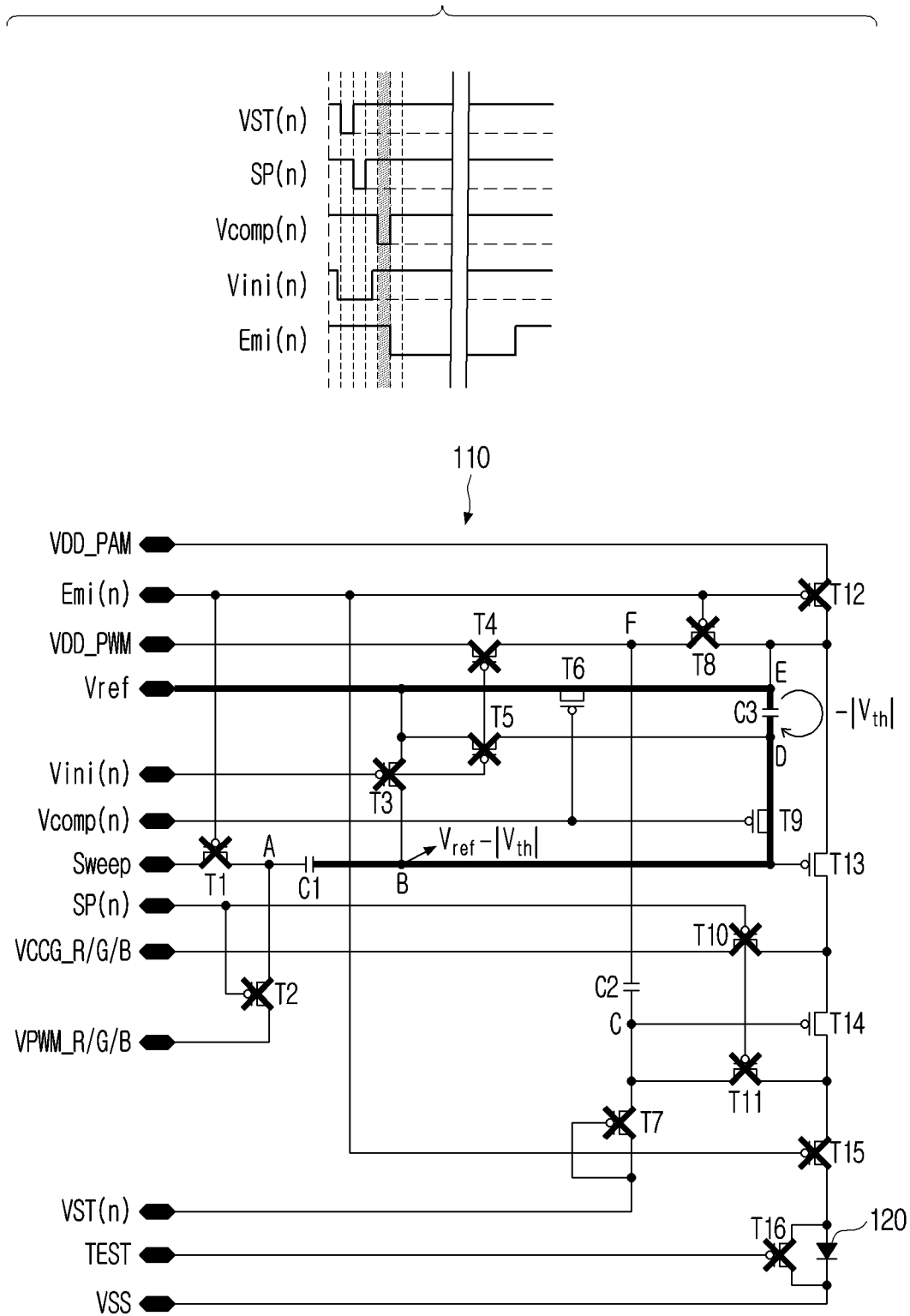
FIG. 10C is a diagram illustrating the operation of the sub-pixel circuit according to the Vcomp(n) among the scan signals according to an embodiment.

FIG. 10C is a diagram illustrating the operation of the sub-pixel circuit 110 according to the Vcomp(n) among the scan signals.

The Vcomp(n) signal is a scan signal for applying the threshold voltage of the second driving transistor T14 obtained at the source terminal (E node) of the second driving transistor T13 to the gate terminal (B node) of the second driving transistor T14.

As shown in FIG. 10C, when a low voltage (e.g., −5[V]) is applied through the Vcomp(n) signal line, the transistor T6 and the transistor T9 are turned on. Accordingly, the threshold voltage of the second driving transistor applied to the E node may be coupled to the B node through the capacitor C3.

In detail, when the transistor T6 is turned on while Vref-Vth is applied to the E node and Vref is applied to the D node, the voltage of the E node becomes Vref. Accordingly, the voltage variation of the E node, that is, +Vth, is coupled to the D node through the capacitor C3, and the voltage of the D node becomes Vref+Vth. At this time, because the transistor T9 is turned on according to the Vcomp(n) signal, the voltage Vref+Vth of the D node is applied to the B node as it is through the turned-on transistor T9. As shown in FIG. 10C, the −|Vth| is another representation of +Vth. Because the threshold voltage of the PMOS transistor TFT has a negative value, the −|Vth| and +Vth become the same value.

Figure 10D:
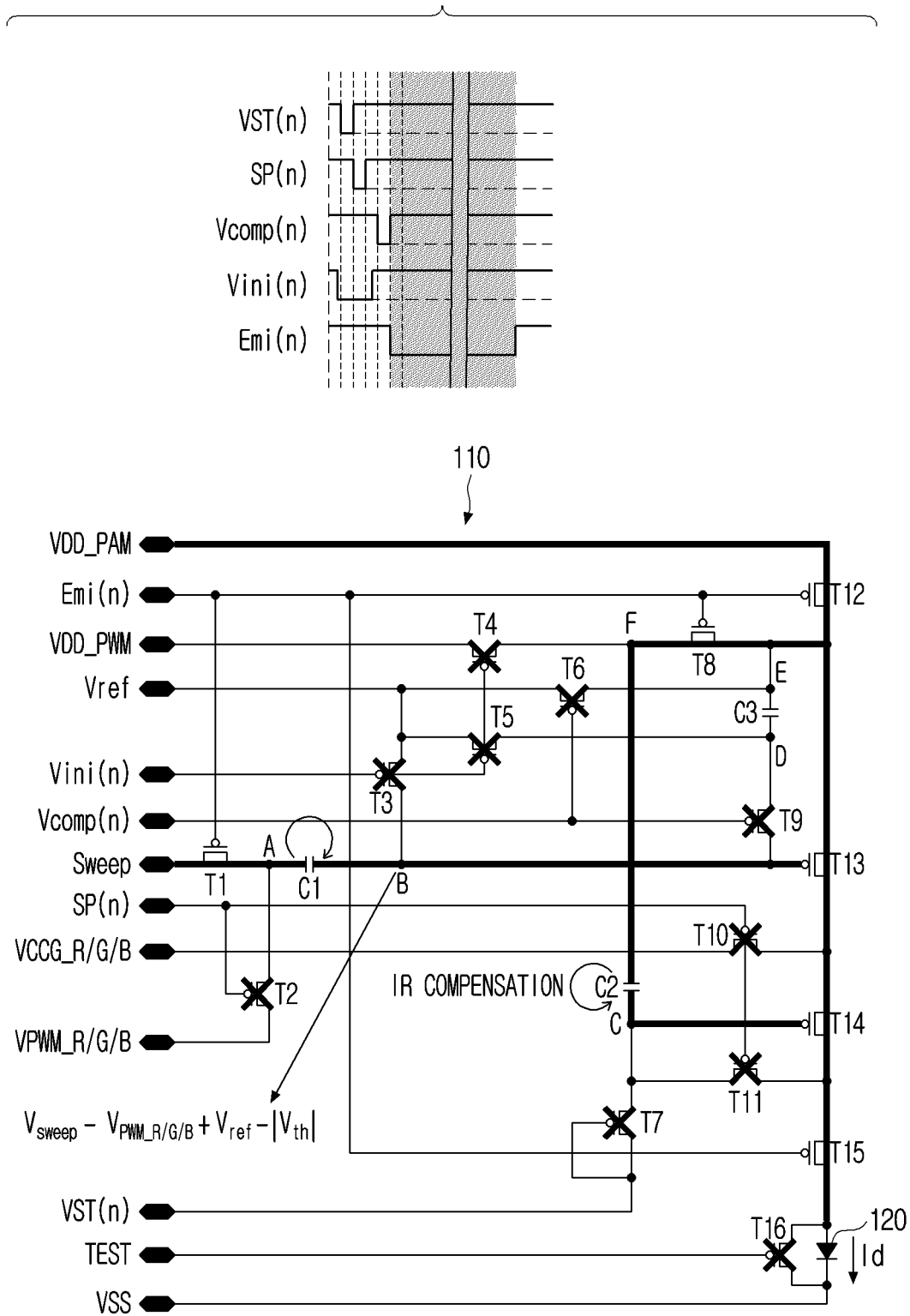
FIG. 10D is a diagram illustrating the operation of the sub-pixel circuit according to the emission signal Emi(n) according to an embodiment.

FIG. 10D is a diagram illustrating the operation of the sub-pixel circuit 110 according to the emission signal Emi (n).

As shown in FIG. 10D, when a low voltage (e.g., −5[V]) is applied through the Emi(n) signal line, the transistor T12, the transistor T15, the transistor T8, and the transistor T1 are turned on.

When the second driving transistor T13 and the first driving transistor T14 are turned on while the transistor T12 and the transistor T15 are turned on, the first driving voltage VDD_PAM is applied to the anode terminal of the inorganic light-emitting element 120. Accordingly, a potential difference exceeding a forward voltage Vf is generated at both ends of the inorganic light emitting element 120, and a driving current (i.e., a constant current) flows through the inorganic light emitting element 120 to make the inorganic light emitting element 120 emit light.

The first driving transistor T14 is turned on together as the second driving transistor T13 is turned on.

Specifically, when the transistor T12 and the transistor T15 are turned on according to the Emi(n) signal, a voltage (e.g., +0.8[V]) which is obtained by summing of a constant current generator data voltage (e.g., +3[V]) and a threshold voltage (e.g., −2.2[V]) of the first driving transistor T14 is applied to the C node, as described above in FIG. 10B. Therefore, when the first driving voltage VDD_PAM (e.g., +12[V]) is applied to the source terminal of the first driving transistor T14 as the second driving transistor T13 is turned on, the first driving transistor T14 is also turned on.

As a result, whether the first driving voltage VDD_PAM is to be applied to the anode terminal of the inorganic light emitting element 120 may be determined according to the on/off operation of the second driving transistor T13.

Because the second driving transistor T13 is the PMOS TFT, the second driving transistor T13 is turned on when a voltage less than a threshold voltage Vth is applied between the gate terminal and the source terminal. That is, the second driving transistor T13 is turned on when the voltage of the gate terminal is less than the sum of the voltage of the source terminal and the threshold voltage. For example, when the first driving voltage VDD_PAM applied to the source terminal is +12[V] and the threshold voltage Vth of the second driving transistor is −2.2[V], the second driving transistor T 13 may be turned on when a voltage of less than +9.8[V] is applied to the gate terminal.

In this regard, as illustrated in FIG. 10D, Vsweep−VPWM_R/G/B+Vref-|Vth| is applied to the gate terminal of the second driving transistor T13 (B node) during the emission section.

Referring to FIG. 10D, when the transistor T1 is turned on according to the Emi(n) signal, a portion of the sweep signal (Sweep) is applied to the A node while the transistor T1 is turned on. At this time, the portion of the sweep signal applied to the A node becomes a sweep voltage (Vsweep). When the sweep voltage (Vsweep) is applied to a node A, a PWM data voltage (VPWM_R/G/B) is coupled to the B node via the capacitor C1 along with the sweep voltage (Vsweep). Specifically, during the data setting section as described above, VPWM_R/G/B is applied to the A node, and Vref−|Vth| is applied to the B node. In this state, when the sweep voltage Vsweep is applied to the A node, the voltage of the A node is changed from the VPWM_R/G/B to the Vsweep. Because the voltage difference between both ends of the capacitor C1 must be constantly maintained, the voltage of the B node is also changed by the voltage variation of the A node (i.e., the Vsweep−VPWM_R/G/B). Accordingly, the voltage of the B node becomes Vsweep−VPWM_R/G/B+Vref-|Vth|.

At this time, the PWM data voltage (VPWM_R/G/B), the reference voltage (Vref) and the threshold voltage of the second driving transistor (Vth) have a fixed value, whereas the sweep voltage (Vsweep) has a value that varies linearly between +15[V] and +10[V].

Accordingly, the voltage of the B node during the emission section varies according to a change in the sweep voltage (Vsweep), and the second driving transistor T13 is turned on in a time period in which the voltage of the B node (that is, gate terminal) (Vsweep-VPWM_R/G/B+Vref-|Vth|) is lower than the voltage (VDD_PAM+Vth) corresponding to the sum of the voltage VDD_PAM of the source terminal and the threshold voltage Vth.

Here, −|Vth| and +Vth are the same values and the time period in which the second driving transistor T13 is turned on determined regardless of the Vth value.

As described above, because the change rate of the sweep voltage according to time is constant, the time period on which the second driving transistor T13 is turned on in the emission section varies according to the voltage of the B node at the time when the emission section starts. At this time, the voltage of the B node at the time point at which the emission section starts varies according to the VPWM_R/G/B value (i.e., the PWM data voltage value), so that the gray scale of the image may be expressed through the PWM data voltage.

The PWM operation of the sub-pixel circuit 110 described above will be described in more detail with reference to FIGS. 11A to 11C.

In the emission section, the driving voltage applied to the constant current generator circuit 111 is changed from the second driving voltage VDD_PWM to the first driving voltage VDD_PAM.

As described above, in the data setting section, the second driving voltage VDD_PWM is applied to the F node based on the Vini(n) signal. However, referring to FIG. 10D, the first driving voltage VDD_PAM is applied to one end (F node) of the capacitor C2 through the transistor T12 and the transistor T8, which are turned on according to the Emi(n) signal.

In the emission section, a voltage drop may occur in the first driving voltage VDD_PAM due to the IR drop generated while the driving current flows to the inorganic light emitting element 120.

However, even if a voltage drop occurs in the first driving voltage VDD_PAM, the voltage difference between both ends (F node and C node) of the capacitor C2 is maintained as set in the data setting section, and thus, image quality is not affected.

According to embodiments, in the data setting section, a constant current generator data voltage may be set to the constant current generator circuit 111 regardless of the voltage drop of the first driving voltage VDD_PAM by applying the constant current generator data voltage to the C node based on the second driving voltage VDD_PWM without a voltage drop, separately from the first driving voltage VDD_PAM.

In the emission section, the first driving voltage (VDD_PAM) that may have a voltage drop is used, but the constant current generator circuit 111 may operate exactly according to the voltage set in the data setting section because the voltage difference between both ends of the capacitor C2 is maintained regardless of the voltage drop of the first driving voltage VDD_PAM, as described above.

Figure 11A:
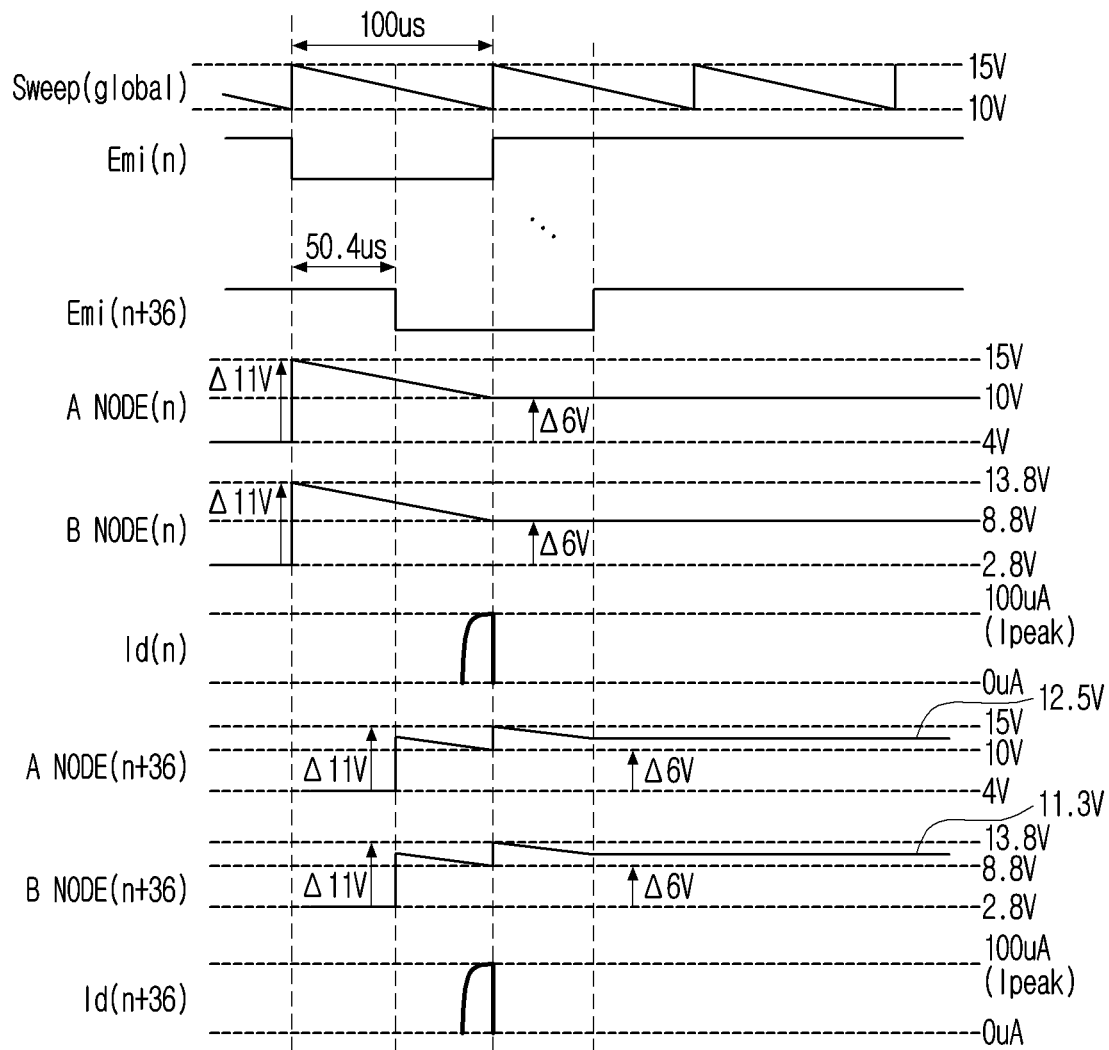
FIG. 11A is a diagram illustrating a PWM operation of a sub-pixel circuit having the configuration shown in FIG. 9A according to an embodiment.
Figure 11B:
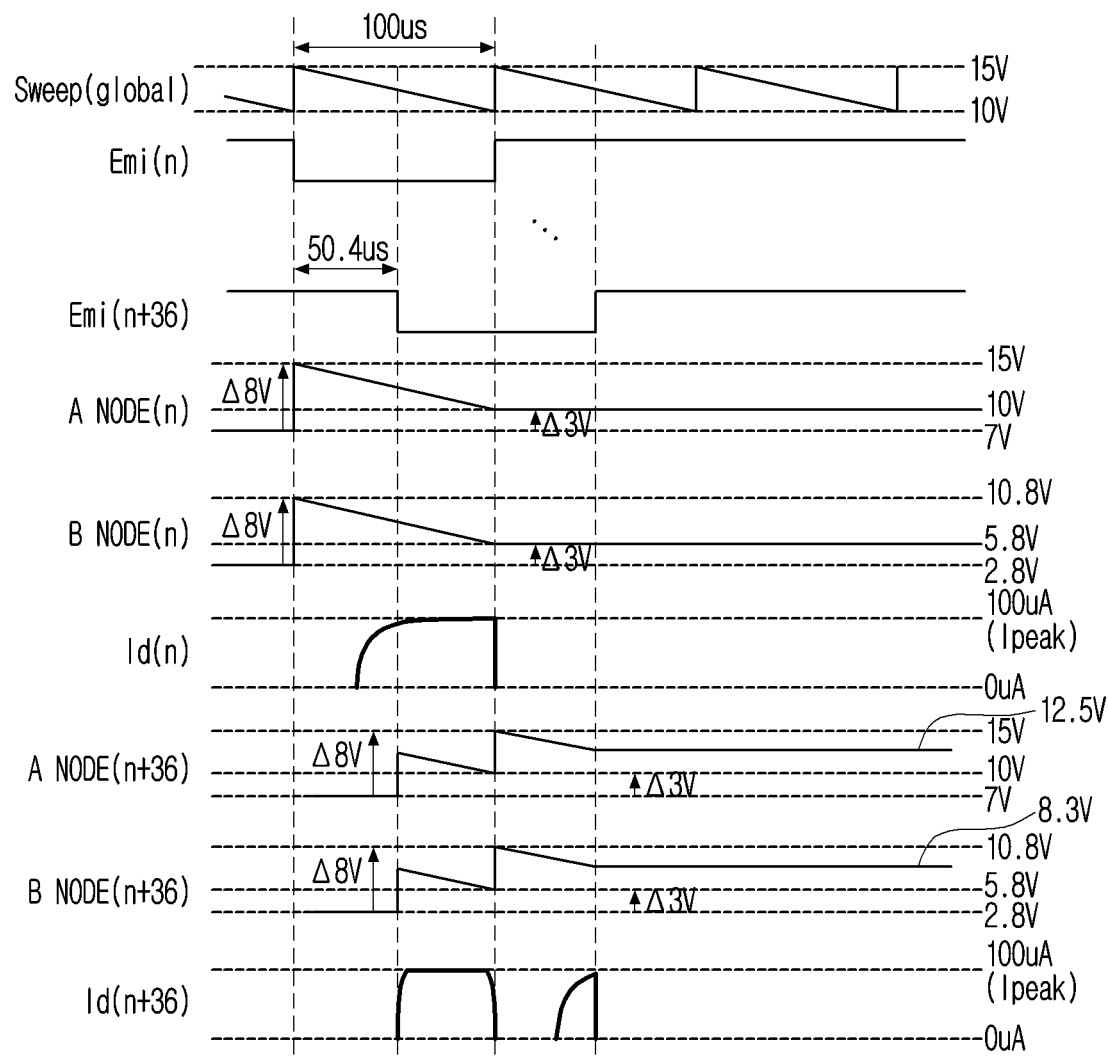
FIG. 11B is a diagram illustrating a PWM operation of a sub-pixel circuit having the configuration shown in FIG. 9A according to an embodiment.
Figure 11C:
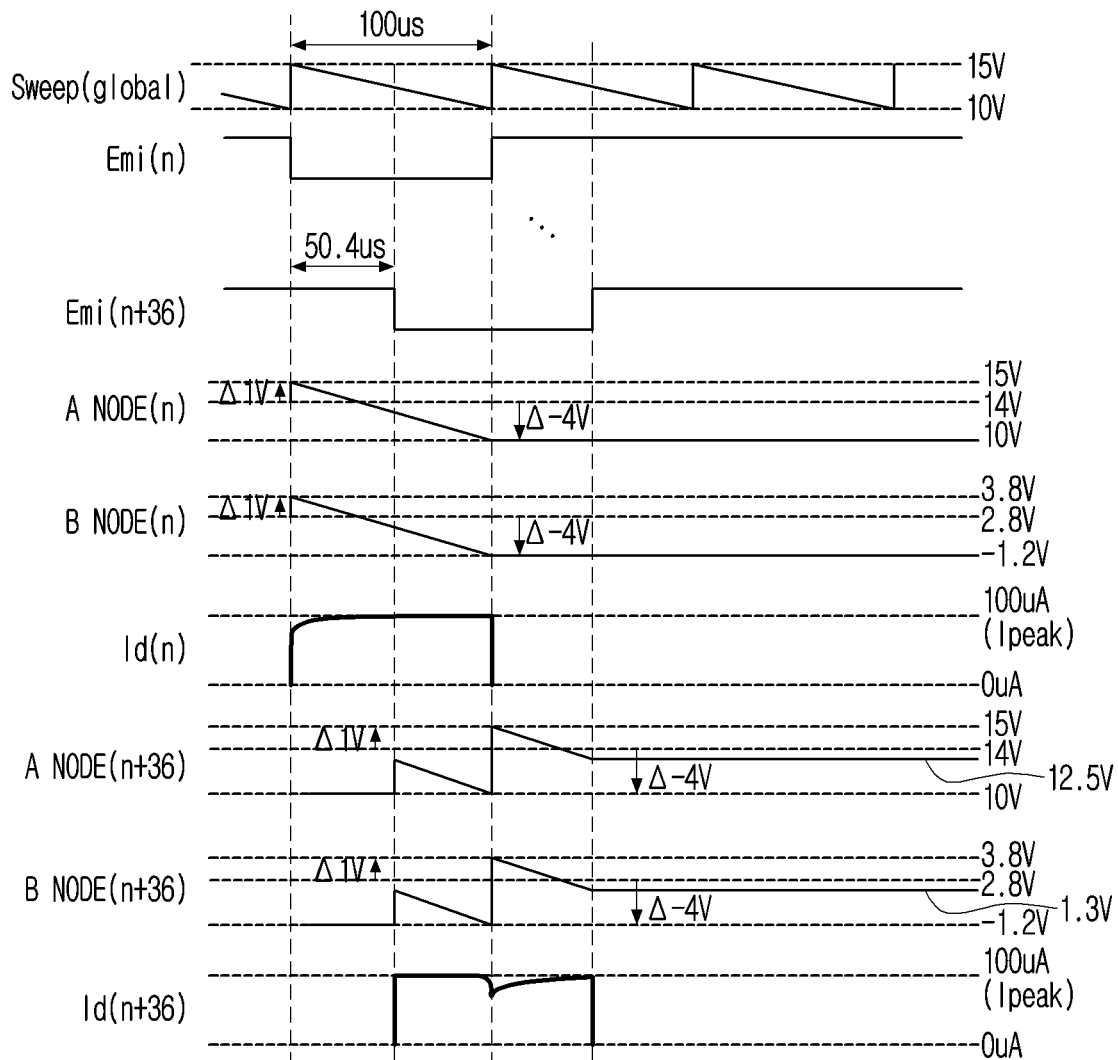
FIG. 11C is a diagram illustrating a PWM operation of a sub-pixel circuit having the configuration shown in FIG. 9A according to an embodiment.

FIGS. 11A to 11C are views illustrating a PWM operation of a sub-pixel circuit having the configuration shown in FIG. 9A. Referring to FIGS. 11A to 11C, the PWM data voltage corresponding to the low gray level is +4[V], the PWM data voltage corresponding to the medium gray level is +7[V], and the PWM data voltage corresponding to the high gray level is +14[V], but the PWM data voltage corresponding to each gray scale is not limited thereto.

FIGS. 11A to 11C show the voltage change at the A node, the voltage change at the B node, and the change of the driving current Id when the PWM data voltage is applied to the sub-pixel circuit 110 included in the $n^{th}$ row line and the (n+36)th row line, respectively.

As shown in FIGS. 11A to 11C, the threshold voltage of the second driving transistor Vth is −2.2[V], the reference voltage Vref is +5[V], and the first driving voltage VDD_PAM is +12[V]. In addition, a sweep signal (Sweep (global)) having a shape in which a voltage linearly changes from +15[V] to +10[V] every 100 μs is continuously repeated is used as an example. Here, (global) is an expression which indicates that the sweep signal is a global signal that is commonly applied to all row lines.

FIG. 11A illustrates an example where the PWM data voltage (e.g., +4[V]) corresponding to the low gray scale is applied to the sub-pixel circuit 110 included in the $n^{th}$ row line and the (n+36)$^{th}$ row line, respectively.

An operation of the sub-pixel circuit 110 included in the $n^{th}$ row line will be described.

During the data setting section, +4[V] (i.e., a PWM data voltage) is applied to the A node(n) of the sub-pixel circuit 110 included in the nth row line according to the SP(n) signal, and +2.8[V] (i.e., Vref−|Vth|) is applied to the B node(n) according to the Vcomp(n) signal.

After that, when the emission section starts, a sweep voltage (i.e., a voltage that varies linearly from +15[V] to +10[V]) is applied to the A node(n) as illustrated.

Because the voltage variation of the A node(n) according to the sweep voltage is coupled to the B node(n) through the capacitor C1, the voltage of the B node(n) changes from +13.8[V] to +8.8[V] while the voltage of the A node(n) changes from +15[V] to +10[V].

As described above, the second driving transistor T13 is turned on in a time period in which the voltage of the gate terminal (B node) is lower than the sum VDD_PAM+Vth of the voltage VDD_PAM of the source terminal and the threshold voltage Vth.

The second driving transistor T13 is turned on during a time in which the voltage of the B node(n) is lower than +9.8[V] (that is, a time period during which the voltage of the B node(n) changes from +9.8[V] to +8.8[V]), and the driving current flows through the inorganic light emitting element 120 in the time period during which the second driving transistor T13 is turned on. The Id(n) shows a change in the driving current.

An operation of the sub-pixel circuit 110 included in the n+36th row line will be described.

During the data setting section, +4[V] (i.e., a PWM data voltage) is applied to the A node(n)+36 of the sub-pixel circuit 110 included in the (n+36)th row line according to the SP(n+36) signal, and +2.8[V] (that is, Vref−|Vth|) is applied to the B node(n+36) according to the Vcomp(n+36) signal.

When the emission period starts thereafter, a sweep voltage (i.e., voltage linearly changes from +12.5[V] to +10[V], and from +15[V] to +12.5[V]), which is a portion of the sweep signal (sweep (global)) is applied to A node(n+36) according to Emi(n+36) signal.

More specifically, as described above, in various embodiments, the emission section is sequentially performed in the order of row lines, so that when the emission section is sequentially performed at an interval of 1H time (e.g., 1.4 μs), the Emi(n+36) signal has the same waveform as the Emi(n) signal is delayed by 50.4 μs.

Accordingly, the sweep voltage applied to the A node(n+36) of the sub-pixel circuit 110 included in the (n+36)th row line may have a waveform which linearly changes from +12.5[V] to +10[V], and then linearly changes from +15[V] to +12.5[V].

In other words, all the sweep voltages sweep once between +15[V] and +10[V], but the start voltage starting to sweep is variable according to the row line.

Because the voltage variation of the A node(n)+36 according to the sweep voltage is coupled to the B node(n+36) as it is through the capacitor C1, the voltage of the B node(n+36) varies from +11.3[V] to +8.8[V] while the voltage of the A node(n+36) changes from +12.5[V] to +10[V], and while the voltage of the A node(n+36) changes from +15[V] to +12.5[V], the voltage of the B node(n)+36 changes from +13.8[V] to +11.3[V].

The second driving transistor T13 is turned on during a time in which the voltage of the B node(n+36) is lower than +9.8[V], that is, a time period during which the voltage of the B node(n+36) varies from +9.8[V] to +8.8[V], and the driving current flows through the inorganic light emitting element 120 in the time period during which the second driving transistor T13 is turned on. The Id(n+36) shows a change in the driving current.

FIG. 11B shows the case where the PWM data voltage (e.g., +8[V]) corresponding to the mid gray level is applied to the sub-pixel circuit 110 included in the $n^{th}$ row line and the (n+36)th row line, respectively.

An operation of the sub-pixel circuit 110 included in the $n^{th}$ row line will be described.

During the data setting section, +7[V] (i.e., a PWM data voltage) is applied to the A node(n) of the sub-pixel circuit 110 included in the $n^{th}$ row line according to the SP(n) signal, and +2.8[V] (that is, Vref−|Vth|) is applied to the B node(n) according to the Vcomp(n) signal.

When the emission section starts thereafter, a sweep voltage (i.e., voltage linearly changes from +15[V] to +10 [V]), which is a portion of the sweep signal (sweep (global)) is applied to A node(n) according to Emi(n) signal.

Because the voltage variation of the A node(n) according to the sweep voltage is coupled to the B node(n) as it is through the capacitor C1, the voltage of the B node(n) varies from +10.8[V] to +5.8[V] while the voltage of the A node(n) changes from +15[V] to +10[V].

As described above, the second driving transistor T13 is turned on during a time in which the voltage of the B node(n) is lower than +9.8[V], that is, a time period during which the voltage of the B node(n) varies from +9.8[V] to +5.8[V], and the driving current flows through the inorganic light emitting element 120 in the time period during which the second driving transistor T13 is turned on. The Id(n) shows the above.

An operation of the sub-pixel circuit 110 included in the (n+36)th row line will be described.

During the data setting section, +7[V] (i.e., a PWM data voltage) is applied to the A node(n+36) of the sub-pixel circuit 110 included in the (n+36)th row line according to the SP(n+36) signal, and +2.8[V] (that is, Vref−|Vth|) is applied to the B node(n+36) according to the Vcomp(n+36) signal.

When the emission section starts thereafter, a sweep voltage (i.e., voltage linearly changes from +12.5[V] to +10[V], and from +15[V] to +12.5[V]), which is a portion of the sweep signal (sweep (global)) is applied to A node(n+36) according to Emi(n+36) signal.

Because the voltage variation of the A node(n+36) according to the sweep voltage is coupled to the B node(n+36) as it is through the capacitor C1, the voltage of the B node(n+36) varies from +8.3[V] to +5.8[V] while the voltage of the A node(n) changes from +12.5[V] to +10[V], and while the voltage of the A node(n+36) changes from +15[V] to +12.5[V], the voltage of the B node(n+36) changes from +10.8[V] to +8.3[V].

As described above, the second driving transistor T13 is turned on during a time in which the voltage of the B node(n+36) is lower than +9.8[V], that is, a time period during which the voltage of the B node(n+36) varies from +8.3[V] to +5.8[V] and from +9.8[V] to 8.3[V], and the driving current flows through the inorganic light emitting element 120 in the time period during which the second driving transistor T13 is turned on. The Id(n+36) shows the above.

Referring to FIG. 11B, the waveforms of the Id(n) and the Id(n+36) are different for the same PWM data voltage (+7[V]). However, because the integration value of the driving current, that is, the brightness of the inorganic light emitting element 120, is the same, it is not problematic.

FIG. 11C shows the case where the PWM data voltage (e.g., +14[V]) corresponding to the high gray scale is applied to the sub-pixel circuit 110 included in the n$^{th}$ row line and the (n+36)th row line, respectively.

An operation of the sub-pixel circuit 110 included in the n$^{th}$ row line will be described.

During the data setting section, +14[V] (i.e., a PWM data voltage) is applied to the A node(n) of the sub-pixel circuit 110 included in the n$^{th}$ row line according to the SP(n) signal, and +2.8[V] (that is, Vref−|Vth|) is applied to the B node(n) according to the Vcomp(n) signal.

When the emission section starts thereafter, a sweep voltage (i.e., voltage linearly changes from +15[V] to +10 [V]) which is a portion of the sweep signal (sweep (global)) is applied to A node(n) according to Emi(n) signal.

Because the voltage variation of the A node(n) according to the sweep voltage is coupled to the B node(n) as it is through the capacitor C1, the voltage of the B node(n) varies from +3.8[V] to −1.2[V] while the voltage of the A node(n) changes from +15[V] to +10[V].

As described above, the second driving transistor T13 is turned on during a time in which the voltage of the B node(n) is lower than +9.8[V], that is, a time period during which the voltage of the B node(n+36) varies from +3.8[V] to −1.2[V], and the driving current flows through the inorganic light emitting element 120 in the time period during which the second driving transistor T13 is turned on. The Id(n) shows the above.

An operation of the sub-pixel circuit 110 included in the n+36th row line will be described.

During the data setting section, +14[V] (i.e., a PWM data voltage) is applied to the A node(n+36) of the sub-pixel circuit 110 included in the n+36th row line according to the SP(n+36) signal, and +2.8[V] (that is, Vref−|Vth|) is applied to the B node(n+36) according to the Vcomp(n+36) signal.

When the emission section starts thereafter, a sweep voltage (i.e., voltage linearly changes from +12.5[V] to +10[V], and from +15[V] to +12.5[V]) which is a portion of the sweep signal (sweep (global)) is applied to A node(n+36) according to Emi(n+36) signal.

Because the voltage variation of the A node(n+36) according to the sweep voltage is coupled to the B node(n+36) as it is through the capacitor C1, the voltage of the B node(n+36) varies from +1.3[V] to −1.2[V] while the voltage of the A node(n+36) changes from +12.5[V] to +10[V], and while the voltage of the A node(n+36) changes from +15[V] to +12.5[V], the voltage of the B node(n+36) changes from +3.8[V] to +1.3[V].

As described above, the second driving transistor T13 is turned on during a time in which the voltage of the B node(n+36) is lower than +9.8[V], that is, a time period during which the voltage of the B node(n+36) varies from +1.3[V] to −1.2[V] and from +3.8[V] to +1.3[V], and the driving current flows through the inorganic light emitting element 120 in the time period during which the second driving transistor T13 is turned on. The Id(n+36) shows the above.

Referring to FIG. 11C, the waveforms of the Id(n) and the Id(n+36) are slightly different for the same PWM data voltage (+14[V]). However, because the integration value of the driving current, that is, the brightness of the inorganic light emitting element 120, is the same, it is not problematic.

Hereinafter, another embodiment will be described with reference to FIGS. 12A to 14C.

Figure 12A:
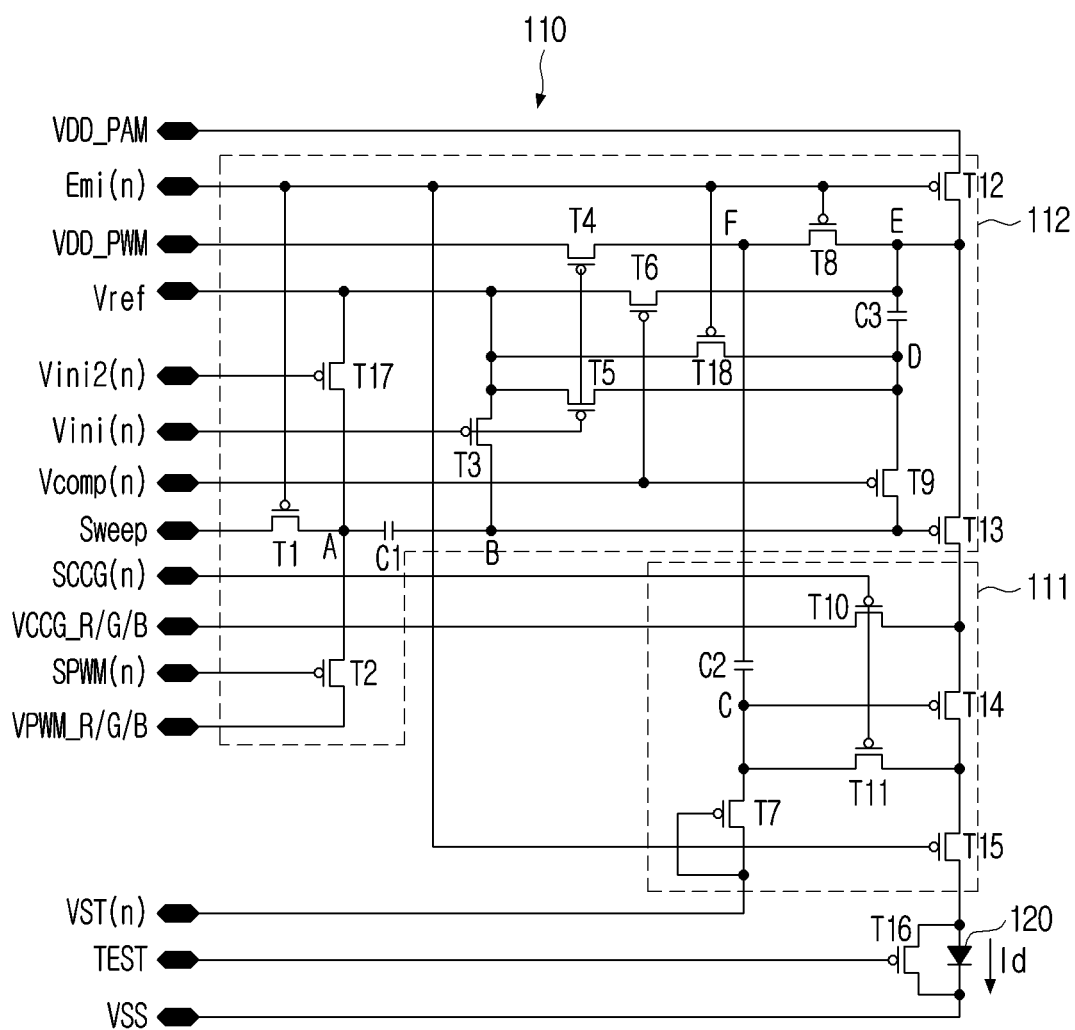
FIG. 12A is a detailed circuit diagram of a sub-pixel circuit according to another embodiment.

FIG. 12A is a detailed circuit diagram of a sub-pixel circuit according to another embodiment.

Referring to FIG. 12A, the sub-pixel circuit 110 includes a constant current generator circuit 111, a PWM circuit 112, and a transistor T16. As described above, the constant current generator circuit 111 includes the first driving transistor T14 and the PWM circuit 112 includes the second driving transistor T13, respectively.

Because the transistor T16 has the same connection structure and function as the transistor T16 of FIG. 9A, a duplicate description thereof is omitted. The TEST signal is also the same, and a duplicate description thereof is omitted.

The descriptions of the VDD_PAM, VDD_PWM, VSS, and Vref are also the same as the description of FIG. 9A, and a duplicate description will be omitted.

Vini(n) refers to a scan signal that is applied to the sub-pixel circuit 110 to apply the reference voltage Vref to the B node and the D node and the second driving voltage VDD_PWM to the F node in the data setting section. Vref applied to the B node and D node is used to obtain a threshold voltage of the second driving transistor T13, and the second driving voltage VDD_PWM applied to the F node becomes a reference potential when the constant current generator data voltage is set.

The VST(n) represents a scan signal applied to the sub-pixel circuit 110 to initialize the voltage of C node in the data setting section. When the voltage of the C node is initialized according to the VST(n) signal, the first driving transistor T14 is turned on.

Vini2(n) represents a scan signal applied to the sub-pixel circuit 110 in order to apply the reference voltage Vref to the A node in the data setting section. The Vref applied to the A node may be used to apply the threshold voltage of the second driving transistor T13 to the B node (i.e., the gate terminal of the second driving transistor T13) as will be described later.

The SCCG(n) represents a scan signal applied to the sub-pixel circuit 110 to apply a constant current generator data voltage (VCCG_R/G/B) to the C node in the data setting section.

The SPWM(n) represents a scan signal applied to the sub-pixel circuit 110 in order to apply the PWM data voltage (VPWM_R/G/B) to the A node in the data setting section.

Vcomp(n) represents the scan signal applied to the sub-pixel circuit 110 in order to apply the threshold voltage of the second driving transistor to the B node in the data setting section.

Emi(n) refers to the emission signal applied to the sub-pixel circuit 110 to apply the first driving voltage VDD_PAM to the E node and the F node in the emission section, apply a sweep voltage to the A node, and turn on the transistor T15.

In the above gate signals (scan signal and emission signal), n represents an $n^{th}$ row line. As described above, the driver 500 may drive the display panel 110 for each row line (or scan line or gate line), each of the Vini(n), Vini2(n), VST(n), SCCG(n), SPWM(n), Vcomp(n), and Emi(n) may be equally applied to the sub-pixel circuits 110 included in the $n^{th}$ row line.

The Sweep represents a sweep signal. The sweep signal is a global signal that is equally applied to all sub-pixel circuits 110 of the display panel 100 and may have a form in which a voltage linearly changing from a first voltage to a second voltage is continuously repeated. A part of the sweep signal may be applied to the A node while the transistor T1 is turned on according to the emission signal Emi(n), and a part of the sweep signal selectively applied to the A node may be the aforementioned sweep voltage. Because the contents related to the sweep signal are the same as those described above with reference to FIG. 9A, further redundant description will be omitted.

VPWM_R/G/B represents a PWM data voltage applied to the sub-pixel circuit 110. The PWM data voltage may be applied from a data driver. According to an embodiment, PWM data voltages for each of the R, G, and B sub-pixels constituting one pixel may be time division multiplexed and applied from the data driver. As such, the time division multiplexed PWM data voltages may be respectively applied to a corresponding sub-pixel through a demultiplexer circuit.

The sub-pixel circuit 110 of FIG. 12A illustrates the sub-pixel circuit 110 corresponding to a sub-pixel (e.g., R sub-pixel) of any one of R, G, B sub-pixels. Accordingly, in the sub-pixel circuit 110 of FIG. 12A, only the PWM data voltage (e.g., VPWM_R) for the R sub-pixel among the time division multiplexed PWM data voltages may be selected and applied through a demultiplexer circuit.

The VCCG_R/G/B represents the constant current generator data voltage applied to the sub-pixel circuit 110.

As described above, according to an embodiment, a constant current generator data voltage having the same magnitude may be applied to the display panel 100 for each type of sub-pixel. At this time, because the same constant current generator data voltage is applied to the same type of sub-pixel regardless of the column line or the row line, the DC voltage may be used as the constant current generator data voltage. For example, three types of DC voltages (e.g., +3.1[V], +2.8[V], +3.0[V]) corresponding to each of the R, G, and B sub-pixels may be directly applied to each of the R, G, and B sub-pixel circuits of the display panel 100 from the power IC.

In this example, in order to apply a constant current generator data voltage to the sub-pixel circuit 110, a separate data driver or a demultiplexer circuit is not required.

Regardless of the type of sub-pixel, the same constant current generator data voltage may be applied from the power IC to all sub-pixel circuits 110 of the display panel 100, regardless of the type of the sub-pixel.

In another embodiment, a constant current generator data voltage may be applied from a data driver.

The drop of the driving voltage generated in the emission section and the problem caused by the same are the same as described above with respect to FIG. 9A.

In various embodiments, by applying a separate driving voltage applied through a separate wire to the constant current generator circuit 111 in the data setting section and the emission section, respectively, a problem caused by a drop in the driving voltage would be overcome, which is also the same in the embodiment shown in FIG. 12A.

In the example of FIG. 12A, in the data setting section, the second driving voltage VDD_PWM is applied to the constant current generator circuit 111 according to the Vini(n) signal, and in the emission section, the first driving voltage VDD_PWM is applied to the constant current generator circuit 111 according to the Emi(n) signal.

Accordingly, even if a voltage drop occurs in the first driving voltage VDD_PAM due to the sub-pixel circuits operating in the emission section, a separate second driving voltage VDD_PWM is applied to the sub-pixel circuits operating in the data setting section and thus, setting a stable constant current generator data voltage is available.

Figure 12B:
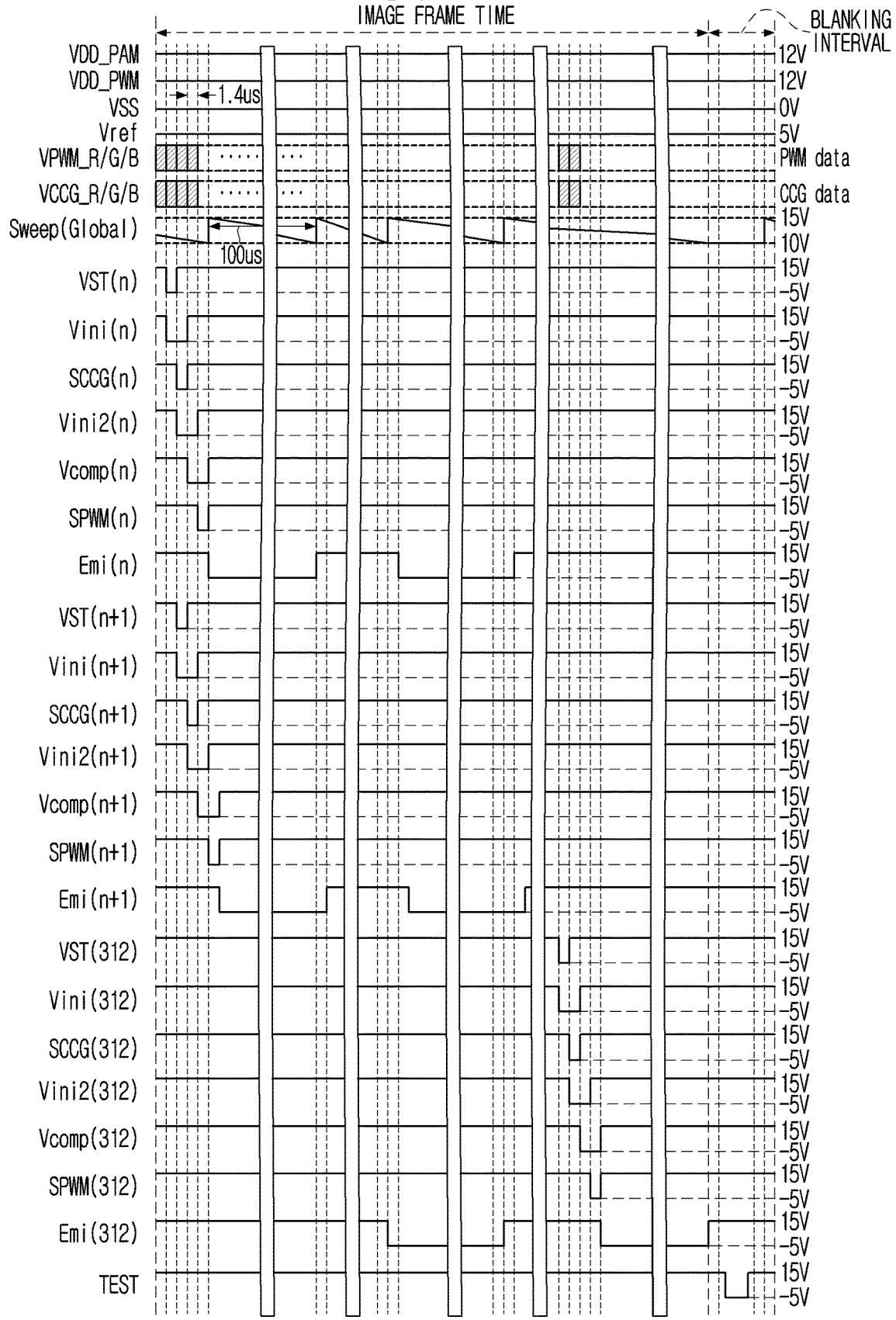
FIG. 12B is a timing diagram of various signals for driving a display panel including the sub-pixel circuit of FIG. 12A during an image frame time and a blanking interval according to an embodiment.

FIG. 12B is a timing diagram of various signals for driving the display panel 100 including the sub-pixel circuit 110 of FIG. 12A during an image frame time and a blanking interval. Referring to FIG. 12B, an example in which the display panel 100 includes 312 row lines is described.

As described above, according to an embodiment, for one image frame, one data setting section and a plurality of emission sections may be performed for each row line. Referring to FIG. 12B, during the image frame time, the scan signals VST, Vini, SCCG, Vini2, Vcomp, and SPWM for the data setting operation are applied once to each row line, and the emission signal Emi for the light emission operation is applied by a plurality of times to each row line.

In other words, the time interval in which the VST, Vini, SCCG, Vini2, Vcomp, SPWM signals are applied becomes the data setting section of the corresponding row line, and the time interval in which the low-level Emi signal is applied becomes the emission section of the corresponding row line.

As described above, according to an embodiment, the data setting section and the emission section may proceed in the order of a row line. Referring to FIG. 12B, each of the gate signals VST, Vini, SCCG, Vini2, Vcomp, SPWM and Emi is sequentially applied in the order of a row line. That is, for example, the low-level VST(n) signal and the low-level VST(n+1) signal are applied with a difference of 1H time (1.4 µs in the example of FIG. 12B). These are the same for the remaining gate signals (Vini signals (Vini(n) and Vini(n+1)), SCCG signals (SCCG(n) and SCCG(n+1)), Vini2 signals (Vini2(n) and Vini2(n+1)), Vcomp signals (Vcomp (n) and Vcomp(n+1)), SPWM signals (SPWM(n) and SPWM(n+1)), Emi signals (Emi(n) and Emi(n+1)) as well.

Referring to FIG. 12B, a low-level test signal is applied in the blanking interval. Because the TEST signal is a global signal, the TEST signal is applied to all of the sub-pixel circuits 110 of the display panel 100 equally, and thus, the charge remaining on all the inorganic light-emitting elements 120 of the display panel 100 may be discharged.

Referring to FIG. 13A to FIG. 13E, a specific operation of the sub-pixel circuit 110 of FIG. 12A will be described.

Figure 13A:
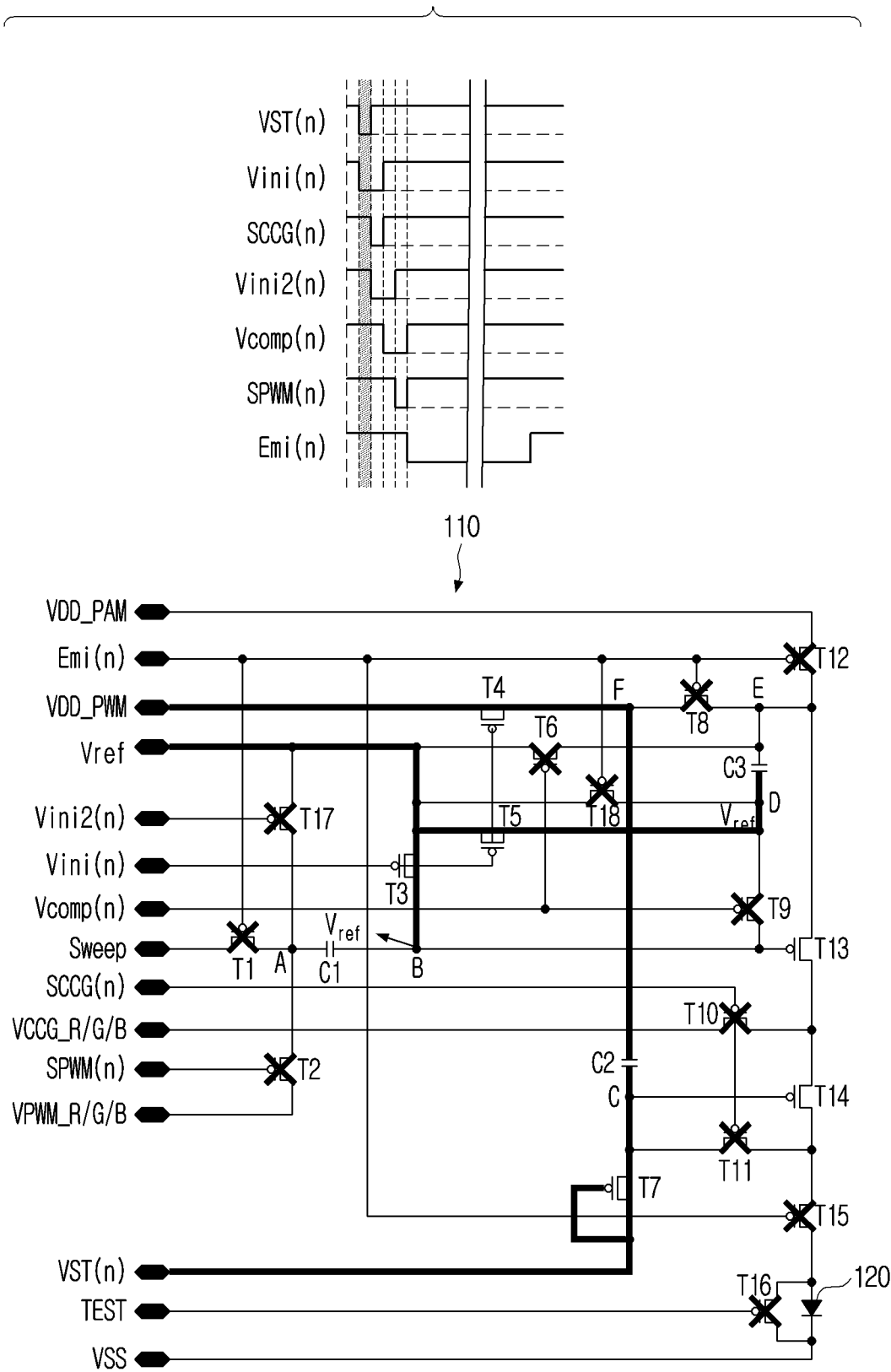
FIG. 13A is a diagram illustrating the operation of the sub-pixel circuit according to Vini(n) and VST(n) among the scan signals according to an embodiment.

FIG. 13A is a diagram illustrating the operation of the sub-pixel circuit 110 according to Vini(n) and VST(n) among the scan signals. The timing shown in FIG. 13A of the data setting section may be referred to as an initialization period.

When the data setting section starts, the driver 500 may apply a reference voltage Vref (for example, +5[V]) to the gate terminal (B node) of the second driving transistor T13 and one end (D node) of the capacitor C3, and may apply the second driving voltage VDD_PWM (e.g., +12[V]) to one end (F node) of the capacitor C2.

The driver 500 may apply the Vini(n) signal as illustrated in FIG. 13A.

Referring to FIG. 13A, Vref may be applied to the B node and the D node through the transistors T3 and T5 turned on according to the Vini(n) signal, respectively. At this time, the first driving voltage VDD_PAM (e.g., +12[V]) is floated on the E node (that is, the source terminal of the second driving transistor T13) according to the progress of the emission section for the previous image frame, and therefore, if it is assumed that the threshold voltage of the second driving transistor T13 is −2.2[V], when Vref (+5[V]) is applied to the B node, the second driving transistor T13 is turned on.

Also, referring to FIG. 13A, the second driving voltage VDD_PWM may be applied to the F node through the transistor T4 turned on according to the Vini(n) signal. The second driving voltage VDD_PWM applied to the F node becomes a reference potential when the constant current generator data voltage is set to the C node thereafter.

When the data setting section starts, the driver 500 may initialize the voltage of the gate terminal (C node) of the first driving transistor T14.

The driver 500 may apply a low voltage (e.g., −5[V]) to the sub-pixel circuit 110 through the VST(n) signal as shown in FIG. 13A. When the voltage of C node is initialized to a low voltage (e.g., −5[V]), the first driving transistor T14 may be in a turned-on state (e.g., a state in which a channel is formed).

Figure 13B:
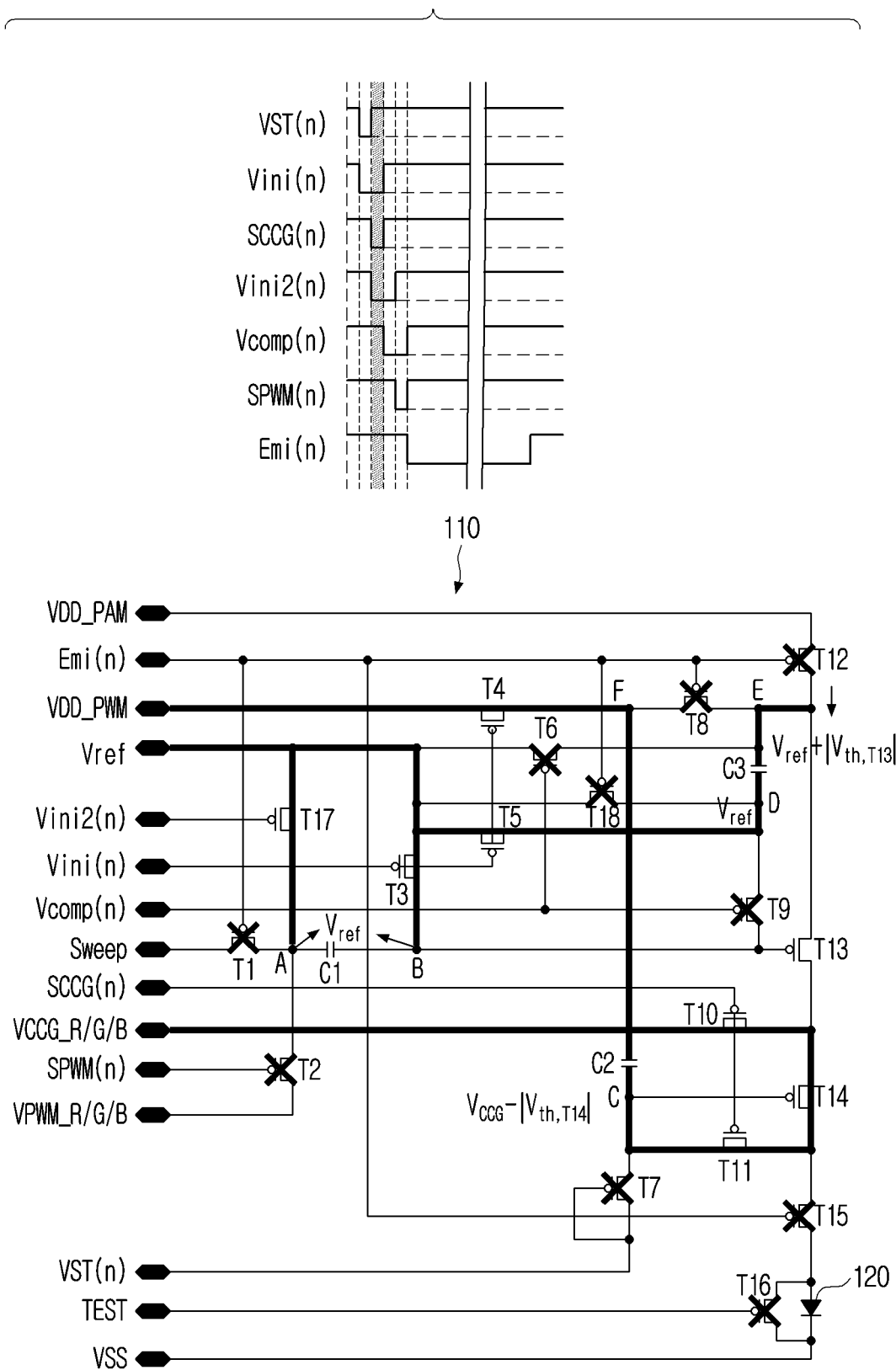
FIG. 13B illustrates the operation of the sub-pixel circuit according to SCCG(n) and Vini2($n$) among the scan signals according to an embodiment.

FIG. 13B illustrates the operation of the sub-pixel circuit 110 according to SCCG(n) and Vini2(n) among the scan signals.

Because the threshold voltage component of the second driving transistor T 13 first appears in the sub-pixel circuit 110 during the timing shown in FIG. 13B, the timing shown in FIG. 13B of the data setting section may be referred to as a threshold voltage sensing period.

The SCCG(n) signal is a scan signal for applying a constant current generator data voltage to the sub-pixel circuit 110. In the data setting section, when a low voltage (e.g., −5[V]) is applied to the sub-pixel circuit 110 through the SCCG(n) signal line, the transistor T10 and the transistor T11 are turned on.

When the transistor T10 and the transistor T11 are turned on, a constant current generator data voltage VCG_R/G/B may be applied to the C node through the turned-on transistor T10, the first driving transistor T14 and the turned-on transistor T11 based on the VST(n) signal.

In the C node, the constant current generator data voltage (VCCG_R/G/B) is not applied (or set) as it is, but a constant current generator data voltage in which the threshold voltage Vth of the first driving transistor T14 is compensated (that is, the voltage VCCG_R/G/B+Vth which is the sum of the threshold voltage of the first driving transistor T14 and the constant current generator data voltage) is applied.

Specifically, when the transistor T10 and the transistor T11 are turned on according to the SCCG(n) signal while the first driving transistor T14 is turned on according to the VST(n) signal, the constant current generator data voltage starts to be input to the C node through the transistor T10, the driving transistor T14 and the transistor T11. That is, the voltage of C node starts to rise from the low voltage (e.g., −5[V]).

However, the voltage of the C node does not rise to the constant current generator data voltage (e.g., +3[V]), and may rise to the voltage (i.e., +0.8[V]) that is the sum of the threshold voltages (e.g. −2.2[V]) of the first driving transistor T14 and the constant current generator data voltage (+3[V]).

This is because, if the voltage difference between the gate terminal and the source terminal of the first driving transistor T14 is reduced as the voltage of the C node is increased and then becomes the threshold voltage of the first driving transistor T14, the first driving transistor T14 is turned off and the current flow is stopped.

In other words, because the constant current generator data voltage is applied to the source terminal of the first driving transistor T14 through the turned-on transistor T10, the voltage of the C node rises only to the sum VCCG_R/G/B+Vth of the constant current generator data voltage VCCG_R/G/B and the threshold voltage Vth of the first driving transistor T14.

The VCCG−|Vth, T14| represented in the C node of FIG. 13B is another expression of the same value of VCCG_R/G/B+Vth. VCCG denotes a constant current generator data voltage applied to the sub-pixel circuit 110, and |Vth, T14| denotes an absolute value of a threshold voltage of the first driving transistor T14, respectively. Because the first driving transistor T14 is a PMOS TFT and the threshold voltage of the PMOS TFT has a negative value, VCCG−|Vth, T14| and VCCG_R/G/B+Vth have the same value. When a constant current generator data voltage is applied to the source terminal of the first driving transistor T14 while the transistor T10 is turned on according to the SCCG(n) signal, the second driving transistor T13 may operate as a source follower.

The source follower is also referred to as a common drain amplifier because the DC voltage is applied to the drain terminal, and the gate terminal may be used as input and the source terminal may be used as output. The source follower, when an input voltage is applied to the gate terminal, has a DC characteristic in which a voltage corresponding to the difference between the input voltage and the threshold voltage of the source follower is output from the source terminal, and for this reason, the source follower is also referred to as a level shifter.

Referring to FIG. 13B, because the source terminal of the first driving transistor T14 is directly connected to the drain terminal of the second driving transistor T13, the second driving transistor T13 operates as a source follower when a constant current generator data voltage, which is a DC voltage, is applied to the source terminal of the first driving transistor T14 (i.e., the drain terminal of the second driving transistor T13).

In this example, because the reference voltage Vref is applied to the gate terminal of the second driving transistor T13, the voltage Vref-Vth corresponding to the difference between the reference voltage Vref and the threshold voltage Vth of the second driving transistor may be output from the source terminal of the second driving transistor T13 (i.e., the other end (E node) of the capacitor C3).

More specifically, in the second driving transistor T13, the voltage of the source terminal may change as current flows until the second driving transistor T13 is turned off when the DC voltage is applied to the drain terminal while the reference voltage Vref is applied to the gate terminal and is turned on. The second driving transistor T13 is turned off when the voltage Vref-Vth corresponding to the difference between the reference voltage Vref and the threshold voltage Vth of the second driving transistor is applied to the source terminal, so that a Vref-Vth is output at the source terminal.

According to an embodiment, the threshold voltage of the second driving transistor T13 may be obtained at the source terminal of the second driving transistor T13 while the second driving transistor T13 operates as a source follower. The threshold voltage of the second driving transistor T13 may then be coupled through the capacitor C3 and be applied to the B node.

Vref+|Vth, T13| indicated in the E node of FIG. 13B is only a different representation of the same value as the aforementioned Vref-Vth. The Vref denotes a reference voltage, and |Vth, T13| denote threshold voltages of the second driving transistor T13, respectively. Because the second driving transistor T13 is a PMOS TFT and the threshold voltage of the PMOS TFT has a negative value, Vref+|Vth, T13|, and Vref-Vth may have the same value.

The Vini2(n) signal is a scan signal for applying the reference voltage Vref to the A node. In the data setting section, when a low voltage (e.g., −5[V]) is applied to the sub-pixel circuit 110 through the Vini2(n) signal line, the transistor T17 is turned on, and the reference voltage may be applied to the A node through the turned-on transistor T17.

Figure 13C:
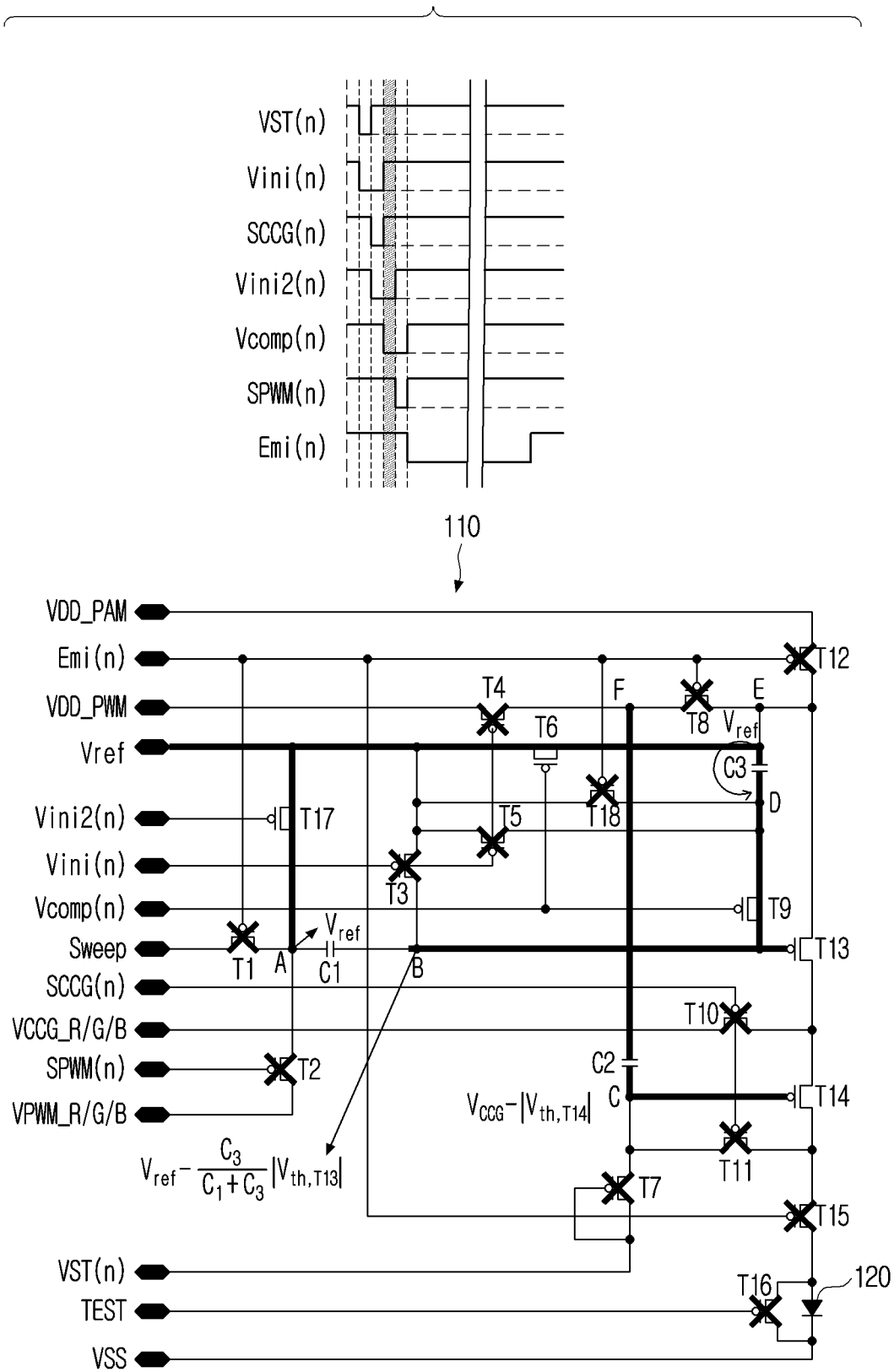
FIG. 13C is a diagram illustrating the operation of the sub-pixel circuit according to the Vcomp(n) among the scan signals according to an embodiment.

FIG. 13C is a diagram illustrating the operation of the sub-pixel circuit 110 according to the Vcomp(n) of the scan signals. Because the threshold voltage component of the second driving transistor T13 is applied to the gate terminal of the second driving transistor T13 during the timing shown in FIG. 13C, the timing shown in FIG. 13C of the data setting section may be referred to as a threshold voltage compensation period.

The Vcomp(n) signal is a scan signal for applying the threshold voltage of the second driving transistor T13 obtained at the source terminal E node of the second driving transistor T 13 to the gate terminal B node of the second driving transistor T13.

As shown in FIG. 13C, when a low voltage (e.g., −5[V]) is applied through the Vcomp(n) signal line, the transistor T6 and the transistor T9 are turned on. Accordingly, the threshold voltage Vth of the second driving transistor applied to the E node may be coupled to the B node through the capacitor C3. Specifically, as described above, in a state in which the low-level Vini(n) signal, the low-level SCCG (n) signal, and the low-level Vini2(n) signal are applied, the voltages of the B node and the D node are Vref and the voltage at E node becomes Vref-Vth (i.e., Vref+|Vth, T13|), and the voltage at A node becomes Vref.

When the low-level Vcomp(n) signal is applied to the sub-pixel circuit 110 in this state, the B node and the D node are short-circuited through the turned-on transistor T9, and the reference voltage Vref is applied to the E node through the turned-on transistor T6.

When the Vcomp(n) signal is at a low level, the Vini(n) signal becomes a high level, and the Vini2(n) signal maintains a low level. Therefore, the A node maintains the reference voltage Vref, and the voltage variation of the E node is distributed by the capacitor C3 and the capacitor C1 and coupled to the B node (or the D node).

Specifically, because the voltage of the E node changes from Vref-Vth to Vref as the low-level Vcomp(n) signal is applied, the voltage change amount of the E node becomes +Vth, and the B node is coupled with the voltage of +(C3/(C1+C3))*Vth, so that the voltage at B node becomes Vref+(C3/(C1+C3))*Vth.

Vref−(C3/(C1+C3))*|Vth, T13| shown in FIG. 13C is merely another expression of the same value as the aforementioned Vref+(C3/(C1+C3))*Vth. The Vref denotes a reference voltage, and |Vth, T13| denotes absolute values of the threshold voltage of the second driving transistor T13. Because the second driving transistor T13 is a PMOS TFT, and the threshold voltage of the PMOS TFT has a negative value, Vref−(C3/(C1+C3))*|Vth, T13| and Vref+(C3/(C1+C3))*Vth may have the same value.

Figure 13D:
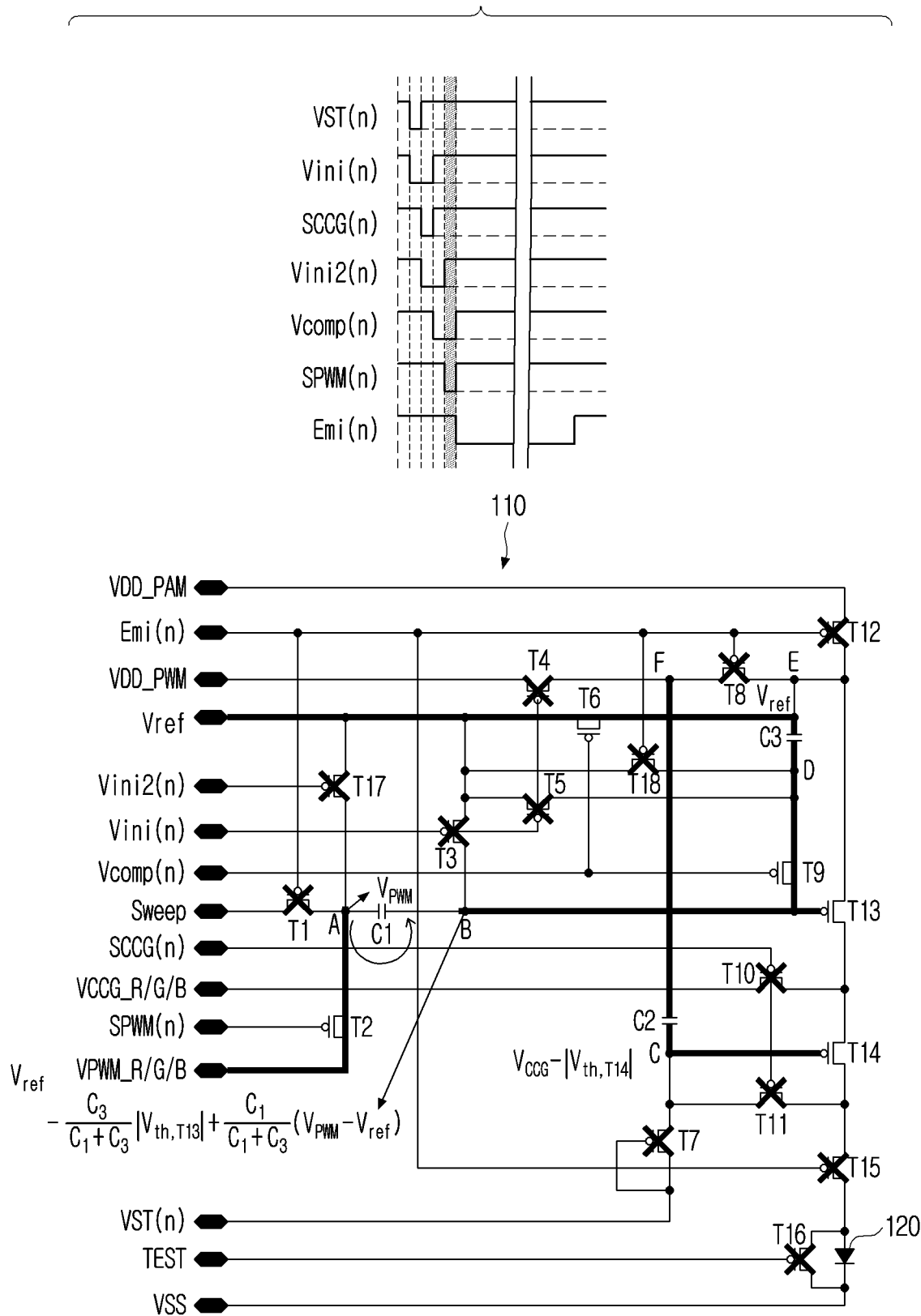
FIG. 13D is a diagram illustrating the operation of the sub-pixel circuit according to the SPWM(n) among the scan signals according to an embodiment.

FIG. 13D is a diagram illustrating the operation of the sub-pixel circuit 110 according to the SPWM(n) among the scan signals. Because the PWM data voltage for the grayscale representation is applied to the sub-pixel circuit 110 during the timing shown in FIG. 13D, the timing shown in FIG. 13D of the data setting section may be referred to as a programming period.

The SPWM(n) is a scan signal for applying the PWM data voltage (VPWM_R/G/B) to the sub-pixel circuit 110. In the data setting section, when a low voltage (e.g., −5[V]) is applied to the sub-pixel circuit 110 through the SPWM(n) signal line, the transistor T2 is turned on, and the PWM data voltage (e.g., VPWM) is applied to the A node through the turned-on transistor T2.

When the SPWM(n) signal is at a low level, the Vini2(n) signal becomes a high level, and the Vcomp(n) signal maintains a low level. Therefore, the E node maintains the reference voltage Vref, and the voltage variation of the A node is distributed by the capacitor C3 and the capacitor C1 and coupled to the B node (or the D node).

In detail, as the low-level SPWM(n) signal is applied, the voltage of the A node changes from Vref to VPWM, so that the voltage variation of the A node becomes VPWM-Vref, and the voltage as much as (C1/(C1+C3))*(VPWM-Vref) is coupled to the B node.

As described above in FIG. 13C, the voltage of the B node before the low-level SPWM(n) signal is applied is Vref+(C3/(C1+C3))*Vth as described in FIG. 13C, the voltage of the B node becomes Vref+(C3/(C1+C3))*Vth+(C1/(C1+C3))*(VPWM-Vref).

As described above, because the threshold voltage +Vth of the second driving transistor is equal to −|Vth, T131|, the voltage of the B node shown in FIG. 13D is equal to the value of the Vref+(C3/(C1+C3))*Vth+(C1/(C1+C3))*(VPWM-Vref).

Figure 13E:
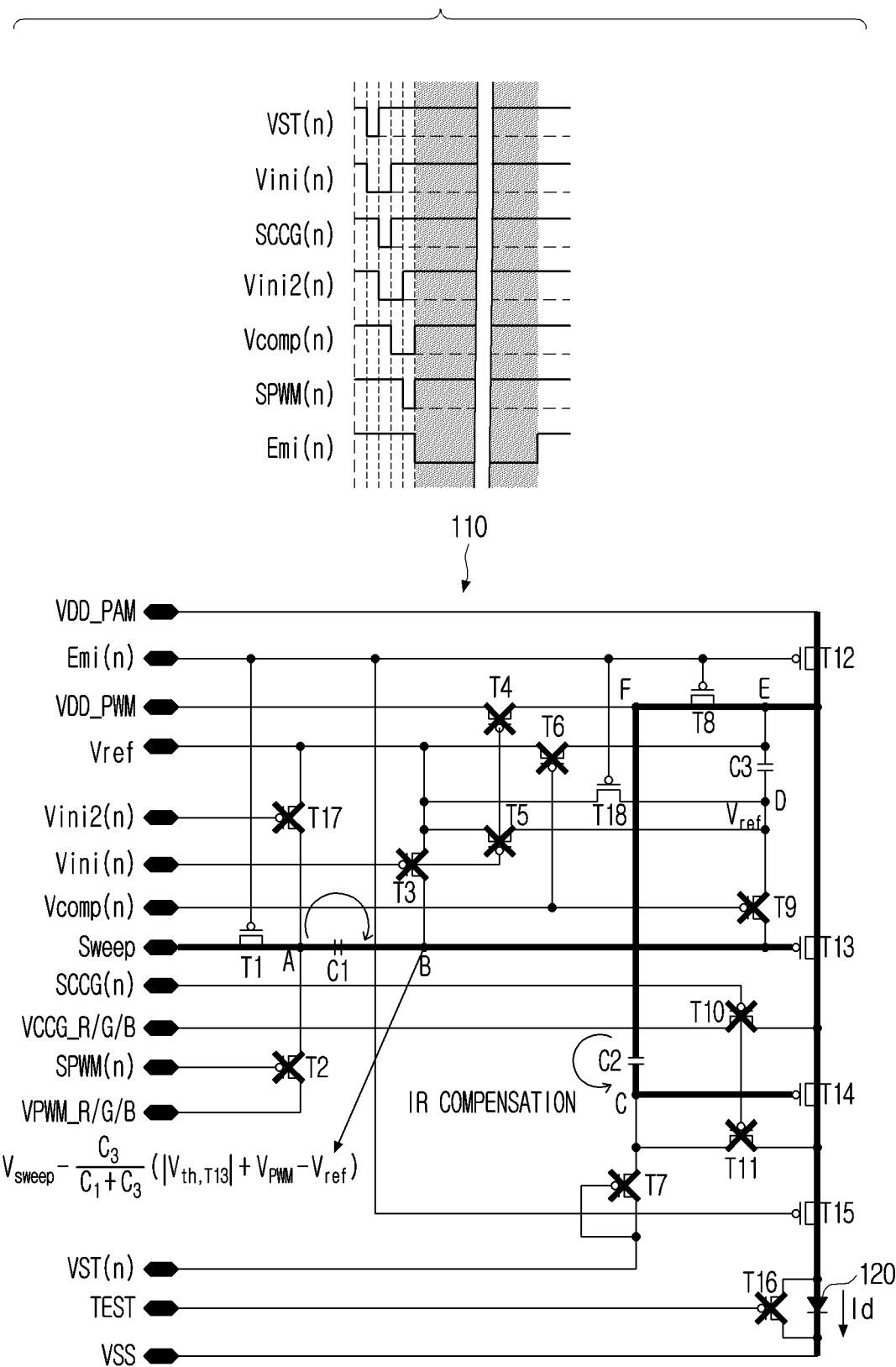
FIG. 13E illustrates the operation of the sub-pixel circuit according to the emission signal Emi(n) according to an embodiment.

FIG. 13E is a diagram illustrating the operation of the sub-pixel circuit 110 according to the emission signal Emi (n). Because the inorganic light emitting element 120 emits light during the timing shown in FIG. 13E, the timing shown in FIG. 13E may be referred to as an emission section.

As shown in FIG. 13E, when a low voltage (e.g., −5[V]) is applied through the Emi(n) signal line, the transistor T12, the transistor T15, the transistor T8, the transistor T1, and the transistor T18 are turned on. The time interval in which the low-level Emi(n) signal is applied becomes a emission section.

When the second driving transistor T13 and the first driving transistor T14 are turned on while the transistor T12 and the transistor T15 are turned on, the first driving voltage VDD_PAM is applied to the anode terminal of the inorganic light-emitting element 120. Accordingly, a potential difference exceeding a forward voltage Vf is generated at both ends of the inorganic light emitting element 120, and a driving current (i.e., a constant current) flows through the inorganic light emitting element 120 to make the inorganic light emitting element 120 emit light.

The first driving transistor T14 is turned on together as the second driving transistor T13 is turned on.

Specifically, when the transistor T12 and the transistor T15 are turned on according to the Emi(n) signal, in the C node, a voltage (e.g., +0.8[V]) which is the sum of a constant current generator data voltage (e.g., +3[V]) and the threshold voltage (e.g., −2.2[V]) is applied as illustrated in FIG. 13B. Accordingly, when the first driving voltage VDD_PAM (e.g., +12[V]) is applied to the source terminal of the first driving transistor T14 as the second driving transistor T13 is turned on, the first driving transistor T14 will be turned on as well.

Whether the first driving voltage VDD_PAM is applied to the anode terminal of the inorganic light emitting element 120 depends on the on/off operation of the second driving transistor T13.

Because the second driving transistor T13 is the PMOS TFT, it is turned on when a voltage less than the threshold voltage Vth is applied between the gate terminal and the source terminal. The second driving transistor T13 is turned on when the voltage of the gate terminal is less than the sum of the voltage of the source terminal and the threshold voltage. For example, when the first driving voltage VDD_PAM applied to the source terminal is +12[V] and the threshold voltage Vth of the second driving transistor is −2.2[V], the second driving transistor T13 is turned on when a voltage less than +9.8[V] is applied to the gate terminal.

In this regard, as illustrated in FIG. 13E, during the emission section, the gate terminal (B node) of the second driving transistor T13 is applied with Vsweep−(C3/(C1+C3))*(|Vth, T13|+VPWM−Vref).

Referring to FIG. 13E, when the transistor T1 is turned on according to the Emi(n) signal, a part of the sweep signal Sweep is applied to the A node while the transistor T1 is turned on. In this example, a part of the sweep signal applied to the A node becomes the sweep voltage Vsweep. When the sweep voltage Vsweep is applied to the A node, the PWM data voltage VPWM together with the sweep voltage Vsweep is coupled to the B node through the capacitor C1.

As described above, VPWM is applied to A node by the low level SPWM(n) signal, and Vref+(C3/(C1+C3))*Vth+(C1/(C1+C3))*(VPWM−Vref) is applied to B node. In this state, when the sweep voltage Vsweep is applied to the A node, the voltage of the A node changes from VPWM to Vsweep. At this time, because the voltage difference between both ends of the capacitor C1 must be kept constant, the voltage of the B node also changes as much as the voltage change amount of the A node (i.e., Vsweep−VPWM). Accordingly, the voltage of B node becomes Vsweep−VPWM+Vref+(C3/(C1+C3))*Vth+(C1/(C1+C3))*(VPWM−Vref). Summarizing this, Vsweep+(C3/(C1+C3))*(Vth−VPWM+Vref) is obtained, which is the same as Vsweep−(C3/(C1+C3))*(|Vth, T13|+VPWM−Vref) as illustrated in FIG. 13E.

At this time, if the capacitance of C3 has a sufficiently large value compared to the capacitance of C1, C3/(C1+C3) has a value close to 1. Assuming that C3/(C1+C3) is 1, the voltages at the B node in the emission section become Vsweep−|Vth, T13|−VPWM+Vref, and a time period during which the second driving transistor T13 is turned on may be determined irrespective of the threshold voltage value of the second driving transistor, as will be described later. The threshold voltage of the second driving transistor T13 may be compensated.

Specifically, in Vsweep−|Vth| and T13|−VPWM+Vref, the PWM data voltage VPWM, the reference voltage Vref, and the threshold voltages Vth and T13 of the second driving transistor all have fixed values. On the other hand, the sweep voltage Vsweep has a value that varies linearly between, for example, +15[V] and +10[V].

Accordingly, during the emission section, the voltage of the B node changes according to the change of the sweep voltage Vsweep, and the second driving transistor T13 is turned on in a time period when the voltage (Vsweep+Vth−VPWM+Vref) of the changing B node (that is, gate terminal) is lower than the sum (VDD_PAM+Vth) of the voltage (VDD_PAM) of the source terminal and the threshold voltage Vth.

Because Vsweep+Vth−VPWM+Vref and VDD_PAM+Vth both include Vth, the time period during which the second driving transistor T13 is turned on is determined regardless of the Vth value.

As described above, because the rate of change of the sweep voltage over time is constant, the time period during which the second driving transistor T13 is turned on in the emission section is changed according to the voltage of the B node at the time point at which the emission section starts. Because the voltage of the B node at the time point at which the emission section starts varies according to the VPWM value (i.e., the PWM data voltage value), the gray scale of the image may be expressed through the PWM data voltage.

The PWM operation of the sub-pixel circuit 110, such as above, will be described in more detail with reference to FIGS. 14A to 14C.

In the emission section, the driving voltage applied to the constant current generator circuit 111 is changed from the second driving voltage VDD_PWM to the first driving voltage VDD_PAM.

As described above, in the data setting section, the second driving voltage VDD_PWM is applied to the F node based on the Vini(n) signal. However, referring to FIG. 13E, the first driving voltage VDD_PAM is applied to one end (F node) of the capacitor C2 through the transistor T12 and the transistor T8, which are turned on according to the Emi(n) signal.

In the emission section, a voltage drop may occur at the first driving voltage (VDD_PAM) due to the IR drop caused by the flow of the driving current to the inorganic light emitting element 120.

However, even if a voltage drop occurs at the first driving voltage (VDD_PAM), the voltage difference between both ends (F node and C node) of the capacitor C2 is maintained as set in the data settings interval, image quality is not affected.

According to embodiments, the constant current generator data voltage may be set to the constant current generator circuit 111 regardless of the voltage drop of the first driving voltage VDD_PAM by applying a constant current generator data voltage to the C node based on the second driving voltage VDD_PWM without a voltage drop, separately from the first driving voltage VDD_PAM.

The constant current generator circuit 111 may operate exactly according to the constant current generator data voltage set in the data setting section, because the first driving voltage VDD_PAM that may have a voltage drop is used in the emission section, but the voltage difference of both ends of the capacitor C2 is maintained regardless of the voltage drop of the first driving voltage VDD_PAM, as described above.

In the emission section, the transistor T18 is turned on according to the low-level Emi(n) signal, and the reference voltage Vref is applied to the D node through the turned-on transistor T18.

If Vref is not applied to the D node during the emission section, when Vref is applied to the D node during the initialization period of the next image frame, the voltage change amount of the D node is coupled to the E node so that the voltage of the E node may be lower than the first driving voltage VDD_PAM. In this example, even when Vref is applied to the B node, the second driving transistor T13 may not be turned on, so that a problem that the threshold voltage of the second driving transistor T13 may not be obtained during the threshold voltage sensing period may occur.

Accordingly, according to an embodiment, Vref may be applied to the D node during the emission section, as shown in FIG. 13E. In this example, even though Vref is applied to the D node in the initialization period for the next image frame, because the voltage of the D node is not changed, the first driving voltage VDD_PAM is floated on the E node. Accordingly, the threshold voltage of the second driving transistor T13 may be obtained and compensated for the next image frame, as described above with reference to FIGS. 13A to 13D.

Figure 14A:
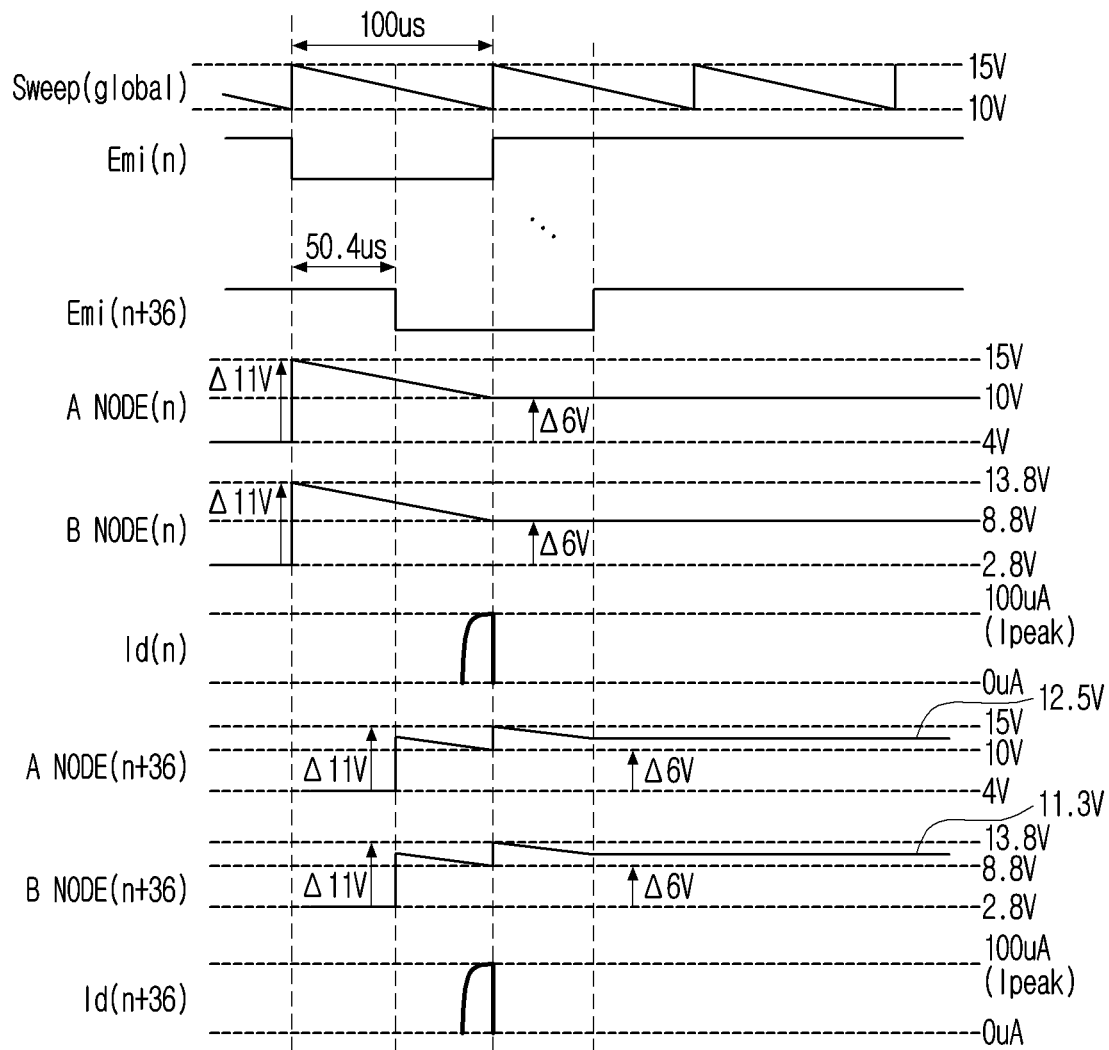
FIG. 14A is a diagram illustrating a PWM operation of a sub-pixel circuit having the configuration shown in FIG. 12A according to an embodiment.
Figure 14B:
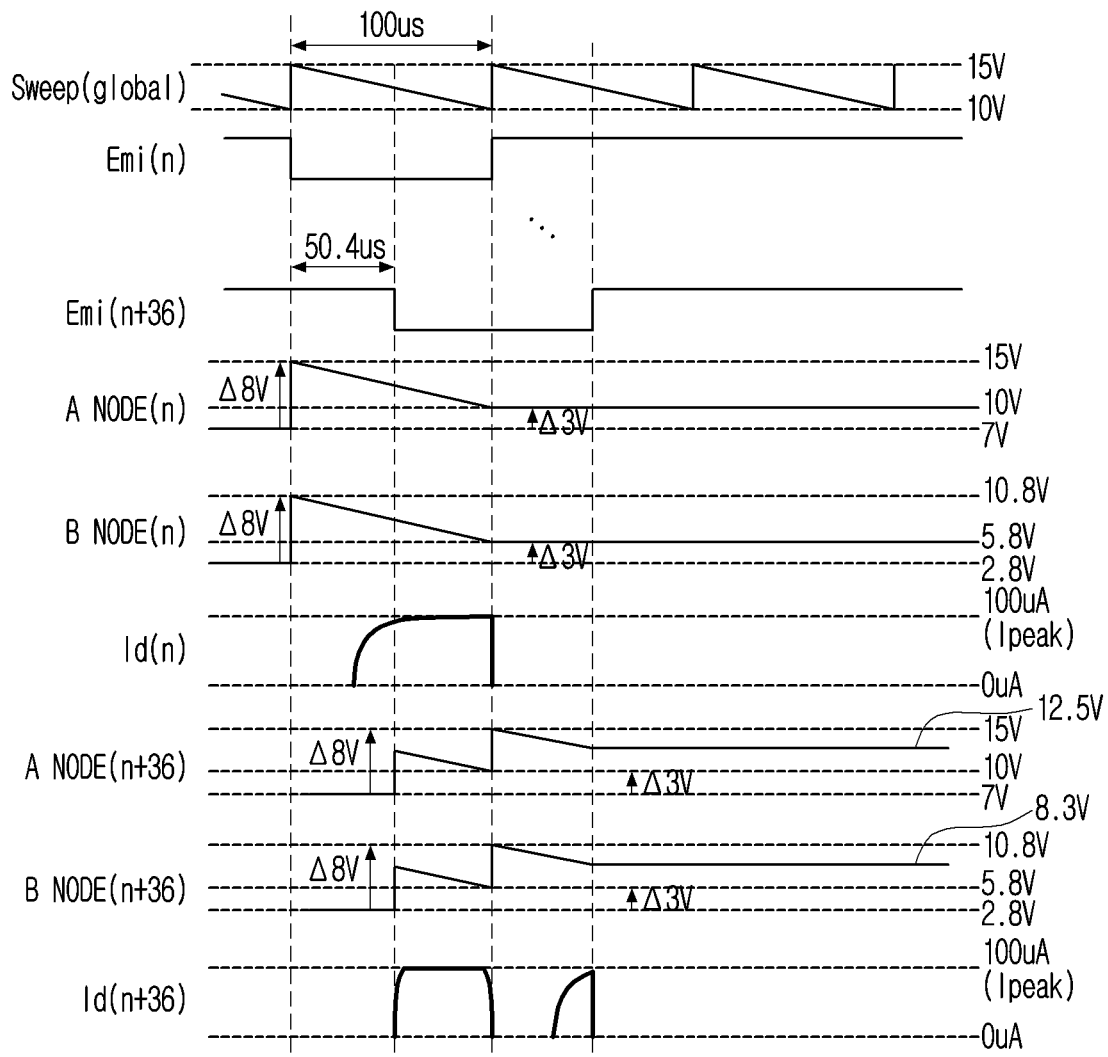
FIG. 14B is a diagram illustrating a PWM operation of a sub-pixel circuit having the configuration shown in FIG. 12A according to an embodiment.
Figure 14C:
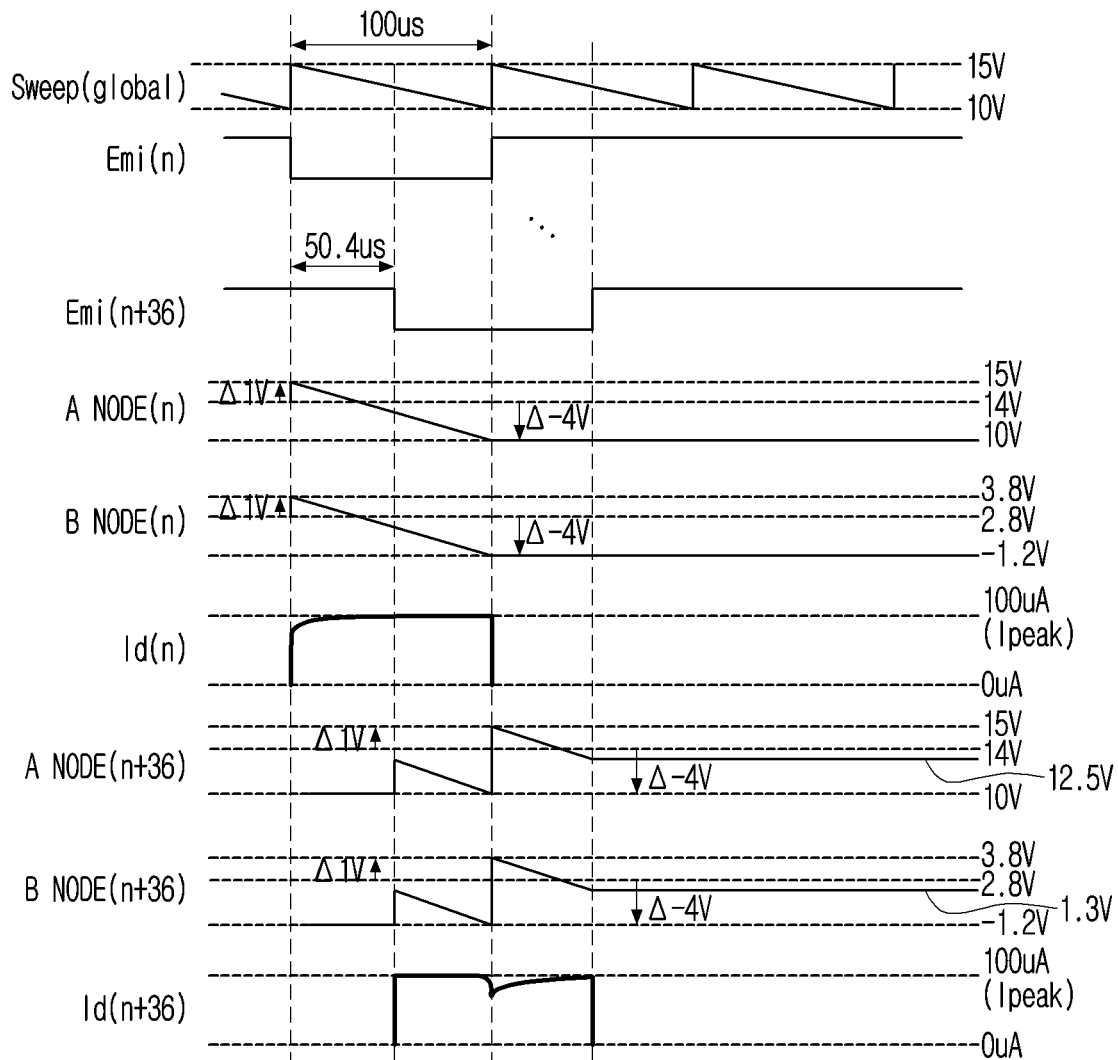
FIG. 14C is a diagram illustrating a PWM operation of a sub-pixel circuit having the configuration shown in FIG. 12A according to an embodiment.

FIGS. 14A to 14C are diagrams illustrating a PWM operation of a sub-pixel circuit having the configuration shown in FIG. 13A.

Referring to FIGS. 14A to 14C, it is assumed that the capacitance value of C3 is substantially greater than the capacitance value of C1. In this example, C3/(C1+C3) has a value close to 1, C1/(C1+C3) has a value near zero, and referring to FIGS. 14A to 14C, it is assumed that C3/(C1+C3) is 1, and C1/(C1+C3) is 0.

Referring to FIGS. 14A to 14C, when the PWM data voltage corresponding to the low gray level is +4[V], the PWM data voltage corresponding to the medium gray level is +7[V], and the PWM data voltage corresponding to the high gray level is +14[V], the PWM data voltage corresponding to each gray scale is not limited thereto.

FIGS. 14A to 14C show changes in the voltage variation of the A node, the voltage change of the B node, and the driving current Id when the PWM data voltage is applied to the sub-pixel circuit 110 included in the $n^{th}$ row line and the (N+1)th row line, respectively.

In the embodiments shown in FIGS. 14A to 14C, the threshold voltages Vth and T13 of the second driving transistor is −2.2[V], the reference voltage Vref is +5[V], and the first driving voltage VDD_PAM is +12[V]. A sweep signal (Sweep(global)) having a shape in which a voltage linearly changes from +15[V] to +10[V] every 100 µs is used as an example. Here, (global) is an expression to indicate that a sweep signal is a global signal that is commonly applied to all row lines.

FIG. 14A shows the case where the PWM data voltage (e.g., +4[V]) corresponding to the low gray level is applied to the sub-pixel circuit 110 included in the $n^{th}$ row line and the (n+36)th row line, respectively.

An operation of the sub-pixel circuit 110 included in the $n^{th}$ row line will be described.

During the programming interval of the data setting section, in the A node(n) of the sub-pixel circuit 110 included in the $n^{th}$ row line is applied with +4[V] (i.e., PWM data voltage) according to the SPWM(n) signal, and +2.8[V] (i.e., Vref−|Vth, T13|) is applied to the B node(n). The actual voltage applied to the B(n) node during the programming period is Vref−(C3/(C1+C3))*|Vth, T13|+(C1/(C1+C3))* (VPWM−Vref) as described in FIG. 13D, but C3/(C1+C3) is 1 and C1/(C1+C3) is 0, so Vref−(C3/(C1+C3))*|Vth, T13|+ (C1/(C1+C3))*(VPWM−Vref) becomes Vref−|Vth, T13|.

When the emission section begins, some of the sweep signal (Sweep (Global)) according to the Emi(n) signal, that is, the sweep voltage (i.e., the voltage changing linearly from +15[V] to +10[V]) is applied to the A node(n).

Because the amount of voltage change at the A node(n) according to the sweep voltage is directly coupled to the B node(n) through the capacitor C1, while the voltage at the A node(n) is changing from +15[V] to +10[V], the voltage at B node(n) changes from +13.8[V] to +8.8[V].

As described above, the second driving transistor T13 is turned on in a time period in which the voltage of the gate terminal B node is lower than the sum VDDPAM+Vth of the voltage VDD_PAM of the source terminal and the threshold voltage Vth of the source terminal.

The second driving transistor T13 is turned on during a time in which the voltage of the B node(n) is lower than +9.8[V], that is, a time period during which the voltage of the B node(n) changes from +9.8[V] to +8.8[V], and the driving current flows through the inorganic light emitting element 120 in the time period during which the second driving transistor T13 is turned on. The Id(n) shows a change in the driving current.

The operation of the sub-pixel circuit 110 included in the N+36$^{th}$ row line is described.

During the programming interval of the data setting section, the A node(n+36) of the sub-pixel circuit 110 included in the n+36th row line is applied with +4[V] (that is, PWM data voltage) according to the SPWM(n+36) signal, and +2.8[V] (i.e., Vref−|Vth, T13|) is applied to the B node(n+36).

When the emission section starts thereafter, a sweep voltage (i.e., linearly changing voltage changing from +12.5 [V] to +10[V] and from +15[V] to +12.5[V]) which is a portion of the sweep signal (global) is applied to the A node(n+36) according to Emi(n+36) signal.

In various embodiments, as described above, the emission section may sequentially proceed in the order of row lines, so that when the emission section is sequentially performed at an interval of 1H time (e.g., 1.4 µs), the Emi(n+36) signal has the same waveform as the Emi(n) signal is delayed by 50.4 µs.

Accordingly, the sweep voltage applied to the A node(n+ 36) of the sub-pixel circuit 110 included in the (n+36)th row line may have a waveform which linearly changes from +12.5[V] to +10[V], and then linearly changes from +15[V] to +12.5[V].

In other words, all the sweep voltages sweep once between +15[V] and +10[V], but the start voltage starting to sweep is variable according to the row line.

Because the voltage variation of the A node(n+36) according to the sweep voltage is coupled to the B node(n+36) as it is through the capacitor C1, the voltage of the B node(n+ 36) varies from +11.3[V] to +8.8[V] while the voltage of the A node(n+36) changes from +12.5[V] to +10[V], and while the voltage of the A node(n+36) changes from +15[V] to +12.5[V], the voltage of the B node(n+36) changes from +13.8[V] to +11.3[V].

In this example, the second driving transistor T13 is turned on in a time period during which the voltage of the B node(n+36) is lower than +9.8[V], that is, a time period during which the voltage of the B node(n+36) varies from +9.8[V] to +8.8[V], and the driving current flows through the inorganic light emitting element 120 in the time period during which the second driving transistor T13 is turned on. The Id(n+36) shows a change in the driving current.

FIG. 14B shows the case where the PWM data voltage (e.g., +7[V]) corresponding to the mid gray level is applied to the sub-pixel circuit 110 included in the $n^{th}$ row line and the (n+36)th row line, respectively.

An operation of the sub-pixel circuit 110 included in the $n^{th}$ row line will be described.

During the data setting section, +7[V] (i.e., a PWM data voltage) is applied to the A node(n) of the sub-pixel circuit 110 included in the $n^{th}$ row line according to the SPWM(n) signal, and +2.8[V] (that is, Vref−|Vth, T13|) is applied to the B node(n).

When the emission section starts thereafter, a sweep voltage (i.e., voltage linearly changes from +15[V] to +10[V]), which is a portion of the sweep signal (sweep (global)) is applied to A node(n) according to Emi(n) signal.

The voltage change of the A node(n) according to the sweep voltage is coupled to the B node(n) as it is through the capacitor (C1), so the voltage of the B node(n) changes from +15[V] to +10[V], while the voltage of the B node(n) changes from +10.8[V] to +5.8[V].

In this example, the second driving transistor T13 is turned on during a time in which the voltage of the B node(n) is lower than +9.8[V], that is, a time period during which the voltage of the B node(n) varies from +9.8[V] to +5.8[V], and the driving current flows through the inorganic light emitting element 120 in the time period during which the second driving transistor T13 is turned on. The Id(n) shows the above.

An operation of the sub-pixel circuit 110 included in the n+36th row line will be described.

During the programming interval among the data setting section, +7[V] (i.e., a PWM data voltage) is applied to the A node(n+36) of the sub-pixel circuit 110 included in the n+36th row line according to the SPWM(n+36) signal, and +2.8[V] (that is, Vref−|Vth|) is applied to the B node(n+36).

When the emission section starts thereafter, a sweep voltage (i.e., voltage linearly changes from +12.5[V] to +10[V], and from +15[V] to +12.5[V]), which is a portion of the sweep signal (sweep (global)) is applied to A node(n+36) according to Emi(n+36) signal.

Because the voltage variation of the A node(n+36) according to the sweep voltage is coupled to the B node(n+36) as it is through the capacitor C1, the voltage of the B node(n+36) varies from +8.3[V] to +5.8[V] while the voltage of the A node(n) changes from +12.5[V] to +10[V], and while the voltage of the A node(n+36) changes from +15[V] to +12.5[V], the voltage of the B node(n+36) changes from +10.8[V] to +8.3[V].

In this example, the second driving transistor T13 is turned on during a time in which the voltage of the B node(n+36) is lower than +9.8[V], that is, a time period during which the voltage of the B node(n+36) varies from +8.3[V] to +5.8[V] and from +9.8[V] to 8.3[V], and the driving current flows through the inorganic light emitting element 120 in the time period during which the second driving transistor T13 is turned on. The Id(n+36) shows the above.

Referring to FIG. 14B, the waveforms of the Id(n) and the Id(n+36) are different for the same PWM data voltage (+7[V]). However, because the integration value of the driving current, that is, the brightness of the inorganic light emitting element 120, is the same, it is not problematic.

FIG. 14C shows the case where the PWM data voltage (e.g., +14[V]) corresponding to the high gray scale is applied to the sub-pixel circuit 110 included in the $n^{th}$ row line and the (n+36)th row line, respectively.

An operation of the sub-pixel circuit 110 included in the $n^{th}$ row line will be described.

During the programming interval of the data setting section, +14[V] (i.e., a PWM data voltage) is applied to the A node(n) of the sub-pixel circuit 110 included in the $n^{th}$ row line according to the SPWM(n) signal, and +2.8[V] (that is, Vref−|Vth|) is applied to the B node(n).

When the emission section starts thereafter, a sweep voltage (i.e., voltage linearly changes from +15[V] to +10[V]) which is a portion of the sweep signal (sweep (global)) is applied to A node(n) according to Emi(n) signal.

Because the voltage variation of the A node(n) according to the sweep voltage is coupled to the B node(n) as it is through the capacitor C1, the voltage of the B node(n) varies from +3.8[V] to −1.2[V] while the voltage of the A node(n) changes from +15[V] to +10[V].

In this example, the second driving transistor T13 is turned on during a time in which the voltage of the B node(n) is lower than +9.8[V], that is, a time period during which the voltage of the B node(n) varies from +3.8[V] to −1.2[V], and the driving current flows through the inorganic light emitting element 120 in the time period during which the second driving transistor T13 is turned on. The Id(n) shows the above.

An operation of the sub-pixel circuit 110 included in the n+36th row line will be described.

During the programming interval of the data setting section, +14[V] (i.e., a PWM data voltage) is applied to the A node(n+36) of the sub-pixel circuit 110 included in the n+36th row line according to the SPWM(n+36) signal, and +2.8[V](that is, Vref−|Vth|) is applied to the B node(n+36).

When the emission section starts thereafter, a sweep voltage (i.e., voltage linearly changes from +12.5[V] to +10[V], and from +15[V] to +12.5[V]) which is a portion of the sweep signal (sweep (global)) is applied to A node(n+36) according to Emi(n+36) signal.

Because the voltage variation of the A node(n+36) according to the sweep voltage is coupled to the B node(n+36) as it is through the capacitor C1, the voltage of the B node(n+36) varies from +1.3[V] to −1.2[V] while the voltage of the A node(n+36) changes from +12.5[V] to +10[V], and while the voltage of the A node(n+36) changes from +15[V] to +12.5[V], the voltage of the B node(n)+36 changes from +3.8[V] to +1.3[V].

As described above, the second driving transistor T13 is turned on during a time in which the voltage of the B node(n+36) is lower than +9.8[V], that is, a time period during which the voltage of the B node(n+36) varies from +1.3[V] to −1.2[V] and from +3.8[V] to +1.3[V], and the driving current flows through the inorganic light emitting element 120 in the time period during which the second driving transistor T13 is turned on. The Id(n+36) shows the above.

Referring to FIG. 14C, the waveforms of the Id(n) and the Id(n+36) are slightly different for the same PWM data voltage (+14[V]). However, because the integration value of the driving current, that is, the brightness of the inorganic light emitting element 120, is the same, it is not problematic.

Hereinafter, another embodiment will be described with reference to FIGS. 15A to 17C. As described above with reference to FIGS. 9A to 14C, the threshold voltage of the second driving transistor may be obtained while the second driving transistor is operated as the source follower, and the obtained threshold voltage is applied to the gate terminal of the second driving transistor, so that the threshold voltage deviation of the second driving transistors is compensated.

However, the method for compensating for the threshold voltage deviation of the second driving transistors is not limited thereto. Referring to FIGS. 15A to 17C, an embodiment in which the PWM data voltage is corrected to compensate for the threshold voltage deviation of the second driving transistors will be described.

In the embodiment described with reference to FIGS. 15A to 17C, the number of transistors constituting the sub-pixel circuit is reduced compared to the above-described embodiment, and thus the embodiment may be applied to a higher-resolution display panel.

In the embodiment to be described with reference to FIGS. 15A to 17C, the threshold voltage deviation of the first driving transistors is compensated for in the same manner as in the embodiment described above with reference to FIGS. 9A to 14C.

Figure 15A:
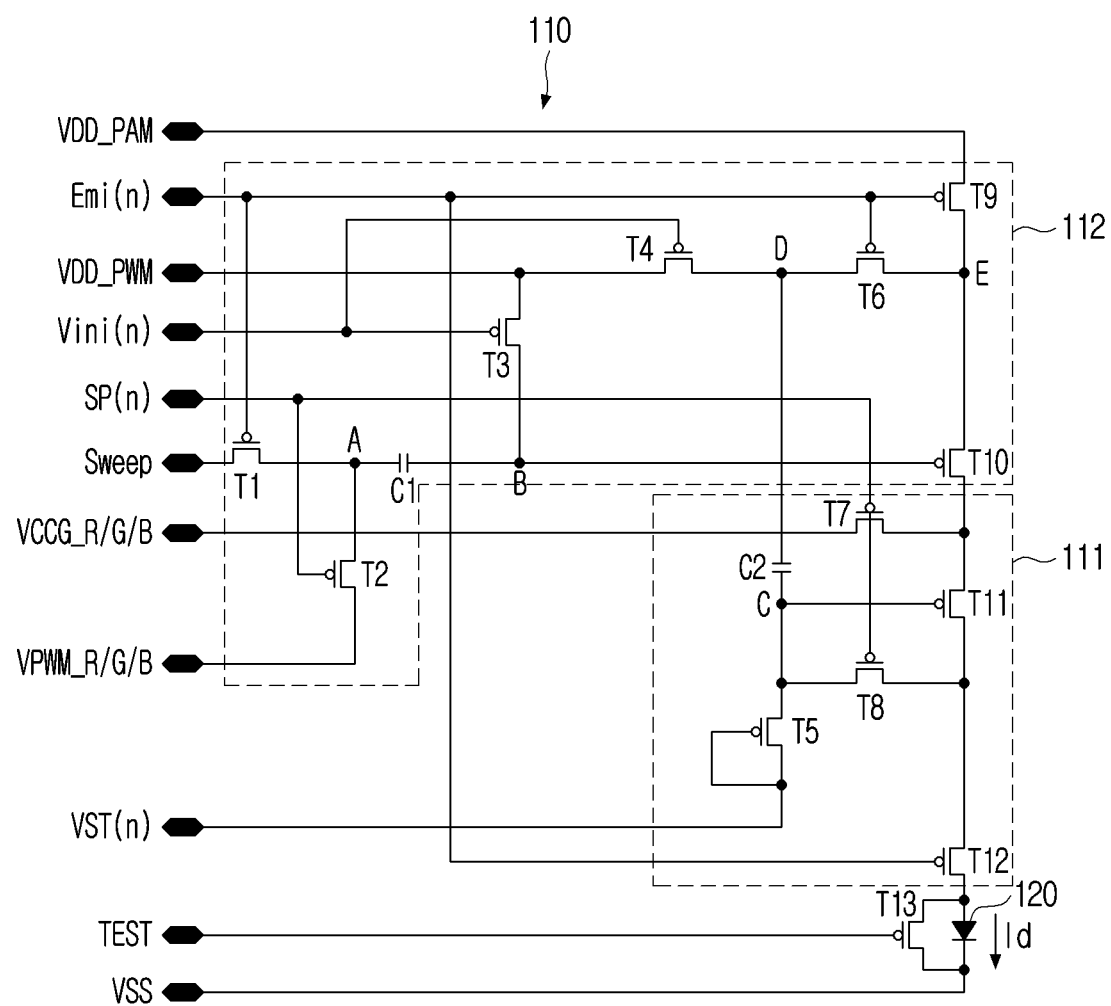
FIG. 15A is a detailed circuit diagram of a sub-pixel circuit according to another embodiment.

FIG. 15A is a detailed circuit diagram of a sub-pixel circuit according to another embodiment. Referring to FIG. 15A, the sub-pixel circuit 110 includes the constant current generator circuit 111, the PWM circuit 112, and the transistor T1. The constant current generator circuit 111 includes the first driving transistor T11, and the PWM circuit 112 includes the second driving transistor T10, respectively.

Because the transistor T13 has the same connection structure and function as the transistor T16 of FIG. 9A, a duplicate description thereof is omitted. The TEST signal is also the same, and a duplicate description thereof is omitted.

The descriptions of the VDD_PAM, VDD_PWM, and VSS are also the same as the description of FIG. 9A, and a duplicate description will be omitted.

Unlike the sub-pixel circuit 110 of FIG. 9A, the reference voltage Vref is not applied to the sub-pixel circuit 110 of FIG. 15A. In the embodiment of FIG. 15A, the threshold voltage of the second drive transistor need not be obtained while the sub-pixel circuit 110 is operating.

Vini(n) represents the scan signal applied to the sub-pixel circuit 110 in order to apply the second driving voltage VDD_PWM to the B node and the D node in the data setting section. The second driving voltage VDD_PWM applied to the B node serves to maintain the second driving transistor T10 in an off-state during the data setting section, and the second driving voltage VDD_PWM applied to the D node becomes a reference potential when the constant current generator data voltage is set.

The VST(n) represents the scan signal applied to the sub-pixel circuit 110 in order to initialize the voltage of the C node in the data setting section. When the voltage of the C node is initialized according to the VST(n) signal, the first driving transistor T11 is turned on.

The SP(n) represents a scan signal applied to the sub-pixel circuit 110 in order to apply a constant current generator data voltage (VCCG_R/G/B) to the C node in the data setting section and to apply the PWM data voltage (VPWM_R/G/B) to the A node. At this time, the PWM data voltage VPWM_R/G/B may be a voltage in which the compensation value according to the threshold voltage deviation of the second driving transistors is reflected. The contents of the compensation value will be described later in the description of the VPWM_R/G/B signal.

Unlike the sub-pixel circuit 110 of FIG. 9A, the Vcomp(n) signal is not applied to the sub-pixel circuit 110 of FIG. 15A.

In the embodiment of FIG. 15A, the threshold voltage of the second driving transistor is not required to be applied to the B node during operation of the sub-pixel circuit 110.

The Emi(n) refers to an emission signal applied to the sub-pixel circuit 110 to apply the first driving voltage VDD_PAM to the E node and the D node in the emission section, apply the sweep voltage to the A node and turn on the transistor T12.

In the above gate signals (scan signal and emission signal), n represents the $n^{th}$ row line. As described above, the driver 500 drives the display panel 110 for each row line (or scan line or gate line), and each of Vini(n), VST(n), SP(n), and Emi(n) may be equally applied to the sub-pixel circuits 110 included in the $n^{th}$ row line.

The Sweep represents a sweep signal. The details of the sweep signal are as described with reference to FIG. 9A and a duplicate description will be omitted.

The VPWM_R/G/B denotes the PWM data voltage applied to the sub-pixel circuit 110. The PWM data voltage may be applied from a data driver. According to an embodiment, the PWM data voltages for each of the R, G, and B sub-pixels constituting one pixel may be time division multiplexed to be applied from the data driver. As described above, the time division multiplexed PWM data voltages may be applied to the corresponding sub-pixels through a demultiplexer circuit.

The sub-pixel circuit 110 shown in FIG. 15A shows a sub-pixel circuit 110 corresponding to one of R, G, and B sub-pixels (e.g., R sub-pixels). Accordingly, in the sub-pixel circuit 110 of FIG. 15A, only the PWM data voltage for the R sub-pixel among the time division multiplexed PWM data voltages may be selected and applied through a demultiplexer circuit.

In the embodiment described with reference to FIGS. 9A to 14C, the PWM data voltage may be a voltage corresponding to the gray level value of the sub-pixel, whereas the PWM data voltage described with reference to FIGS. 15A to 17C may be a voltage corresponding to a value reflecting the compensation value to the gray level value of the sub-pixel.

The compensation value is a value to compensate for the brightness deviation of the sub-pixels according to the threshold voltage deviation of the second driving transistors and may be calculated for each sub-pixel while manufacturing the display panel 100 and stored in a memory. Accordingly, the TCON may read the compensation value stored in the memory, reflect the compensation value to the image data, and transmit the image data in which the compensation value is reflected to the data driver, so that the PWM data voltage in which the compensation value is reflected may be applied to the sub-pixel circuit 110.

More specifically, for example, in a manufacturing operation, a test image (for example, an image having the same gray level value) may be displayed on the display panel 100, and the display panel 100 may be captured by the image capturing apparatus. When the test image is displayed, the compensation value has not yet been reflected, and a stain or brightness difference may be present for each pixel due to the deviation of the threshold voltage of the second driving transistors in the captured image. Therefore, the compensation value for each sub-pixel may be calculated by calculating a value to be reflected to the gray-scale value of each sub-pixel such that a stain or brightness deviation is not perceived in the captured image.

The VCCG_R/G/B represents a constant current generator data voltage applied to the sub-pixel circuit 110. Because the description of the constant current generator data voltage is the same as that described above in FIG. 9A, a duplicate description will be omitted. Further, because the problem and solution due to IR drop occurring when the driving current flows in the emission section is also the same as described above in FIG. 9A, a duplicate description will be omitted.

Figure 15B:
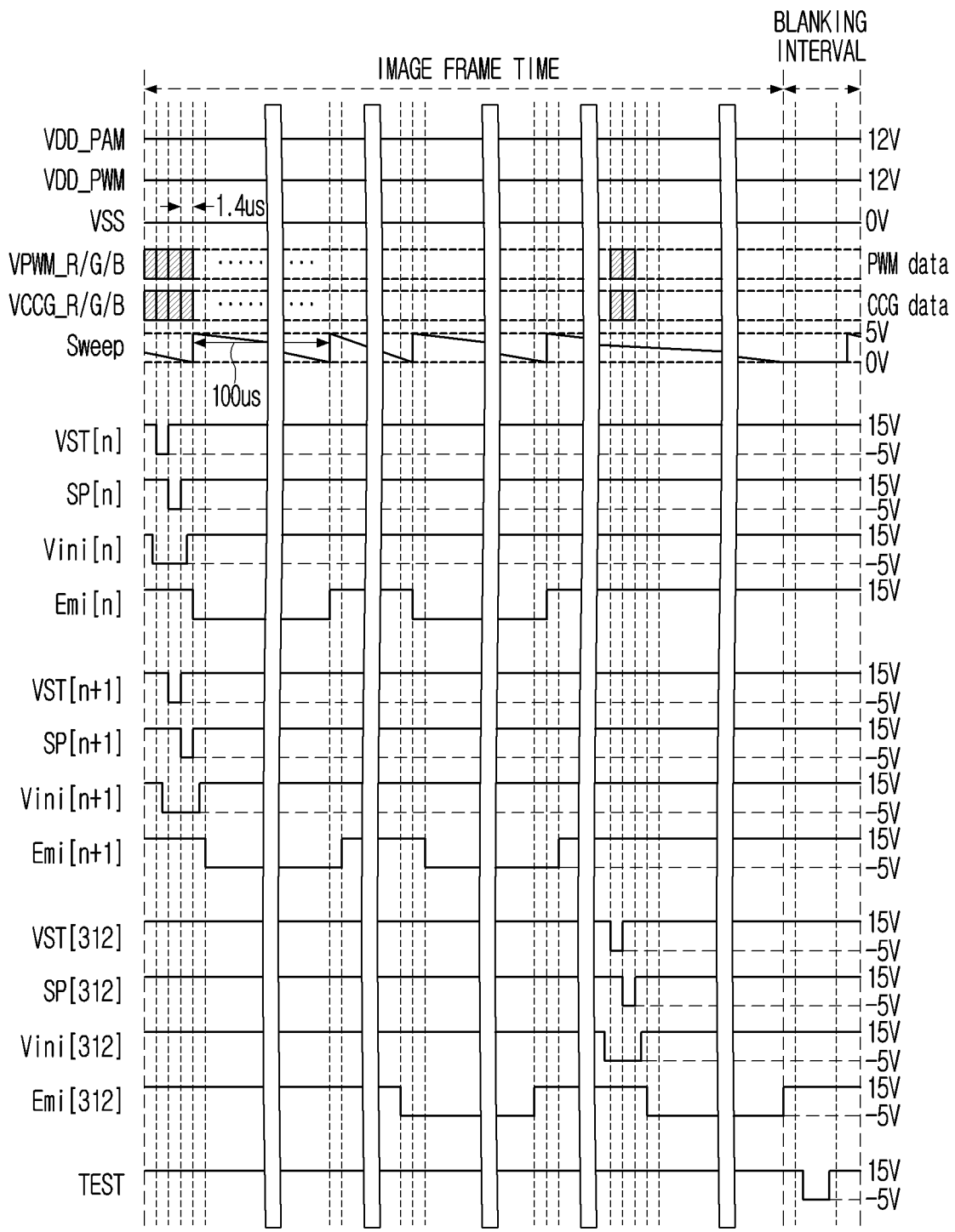
FIG. 15B is a timing diagram of various signals for driving a display panel including the sub-pixel circuit of FIG. 15A during an image frame time and a blanking interval according to an embodiment.

FIG. 15B is a timing diagram of various signals for driving the display panel 100 including the sub-pixel circuit 110 of FIG. 15A during an image frame time and a blanking interval. Referring to FIG. 15B, the display panel 100 includes 312 row lines.

As described above, according to an embodiment, for one image frame, one data setting section and a plurality of emission sections may proceed every row line. For this purpose, referring to FIG. 15B, during the image frame time, the scan signals VST, SP, and Vini are applied once for each row line, and an emission signal Emi for the light emitting operation may be applied multiple times for each row line.

The time interval in which the low level of the VST, the SP, and the Vini signal is applied becomes the data setting section of the corresponding row line, and the time interval in which the low-level of the Emi signal is applied becomes the emission section of the corresponding row line.

As described above, according to an embodiment, the data setting section and the emission section may proceed in the order of row lines. Referring to FIG. 15B, each of the gate signals VST, SP, Vini, and Emi may be sequentially applied in the order of row lines. For example, a low-level VST(n) signal and a low-level VST(n+1) signal are applied with a difference of time of 1H (1.4 μs in the example of FIG. 15B). This is the same for the remaining gate signals SP signal (SP(n) and SP(n+1), Vini signals (Vini(n) and Vini(n+1)), Emi signals (Emi(n) and Emi(n+1)).

Referring to FIG. 15B, a low-level TEST signal is applied in the blanking interval. Because the TEST signal is a global signal, the signal is equally applied to all sub-pixel circuits 110 of the display panel 100, and accordingly, charges remaining on all the inorganic light-emitting elements 120 of the display panel 100 may be discharged.

Hereinafter, a detailed operation of the sub-pixel circuit 110 of FIG. 15A will be described with reference to FIGS. 16A to 16C.

Figure 16A:
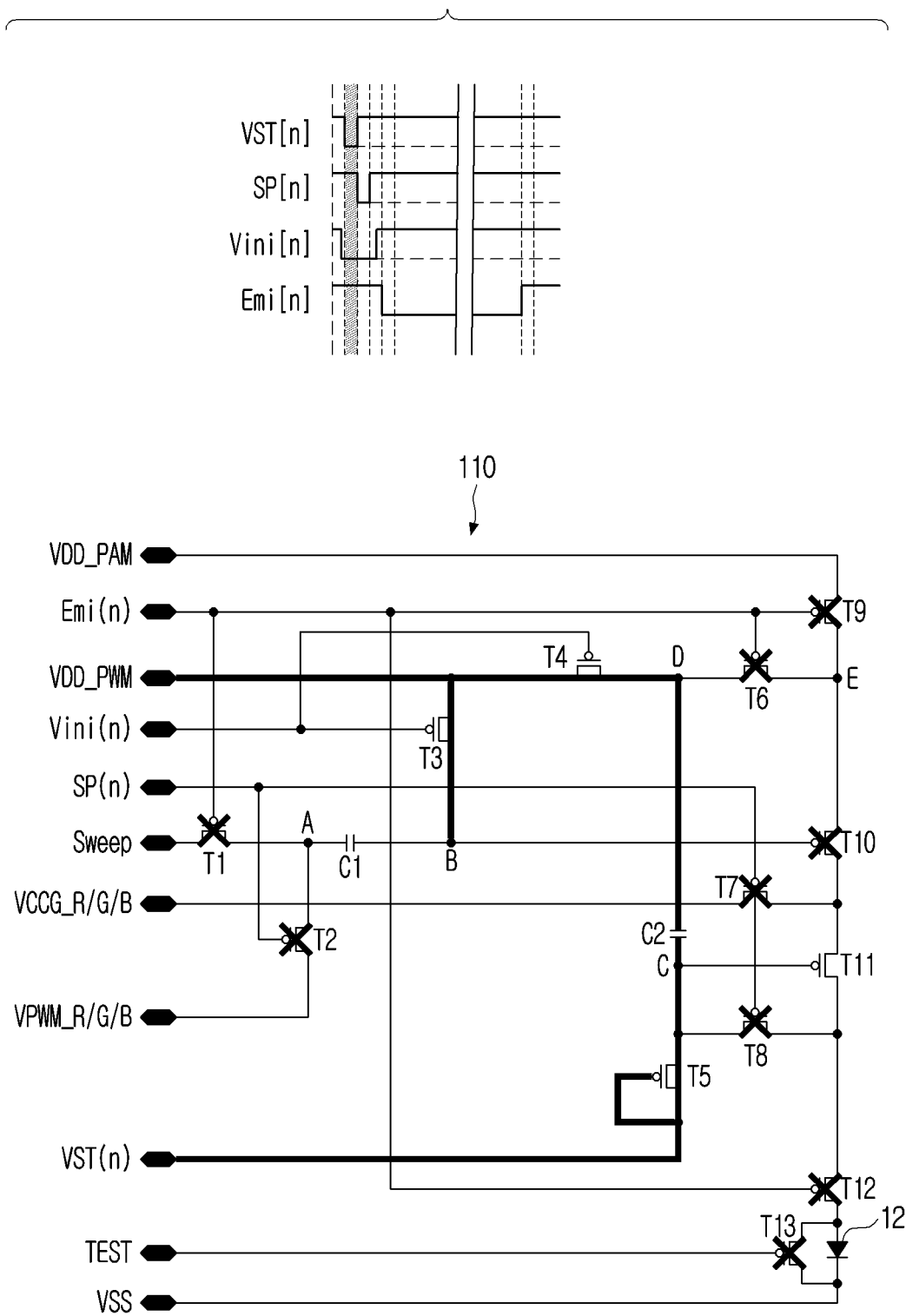
FIG. 16A illustrates the operation of the sub-pixel circuit according to Vini(n) and VST(n) among the scan signals according to an embodiment.

FIG. 16A illustrates the operation of the sub-pixel circuit 110 according to Vini(n) and VST(n) among the scan signals.

When the data setting section starts, the driver 500 may first apply a second driving voltage VDD_PWM (e.g., +12[V]) to the gate terminal (B node) of the second driving transistor T10 and one end (D node) of the capacitor C2.

The driver 500 may apply Vini(n) signals as shown in FIG. 16A. Referring to FIG. 16A, the VDD_PWM signal may be applied to the B node and the D node through the turned-on transistor T3 and the transistor T4 in accordance with the Vini(n) signal. At this time, the second driving voltage VDD_PWM applied to the D node become a reference potential when a constant current generator data voltage is set to the C node.

When the second driving voltage VDD_PWM is applied to the D node through the Vini(n) signal, the driver 500 may initialize the voltage of the gate terminal C node of the first driving transistor T11.

The driver 500 may apply a low voltage (e.g., −5[V]) to the sub-pixel circuit 110 through the VST(n) signal as shown in FIG. 16A. When the voltage of the C node is initialized to a low voltage (e.g., −5[V]), the first driving transistor T11 may be in a turned-on state (e.g., a channel in which a channel is formed).

Figure 16B:
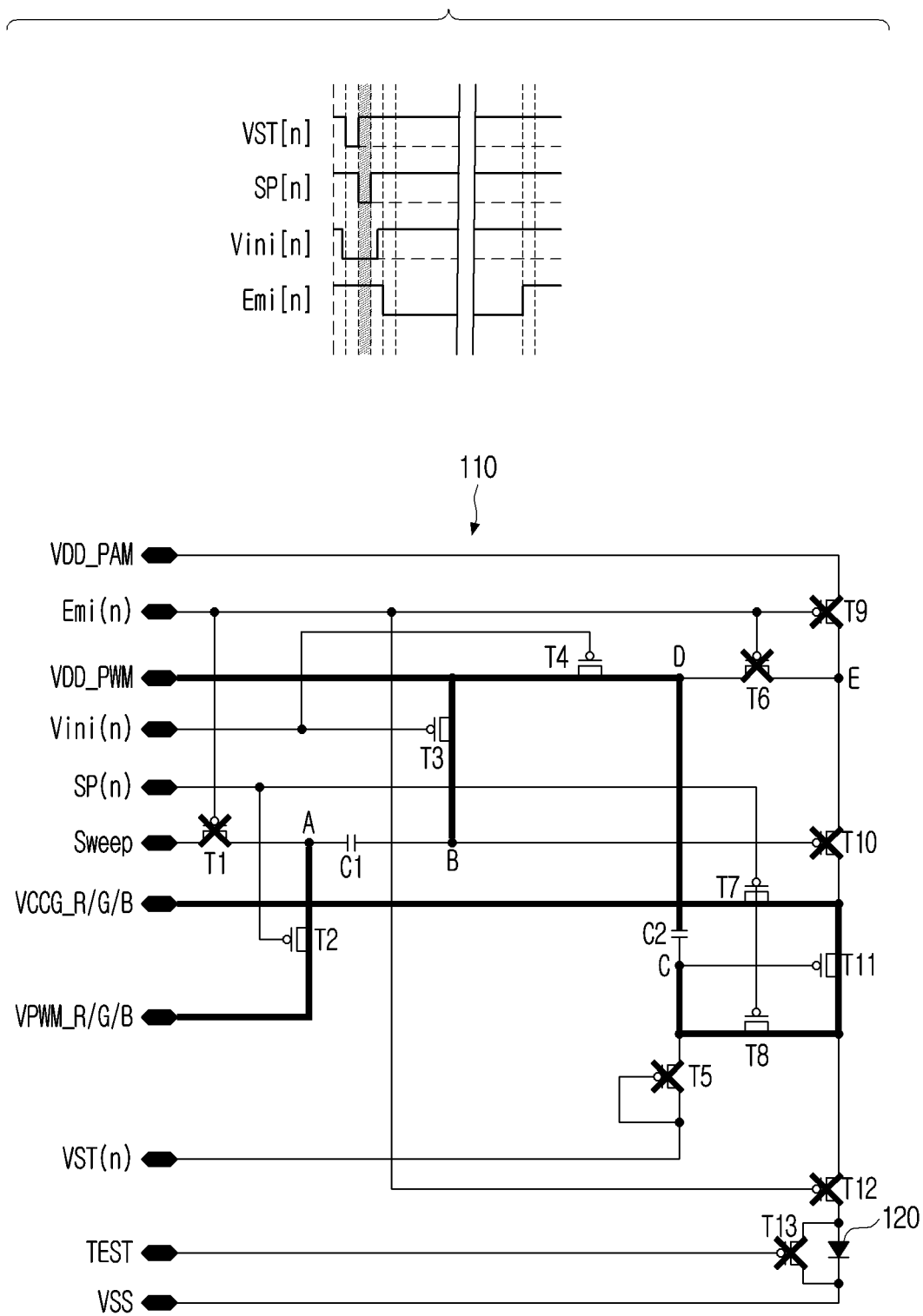
FIG. 16B is a diagram for explaining the operation of the sub-pixel circuit according to SP(n) among the scan signals according to an embodiment.

FIG. 16B is a diagram for explaining the operation of the sub-pixel circuit 110 according to SP(n) among the scan signals.

The SP(n) signal is a scan signal for applying an image data voltage to the sub-pixel circuit 110. In the data setting section, when a low voltage (e.g., −5[V]) is applied to the sub-pixel circuit 110 through the SP(n) signal line, the transistor T2, the transistor T7, and the transistor T8 are turned on.

When the transistor T2 is turned on, the PWM data voltage (VPWM_R/G/B) may be applied to one end A node of the capacitor C1 through the turned-on transistor T2. At this time, the PWM data voltage is a voltage in which the compensation value is reflected.

When the transistor T7 and the transistor T8 are turned on, the constant current generator data voltage (VCCG_R/G/B) may be applied to the C node through the turned-on transistor T7, the first driving transistor T11 turned on based on the VST(n) signal, and the turned-on transistor T8.

At this time, in the C node, the constant current generator data voltage (VCCG_R/G/B) is not applied (or set) as it is, but a constant current generator in which the threshold voltage Vth of the first driving transistor T11 is compensated (that is, a voltage (VCCG_R/G/B+Vth) obtained by adding the threshold voltage of the first driving transistor T11 to the constant current generator data voltage) is applied.

A detailed operation of applying VCCG_R/G/B+Vth to C node is the same as that described with reference to FIG. 10B, and thus a redundant description will be omitted.

Figure 16C:
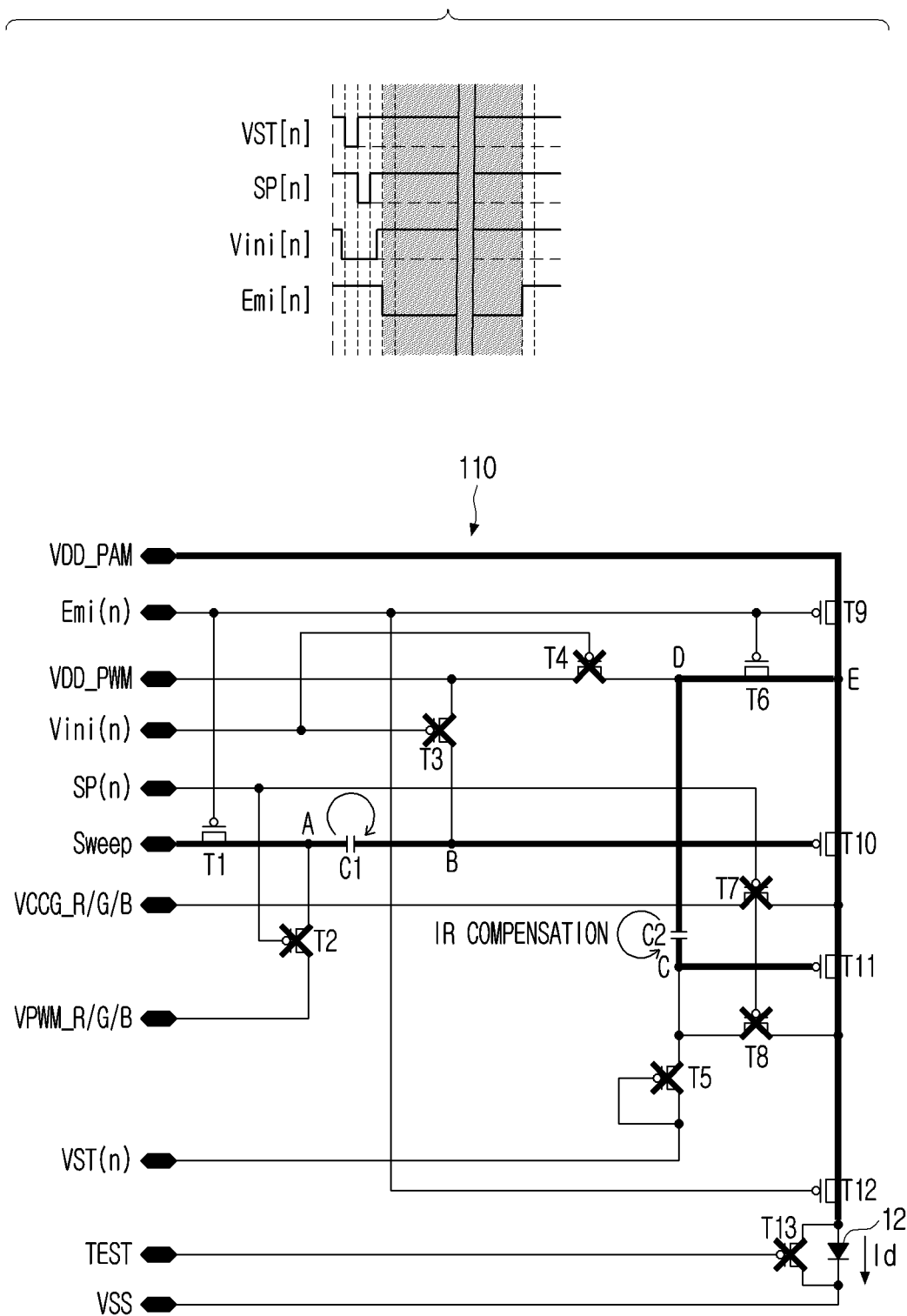
FIG. 16C is a diagram illustrating the operation of the sub-pixel circuit according to the emission signal Emi(n) according to an embodiment.

FIG. 16C is a diagram illustrating the operation of the sub-pixel circuit 110 according to the emission signal Emi (n).

As shown in FIG. 16C, when a low voltage (e.g., −5[V]) is applied through the Emi(n) signal line, the transistor T6, the transistor T9, the transistor T12, and the transistor T1 are turned on.

When the second driving transistor T10 and the first driving transistor T11 are turned on while the transistor T9 and the transistor T12 are turned on, the first driving voltage VDD_PAM is applied to the anode terminal of the inorganic light-emitting element 120. Accordingly, a potential difference exceeding a forward voltage Vf is generated at both ends of the inorganic light emitting element 120, and a driving current (i.e., a constant current) flows through the inorganic light emitting element 120 to make the inorganic light emitting element 120 emit light.

The first driving transistor T11 is turned on together as the second driving transistor T10 is turned on.

When the transistor T9 and the transistor T12 are turned on according to the Emi(n) signal, a voltage (e.g., +0.8[V]) which is obtained by summing of a constant current generator data voltage (e.g., +3[V]) and a threshold voltage (e.g., −2.2[V]) of the first driving transistor T14 is applied to the C node, as described above in FIG. 16B. Therefore, as the second driving transistor T10 is turned on, the first driving transistor T11 is also turned on when the first driving voltage VDD_PAM (e.g., +12[V]) is applied to the source terminal of the first driving transistor T11.

As a result, whether the first driving voltage VDD_PAM is to be applied to the anode terminal of the inorganic light emitting element 120 may be determined according to the on/off operation of the second driving transistor T10.

Because the second driving transistor T10 is the PMOS TFT, the second driving transistor T10 is turned on when a voltage less than a threshold voltage Vth is applied between the gate terminal and the source terminal. The second driving transistor T10 is turned on when the voltage of the gate terminal is less than the sum of the voltage of the source terminal E node and the threshold voltage Vth. For example, when the first driving voltage VDD_PAM applied to the source terminal (E node) is +12[V] and the threshold voltage Vth of the second driving transistor is −2.2[V], the second driving transistor T10 may be turned on when a voltage of less than +9.8[V] is applied to the gate terminal (B node).

In this regard, during the emission section, the gate terminal (B node) of the second driving transistor T10 is applied with Vsweep-VPWM_R/G/B+VDD_PWM.

Referring to FIG. 16C, when the transistor T1 is turned on according to the Emi(n) signal, a portion of the sweep signal (Sweep) is applied to the A node while the transistor T1 is turned on. At this time, some of the sweep signal applied to the A node becomes a sweep voltage (Vsweep). When a sweep voltage Vsweep is applied to a node A, a PWM data voltage VPWM_R/G/B is coupled to the B node via a capacitor C1 along with the sweep voltage Vsweep. Specifically, during the data setting section as described above, VPWM_R/G/B is applied to the A node, and VDD_PWM is applied to the B node. In this state, when the sweep voltage Vsweep is applied to the A node, the voltage of the A node is changed from the VPWM_R/G/B to the Vsweep. Because the voltage difference between both ends of the capacitor C1 must be constantly maintained, the voltage of the B node is also changed as much as the voltage variation of the A node (i.e., the Vsweep-VPWM_R/G/B). Accordingly, the voltage of the B node becomes Vsweep-VPWM_R/G/B+VDD_PWM.

At this time, the PWM data voltage VPWM_R/G/B and the second driving voltage VDD_PWM have a fixed value, whereas the sweep voltage Vsweep has a value that varies linearly between +5[V] and +0[V].

Accordingly, the voltage of the B node during the emission section varies according to a change in the sweep voltage Vsweep, and the second driving transistor T10 is turned on in a time period during which the voltage Vsweep-VPWM_R/G/B+VDD_PWM of the B node (that is, gate terminal) is lower than the voltage (VDD_PAM+Vth) which is the sum of the voltage VDD_PAM of the source terminal (E node) and the threshold voltage Vth.

As described above, because the change rate of the sweep voltage according to time is constant, the time period during which the second driving transistor T10 is turned on in the emission section varies according to the voltage of the B node at the time when the emission section starts. At this time, the voltage of the B node at the time point at which the emission section starts varies according to the VPWM_R/G/B value (i.e., the PWM data voltage value), so that the gray scale of the image may be expressed through the PWM data voltage.

The PWM operation of the sub-pixel circuit 110 as described above will be described in more detail with reference to FIGS. 17A to 17C.

In the emission section, the driving voltage applied to the constant current generator circuit 111 is changed from the second driving voltage VDD_PWM to the first driving voltage VDD_PAM.

As described above, in the data setting section, the second driving voltage VDD_PWM is applied to the D node based on the Vini(n) signal. However, referring to FIG. 16D, the first driving voltage VDD_PAM is applied to one end (D node) of the capacitor C2 through the transistor T9 and the transistor T6, which are turned on according to the Emi(n) signal.

In the emission section, a voltage drop may occur in the first driving voltage VDD_PAM due to the IR drop generated while the driving current flows to the inorganic light emitting element 120. However, even if a voltage drop occurs in the first driving voltage VDD_PAM, the voltage difference between both ends (D node and C node) of the capacitor C2 is maintained as set in the data setting section, and thus, image quality is not affected.

According to embodiments, a constant current generator data voltage may be set to the constant current generator circuit 111 regardless of the voltage drop of the first driving voltage VDD_PAM by applying a constant current generator data voltage to the C node based on the second driving voltage VDD_PWM without a voltage drop, separately from the first driving voltage VDD_PAM.

In addition, in the emission section, the first driving voltage VDD_PAM in which a voltage drop may occur is used, but as described above, the voltage difference across the capacitor C2 is maintained regardless of the voltage drop of the first driving voltage VDD_PAM, and therefore, the constant current generator circuit 111 may operate accurately according to the voltage set in the data setting section.

Figure 17A:
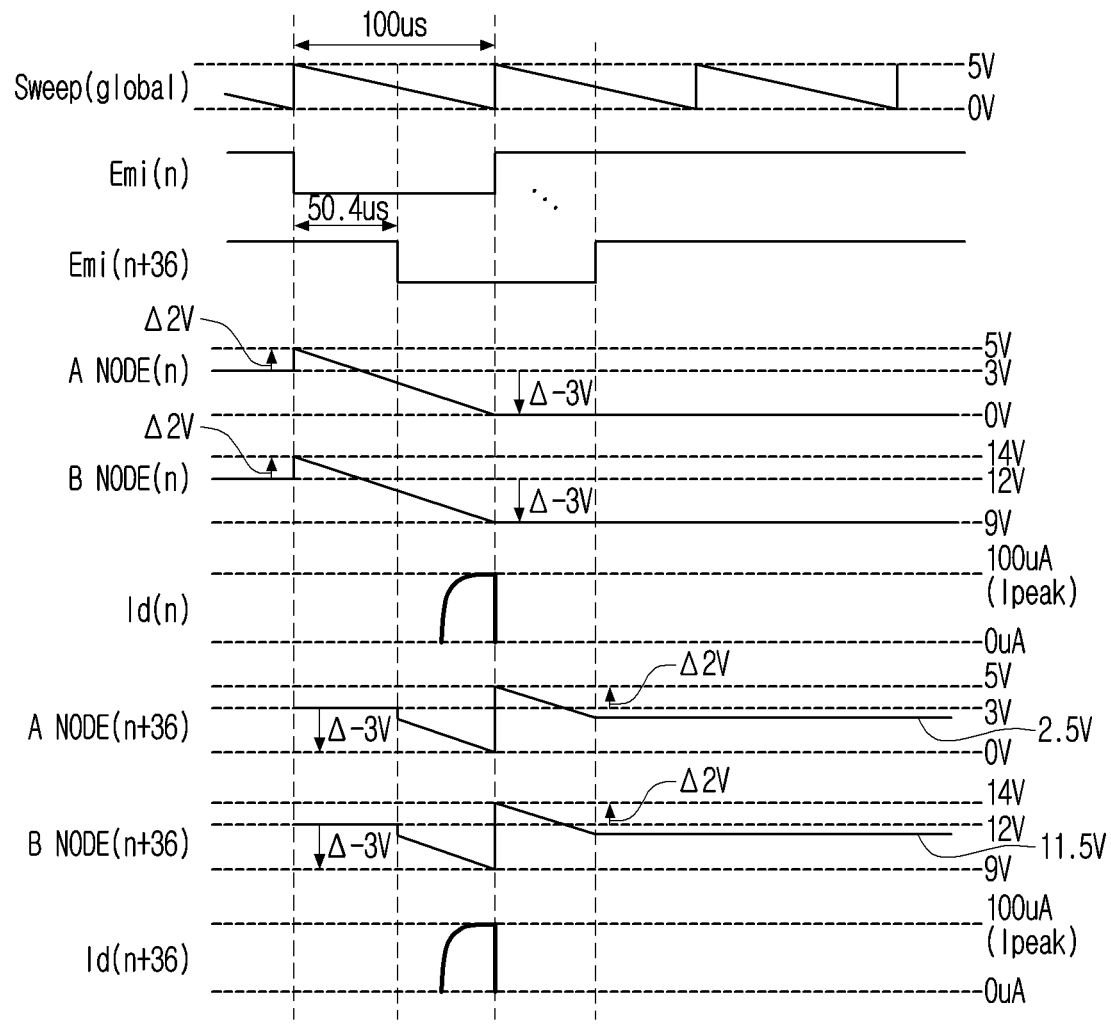
FIG. 17A is a diagram illustrating a PWM operation of a sub-pixel circuit having the configuration shown in FIG. 15A according to an embodiment.
Figure 17B:
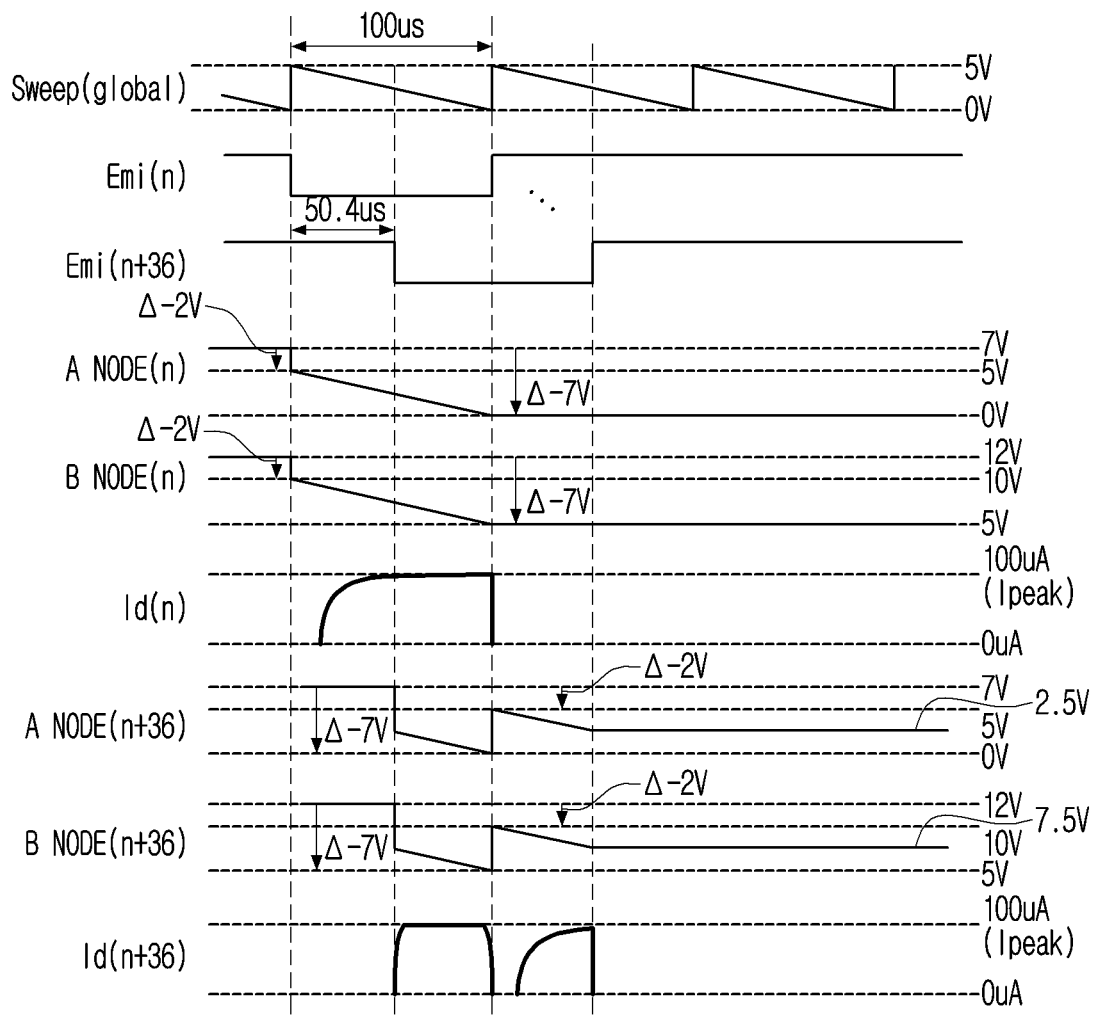
FIG. 17B is a diagram illustrating a PWM operation of a sub-pixel circuit having the configuration shown in FIG. 15A according to an embodiment.
Figure 17C:
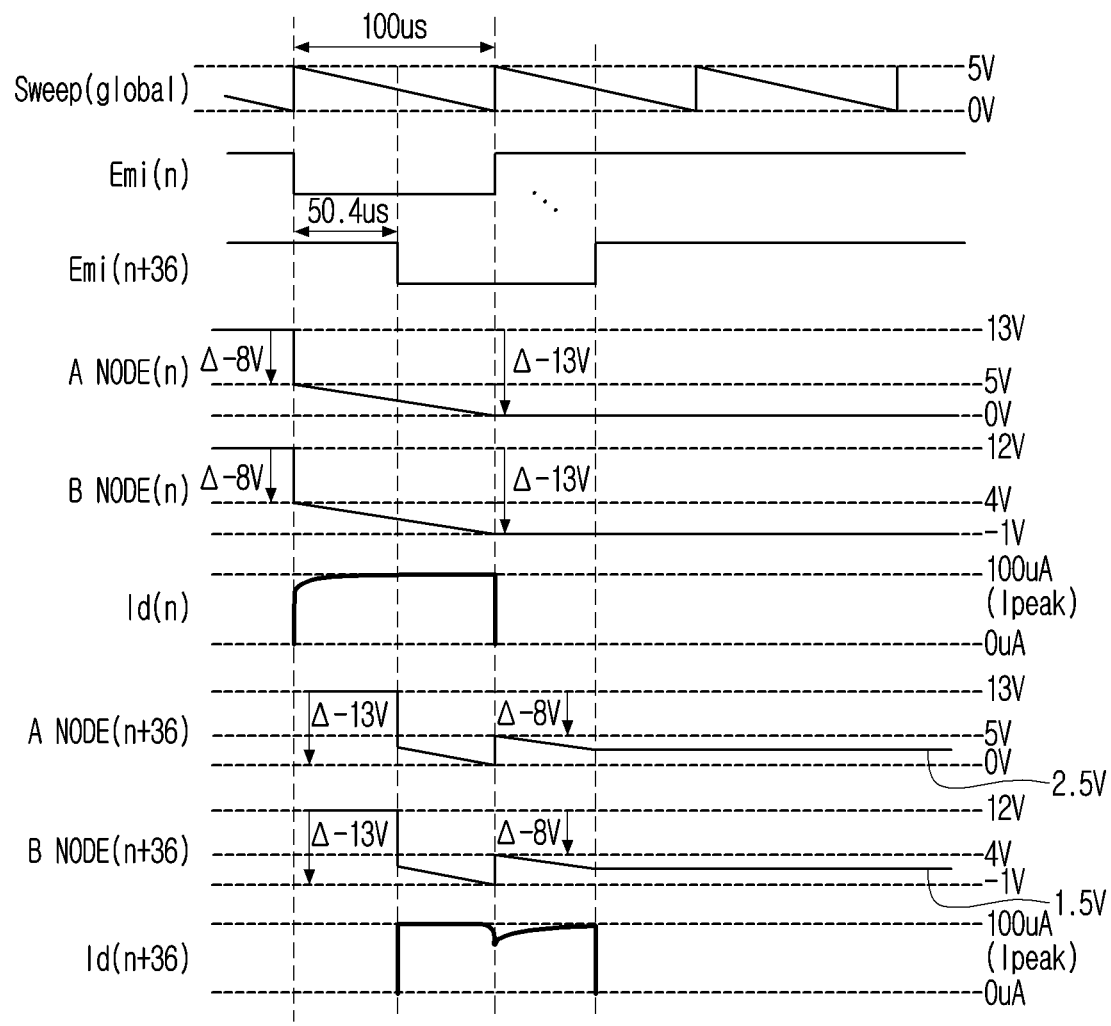
FIG. 17C is a diagram illustrating a PWM operation of a sub-pixel circuit having the configuration shown in FIG. 15A according to an embodiment.

FIGS. 17A to 17C are views illustrating a PWM operation of a sub-pixel circuit having the configuration shown in FIG. 15A. Referring to FIGS. 17A to 17C, the PWM data voltage corresponding to the low gray level is +3[V], the PWM data voltage corresponding to the medium gray level is +7[V], and the PWM data voltage corresponding to the high gray level is +13[V], but the PWM data voltage corresponding to each gray scale is not limited thereto. Each of the PWM data voltage values (+3[V], +7[V], +13[V]) is a value in which the above-described compensation value is reflected.

FIGS. 17A to 17C show changes in the voltage of the A node, the voltage of the B node, and the driving current Id when the PWM data voltage is applied to the sub-pixel circuit 110 included in the $n^{th}$ row line and the (n+36)th row line, respectively.

In the embodiments shown in FIGS. 17A to 17C, the threshold voltage Vth of the second driving transistor is −2.2[V], and the first driving voltage VDD_PAM is +12[V]. In addition, a sweep signal (Sweep(global)) having a shape in which a voltage linearly changes from +5[V] to +0[V] every 100 μs is used as an example. Here, (global) is an expression which indicates that the sweep signal is a global signal that is commonly applied to all row lines.

FIG. 17A illustrates an example where the PWM data voltage (e.g., +3[V]) corresponding to the low gray scale is applied to the sub-pixel circuit 110 included in the $n^{th}$ row line and the $(n+36)^{th}$ row line, respectively.

An operation of the sub-pixel circuit 110 included in the $n^{th}$ row line will be described.

During the data setting section, +3[V] (i.e., a PWM data voltage) is applied to the A node(n) of the sub-pixel circuit 110 included in the nth row line according to the SP(n) signal, and +12[V] (i.e., second driving voltage VDD_PWM) is applied to the B node(n) according to the Vini(n) signal.

After the emission section starts, a part of the sweep signal (sweep (global), that is, sweep voltage (i.e., a voltage that varies linearly from +5[V] to +0[V]) is applied to the A node(n) as illustrated.

Because the voltage variation of the A node(n) according to the sweep voltage is coupled to the B node(n) through the capacitor C1, the voltage of the B node(n) changes from +14[V] to +9[V] while the voltage of the A node(n) changes from +5[V] to +0[V].

As described above, the second driving transistor T10 is turned on in a time period during which the voltage of the gate terminal B node is lower than the sum VDD_PAM+Vth of the voltage VDD_PAM of the source terminal and the threshold voltage Vth.

The second driving transistor T10 is turned on in a time in which the voltage of the B node(n) is lower than +9.8[V] (that is, a time period during which the voltage of the B node(n) changes from +9.8[V] to +9[V]), and the driving current flows through the inorganic light emitting element 120 in the time period during which the second driving transistor T10 is turned on. The Id(n) shows a change in the driving current.

An operation of the sub-pixel circuit 110 included in the n+36th row line will be described.

During the data setting section, +3[V] (i.e., a PWM data voltage) is applied to the A node(n+36) of the sub-pixel circuit 110 included in the (n+36)th row line according to the SP(n+36) signal, and +12[V](that is, the second driving voltage VDD_PWM) is applied to the B node(n+36) according to the Vini(n+36) signal.

When the emission section starts thereafter, a sweep voltage (i.e., voltage linearly changes from +2.5[V] to +0[V], and from +5[V] to +2.5[V]), which is a portion of the sweep signal (sweep (global)) is applied to A node(n+36) according to Emi(n+36) signal.

More specifically, as described above, in various embodiments, the emission section is sequentially performed in the order of row lines, so that when the emission section is sequentially performed at an interval of 1H time (e.g., 1.4 µs), the Emi(n+36) signal has the same waveform as the Emi(n) signal is delayed by 50.4 µs.

Accordingly, the sweep voltage applied to the A node(n+36) of the sub-pixel circuit 110 included in the (n+36)th row line may have a waveform which linearly changes from +2.5[V] to +0[V], and then linearly changes from +5[V] to +2.5[V].

In other words, all the sweep voltages sweep once between +5[V] and +0[V], but the start voltage starting to sweep is variable according to the row line.

Because the voltage variation of the A node(n)+36 according to the sweep voltage is coupled to the B node(n)+36 as it is through the capacitor C1, the voltage of the B node(n+36) varies from +11.5[V] to +9[V] while the voltage of the A node(n+36) changes from +2.5[V] to +0[V], and while the voltage of the A node(n+36) changes from +5[V] to +2.5[V], the voltage of the B node(n)+36 changes from +14[V] to +11.5[V].

As described above, the second driving transistor T10 is turned on in a time period in which the voltage of the B node(n+36) is lower than +9.8[V], that is, a time period during which the voltage of the B node(n+36) varies from +9.8[V] to +9[V], and the driving current flows through the inorganic light emitting element 120 in the time period during which the second driving transistor T10 is turned on. The Id(n+36) shows a change in the driving current.

FIG. 17B shows the case where the PWM data voltage (e.g., +7[V]) corresponding to the mid gray level is applied to the sub-pixel circuit 110 included in the nth row line and the (n+36)th row line, respectively.

An operation of the sub-pixel circuit 110 included in the nth row line will be described.

During the data setting section, +7[V] (i.e., a PWM data voltage) is applied to the A node(n) of the sub-pixel circuit 110 included in the nth row line according to the SP(n) signal, and +12 [V](that is, the second driving voltage VDD_PWM) is applied to the B node(n) according to the Vini(n) signal.

When the emission section starts thereafter, a sweep voltage (i.e., voltage linearly changes from +5[V] to +0[V]), which is a portion of the sweep signal (sweep (global)) is applied to A node(n) according to Emi(n) signal.

Because the voltage variation of the A node(n) according to the sweep voltage is coupled to the B node(n) as it is through the capacitor C1, the voltage of the B node(n) varies from +10[V] to +5[V] while the voltage of the A node(n) changes from +5[V] to +0[V].

In this example, the second driving transistor T10 is turned on in a time in which the voltage of the B node(n) is lower than +9.8[V], that is, a time period during which the voltage of the B node(n) varies from +9.8[V] to +5[V], and the driving current flows through the inorganic light emitting element 120 in the time interval in which the second driving transistor T10 is turned on. The Id(n) shows the above.

An operation of the sub-pixel circuit 110 included in the n+36th row line will be described.

During the data setting section, +7[V] (i.e., a PWM data voltage) is applied to the A node(n+36) of the sub-pixel circuit 110 included in the n+36th row line according to the SP(n+36) signal, and +12[V](that is, the second driving voltage VDD_PWM) is applied to the B node(n+36) according to the Vini(n+36) signal.

When the emission section starts thereafter, a sweep voltage (i.e., voltage linearly changes from +2.5[V] to +0[V], and from +5[V] to +2.5[V]), which is a portion of the sweep signal (sweep (global)) is applied to A node(n+36) according to Emi(n+36) signal.

Because the voltage variation of the A node(n+36) according to the sweep voltage is coupled to the B node(n+36) as it is through the capacitor C1, the voltage of the B node(n+36) varies from +7.5[V] to +5[V] while the voltage of the A node(n) changes from +2.5[V] to +0[V], and while the voltage of the A node(n+36) changes from +5[V] to +2.5[V], the voltage of the B node(n)+36 changes from +10[V] to +7.5[V].

In this example, the second driving transistor T10 is turned on in a time in which the voltage of the B node(n+36) is lower than +9.8[V], that is, a time period during which the voltage of the B node(n+36) varies from +7.5[V] to +5[V] and from +9.8[V] to 7.5[V], and the driving current flows through the inorganic light emitting element 120 in the time period during which the second driving transistor T10 is turned on. The Id(n+36) shows the above.

Referring to FIG. 17B, the waveforms of the Id(n) and the Id(n+36) are different for the same PWM data voltage (+7[V]). However, because the integration value of the driving current, that is, the brightness of the inorganic light emitting element 120, is the same, it is not problematic.

FIG. 17C shows the case where the PWM data voltage (e.g., +13[V]) corresponding to the high gray scale is applied to the sub-pixel circuit 110 included in the nth row line and the (n+36)th row line, respectively.

An operation of the sub-pixel circuit 110 included in the nth row line will be described.

During the programming interval of the data setting section, +13[V] (i.e., a PWM data voltage) is applied to the A node(n) of the sub-pixel circuit 110 included in the nth row line according to the SP(n) signal, and +12[V] (that is, the second driving voltage VDD_PWM) is applied to the B node(n) according to the Vini(n) signal.

When the emission section starts thereafter, a sweep voltage (i.e., voltage linearly changes from +5[V] to +0[V]) which is a portion of the sweep signal (sweep (global)) is applied to A node(n) according to Emi(n) signal.

Because the voltage variation of the A node(n) according to the sweep voltage is coupled to the B node(n) as it is through the capacitor C1, the voltage of the B node(n) varies from +4[V] to −1[V] while the voltage of the A node(n) changes from +5[V] to 0[V].

In this example, the second driving transistor T10 is turned on in a time in which the voltage of the B node(n) is lower than +9.8[V], that is, a time period during which the voltage of the B node(n) varies from +4[V] to −1[V], and the driving current flows through the inorganic light emitting element 120 in the time period during which the second driving transistor T10 is turned on. The Id(n) shows the change in the driving current.

An operation of the sub-pixel circuit 110 included in the n+36$^{th}$ row line will be described.

During the programming interval of the data setting section, +13[V] (i.e., a PWM data voltage) is applied to the A node(n+36) of the sub-pixel circuit 110 included in the n+36$^{th}$ row line according to the SP(n+36) signal, and +12[V](that is, the second driving voltage VDD_PWM) is applied to the B node(n+36) according to Vini(n+36) signal.

When the emission section starts thereafter, a sweep voltage (i.e., voltage linearly changes from +2.5[V] to +0[V], and from +5[V] to +2.5[V]) which is a portion of the sweep signal (sweep (global)) is applied to A node(n+36) according to Emi(n+36) signal.

Because the voltage variation of the A node(n+36) according to the sweep voltage is coupled to the B node(n+36) as it is through the capacitor C1, the voltage of the B node(n+36) varies from +1.5[V] to −1[V] while the voltage of the A node(n+36) changes from +2.5[V] to 0[V], and while the voltage of the A node(n+36) changes from +5[V] to +2.5[V], the voltage of the B node(n)+36 changes from +4[V] to +1.5[V].

As described above, the second driving transistor T10 is turned on in a time period during which the voltage of the B node(n+36) is lower than +9.8[V], that is, a time period during which the voltage of the B node(n+36) varies from +1.5[V] to −1[V] and from +4[V] to +1.5[V], and the driving current flows through the inorganic light emitting element 120 in the time period during which the second driving transistor T10 is turned on. The Id(n+36) shows the change in driving current.

Referring to FIG. 17C, the waveforms of the Id(n) and the Id(n+36) are slightly different for the same PWM data voltage (+13[V]). However, because the integration value of the driving current, that is, the brightness of the inorganic light emitting element 120, is the same, it is not problematic.

Hereinafter, a method for driving a modular display panel according to an embodiment will be described.

Figure 18:
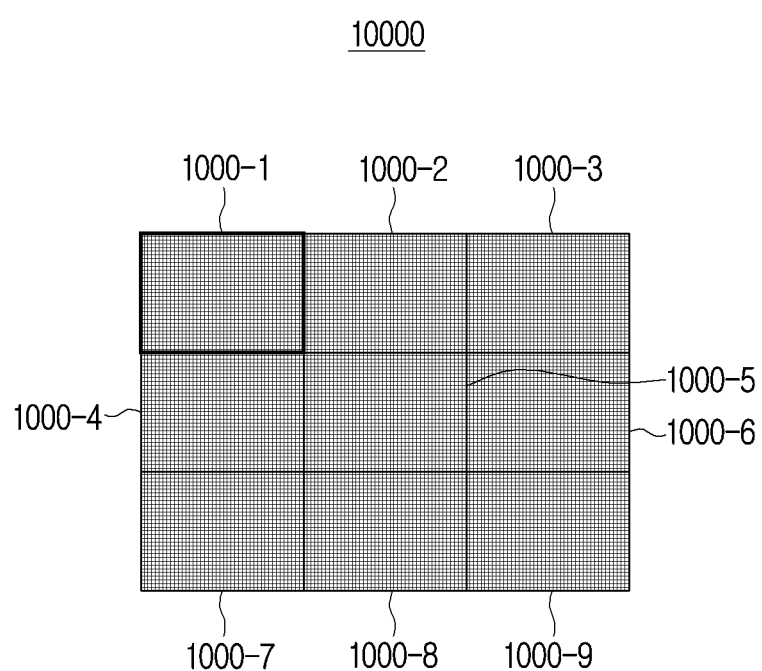
FIG. 18 is a schematic illustration of a configuration of a display apparatus according to an embodiment.

FIG. 18 is a schematic diagram illustrating a configuration of a display apparatus according to an embodiment. Referring to FIG. 18, a display apparatus 10000 may include nine display modules 1000-1 to 1000-9. The display apparatus 10000 may also include a TCON.

The display modules 1000-1 to 1000-9 may be assembled or arranged in a matrix form, as shown, to constitute one modular display panel. Although FIG. 18 illustrates that the display apparatus 10000 includes nine display modules, a display apparatus having different sizes or different resolutions may be implemented by combining different numbers of display modules.

The configuration and driving method of each of the display modules 1000-1 to 1000-9 may correspond to the description provided above with reference to FIGS. 4 through 17C. As described above, each of the display modules 1000-1 to 1000-9 may be driven in a progressive driving manner.

For example, when displaying an image frame on a modular display panel, each of the display modules 1000-1 to 1000-9 may be driven in a driving manner as shown in FIG. 6A, and may be driven as shown in FIG. 6B.

In the case of the display module driving method as shown in FIG. 6A, because the data setting section for one image frame is performed during one image frame time, the data setting section of each display module should be simultaneously performed when one image frame is displayed on the modular display panel.

As described above, the modular display panel driving method in which the data setting section of each display module constituting the modular display panel is simultaneously performed is referred to as a "simultaneous scan method."

In the case of the display module driving method as shown in FIG. 6B, because the data setting section for one image frame may proceed for a much shorter time than one image frame time, when displaying one image frame on the modular display panel, the data setting section of each display module may be continuously performed following the progress order of the data setting section of the display module disposed adjacently above or below the corresponding display module.

As described above, the driving method of the modular display panel in which the data setting section of each display module constituting the modular display panel continuously proceeds following the progress order of the data setting section of the display module disposed adjacently above or below the corresponding display module may be referred to as a "high speed continuous scan method" Here, "high speed" indicates that a data setting section is performed at a higher speed than that of the driving method shown in FIG. 6A.

Figure 19A:
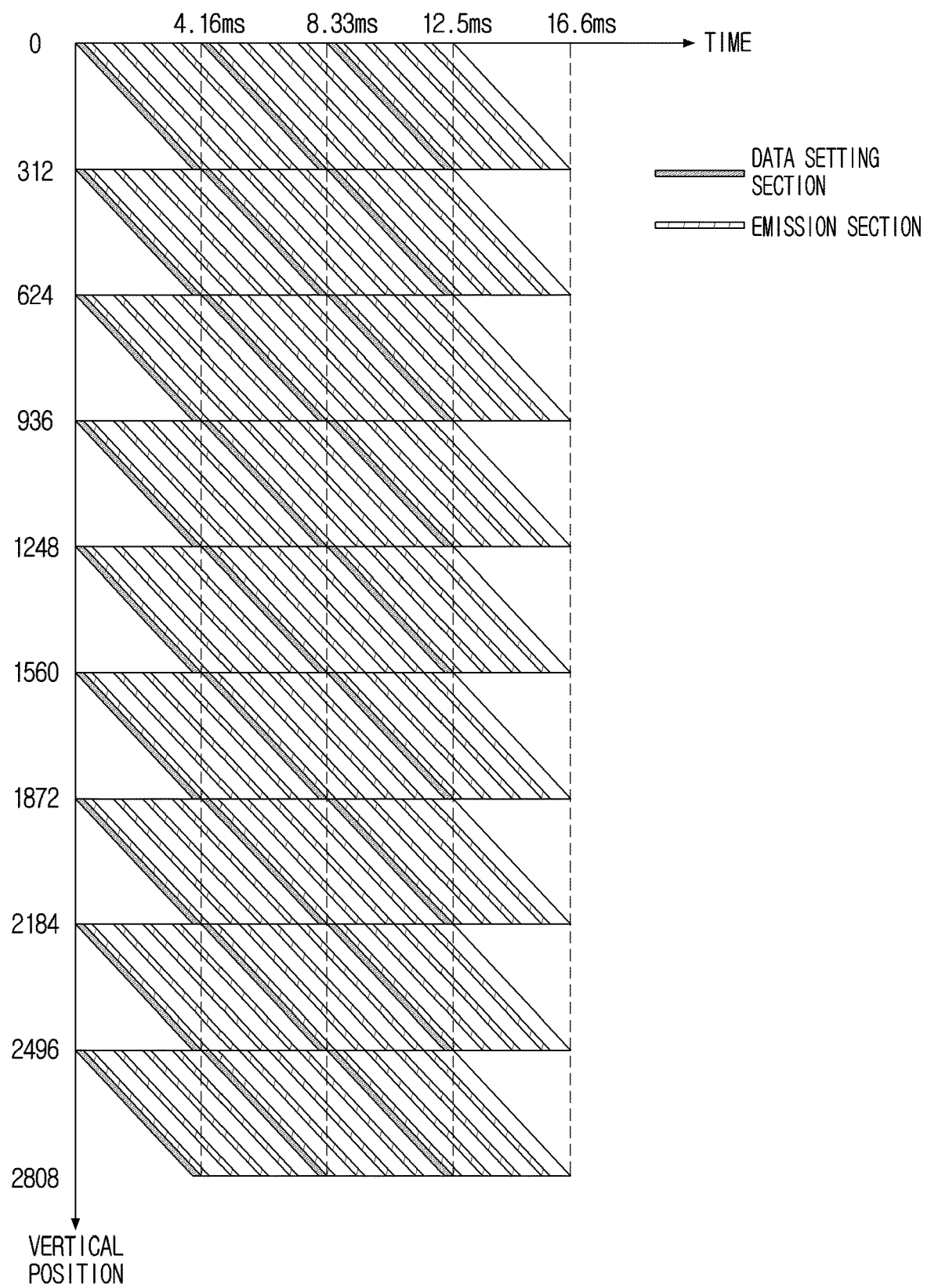
FIG. 19A illustrates a manner in which a data setting section and an emission section proceed when the modular display panel is driven in a simultaneous scan manner according to an embodiment.
Figure 19B:
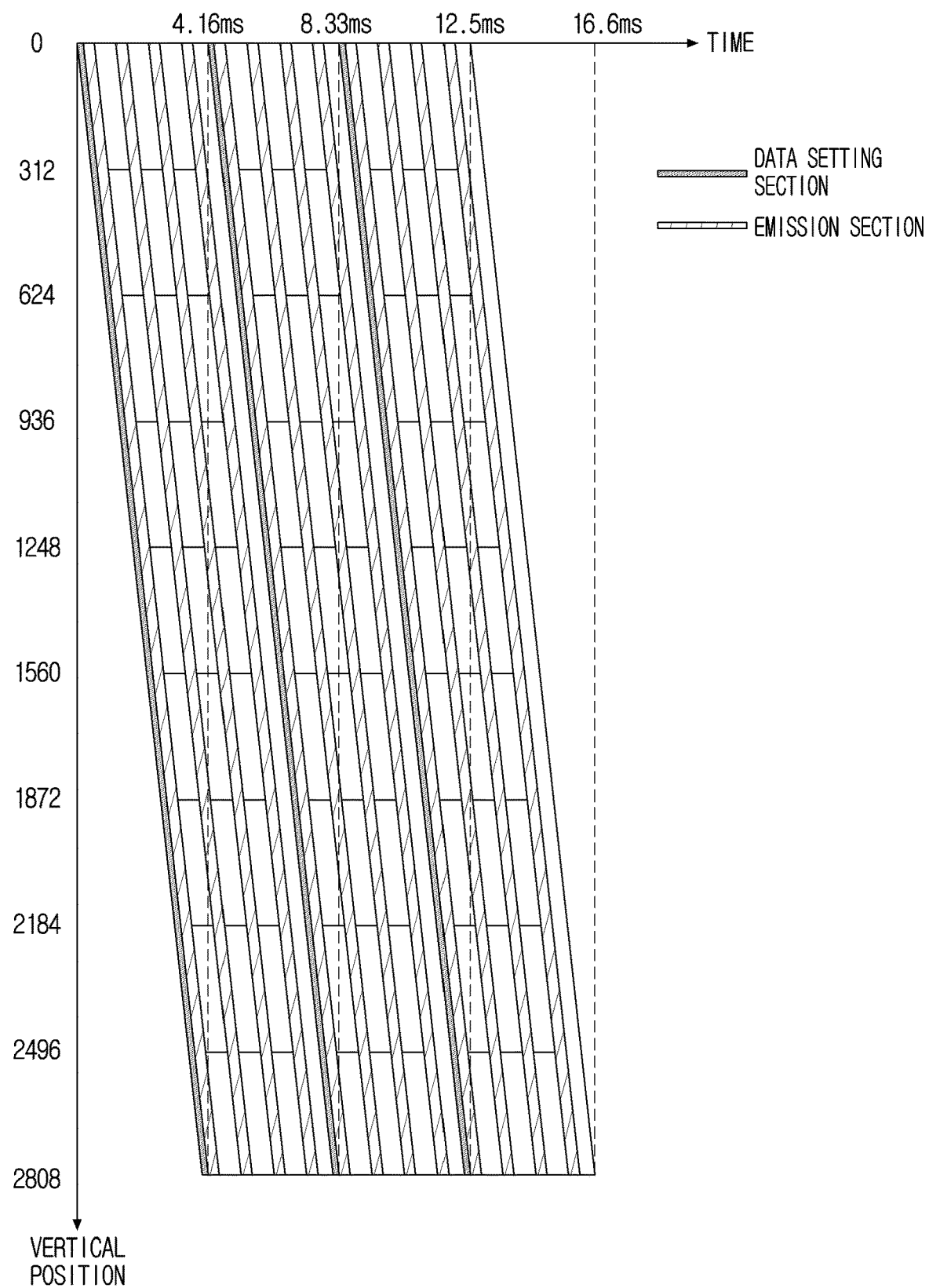
FIG. 19B illustrates a manner in which a data setting section and an emission section proceed when the modular display panel is driven in a high speed continuous scan mode according to an embodiment.

FIGS. 19A and 19B illustrate methods in which a data setting section and an emission section are performed when the modular display panel is driven in a simultaneous scan mode and a high speed continuous scan method, respectively.

In FIGS. 19A and 19B, for example, nine display modules included in the same column line among the modular display panels in which 81 display modules are arranged in a 9×9 matrix form, are shown to display three consecutive image frames during a four image frame time. In FIG. 19A and FIG. 19B, for one image frame, one data setting section and four emission sections are performed for each row line. In FIGS. 19A and 19B, the size of each display module constituting the modular display panel is 12.7 inches, the resolution is 550*312, and the scan rate is 240 Hz.

As the resolution of each display module is 550*312, each display module includes 312 row lines. Thus, the 9×9 modular display panel includes 2808 row lines, and the vertical position axes of FIGS. 16A and 16B represent the same. Because the scan rate of each display module is 240 Hz, one image frame time is about 4.16 ms. Thus, referring to the time axis of FIGS. 19A and 19B, it may be seen that the driving scheme of the display modules is shown for four image frame times.

In the case of the simultaneous scan method, as described above, the data setting section of each display module proceeds simultaneously. Referring to FIG. 19A, with respect to one image frame, the data setting section for the first row line of each of the nine display modules proceeds simultaneously, and the data setting section for the second row line of each of the nine display modules proceeds at the same time, and in this way, the data setting section proceeds simultaneously up to the $312^{th}$ row line of each of the nine display modules.

As described above, because the emission section proceeds in a predefined method after the data setting section (that is, the first emission section of the plurality of emission sections is temporally continuous with the data setting section, and each of the emission sections is processed at a predetermined time interval), each emission section of each display module also simultaneously proceeds in the simultaneous scan mode.

When the modular display panel is driven by the simultaneous scan method as described above, the emission section discontinuously proceeds at the boundary of the upper and lower display modules adjacent to each other, for the same image frame.

More specifically, referring to FIG. 19A, when the display modules from the display module disposed uppermost to the display module disposed lowermost are referred to as first to ninth display modules, for example, for a $313^{th}$ row line (the first row line of the second display module), four emission sections proceed for the first image frame during a time from 0 to 4.16 ms. However, in the case of the $312^{th}$ row line (the last row line of the first display module), the emission section may not proceed even once during the same time. For the $312^{th}$ low line, four emission sections may proceed for the first image frame during the time from 4.16 ms to 8.33 ms. However, during the same time, the $313^{th}$ row line proceeds four emission sections for the second image frame.

Accordingly, when a moving object (e.g., a vertical line moving left or right) is displayed on a modular display panel in a simultaneous scan manner, distortion of an image may be viewed at a boundary portion of the adjacent upper and lower display modules.

In the case of a still image being displayed, because the same image frame is repeated, distortion is not visible at the boundary of the upper and lower modules. In the case of the left and right display modules adjacent to each other (e.g., 9 display modules included in the same row line in the 9×9 modular display panel), the emission section of the same row line of each display module may proceed at the same time, and thus the aforementioned distortion phenomenon is not generated even if the moving object is displayed.

In the case of a high speed continuous scan method, a data setting section may be performed for a time that is much shorter than one frame time in each display module, as described above. Therefore, according to an embodiment, a modular display panel may be driven such that during one frame time, the data setting sections successively proceed from the first row line of the display module disposed uppermost to the last row line of the display module disposed lowermost by using the high speed continuous scan method.

For example, when the display modules from the display module disposed uppermost to the display module disposed lowermost, among the display modules included in the same column line of the 9*9 modular display panel, are referred to as the first to ninth display modules, as illustrated in FIG. 19B, the data setting section may proceed continuously from the first row line (the first row line of the first display module) to the 2808 row line (the last row line of the ninth display module) for one frame time.

As described above, because the emission section proceeds in a predefined method after the data setting section (that is, the first emission section of the plurality of emission sections is temporally continuous with the data setting section, and each of the emission sections proceeds at a predetermined time interval), each emission section of each display module may also continuously proceed from the first row line to the $2808^{th}$ row line.

In the case of driving the modular display panel in the high speed continuous scan method as described above, unlike the simultaneous scan method, the emission section may continuously proceed even at the boundary between the upper and lower display modules adjacent to each other. Accordingly, even when a moving object (e.g., a vertical line moving left or right) is displayed on the modular display panel, image distortion does not occur at the boundary between the upper and lower display modules adjacent to each other.

Hereinafter, a method of driving a modular display panel according to an embodiment will be described with reference to FIGS. 20 to 21B.

Figure 20:
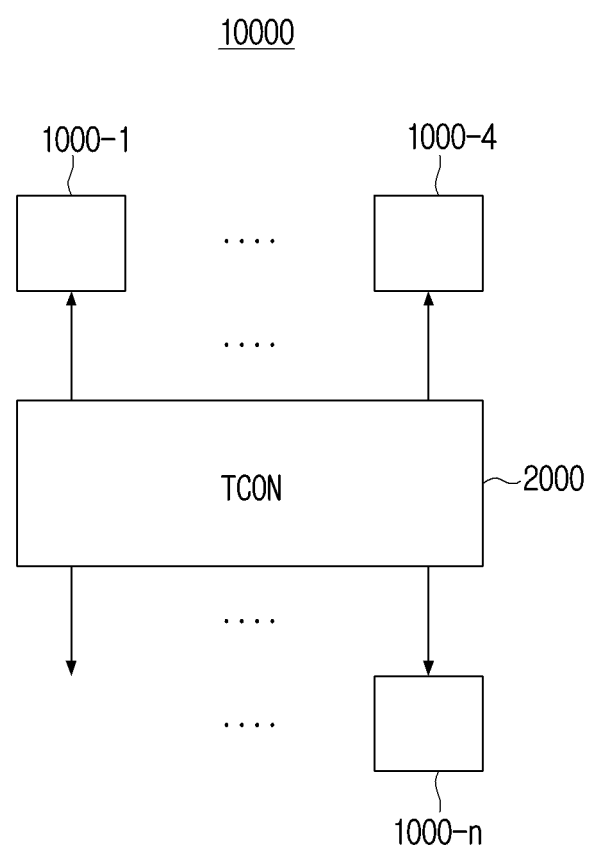
FIG. 20 is a block diagram of a display device according to an embodiment.

FIG. 20 is a block diagram of a display device according to an embodiment.

Referring to FIG. 20, the display apparatus 10000 may include a plurality of display modules 1000-1 to 1000-$n$ and a timing controller 2000.

The plurality of display modules 1000-1 to 1000-$n$ may be coupled or assembled in a matrix form to constitute one modular display panel, as shown in FIG. 18.

Each of the display modules 1000-1 to 1000-$n$ may include a display panel 100. Here, the display panel 100 may include a pixel array in which pixels composed of a plurality of inorganic light emitting elements are arranged in a plurality of row lines, and sub-pixel circuits respectively corresponding to the inorganic light emitting elements of the pixel array.

Each of the display modules 1000-1 to 1000-$n$ may include a gate driver for driving the sub-pixel circuits in the order of row lines based on various signals (e.g., a clock signal, a start signal (VST), etc.) provided by the TCON 2000 so that the inorganic light emitting elements of the pixel array emit light in a row line order.

Figure 21A:
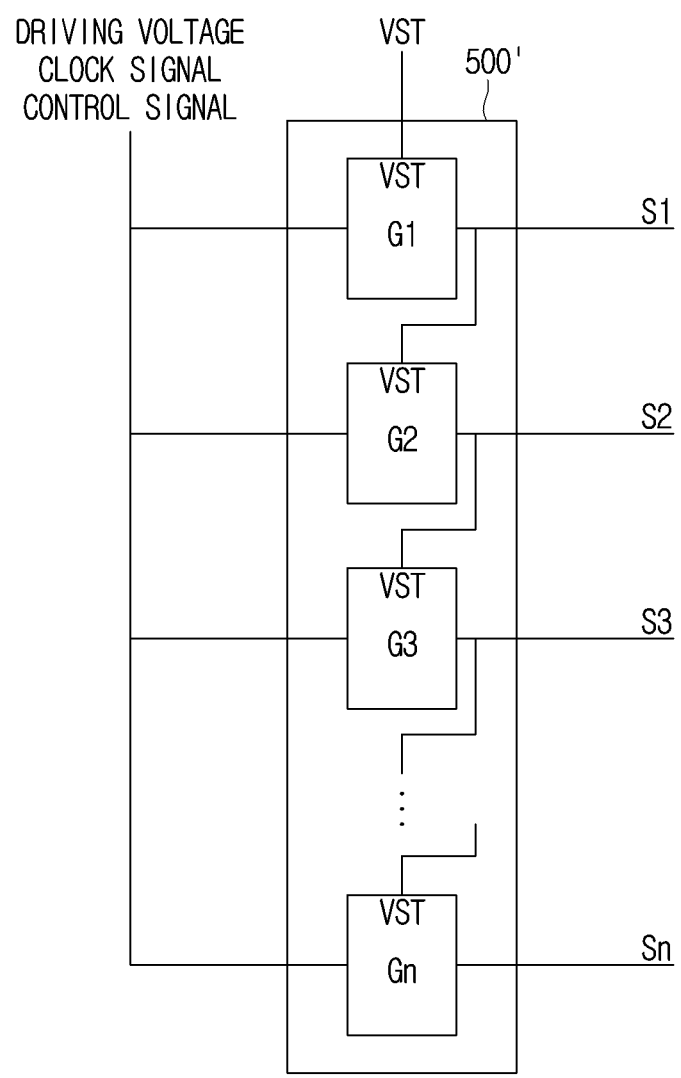
FIG. 21A is a block diagram illustrating a method of driving a gate driver according to an embodiment.

FIG. 21A is a block diagram illustrating a method of driving a gate driver according to an embodiment. Referring to FIG. 21A, the gate driver 500' may include unit circuits G1 to Gn respectively corresponding to row lines, and each of the unit circuits G1 to Gn may receive the driving voltage, the clock signal, the control signal, and the start signal VST to output the gate signals S1 to Sn corresponding to each row line.

In this example, the unit circuit may receive the output signal of the unit circuit corresponding to the previous row line as the start signal. As illustrated, G2 may receive an output signal S1 of G1 as a start signal, and G3 may receive an output signal S2 of G2 as a start signal. This is the same up to Gn. Because a unit circuit G1 corresponding to the first row line does not have a previous row line, the unit circuit G1 may be provided with a start signal VST separately from a TCON 2000.

Accordingly, the gate driver 500' may sequentially output the gate signals S1 to Sn in the order of the row lines based on the start signal VST provided by the TCON 2000.

The gate driver may include a scan driver for providing a scan signal in the order of row lines to the sub-pixel circuits such that the image data voltage is set in the order of row lines to the sub-pixel circuits. As described above, because the scan signals include VST(n), SP(n), Vcomp(n), SCCG(n), SPWM(n), Vini(n) and Vini2($n$), each of the display modules 1000-1 to 1000-$n$ may include at least one scan driver for providing each scan signal (VST(n), SP(n), Vcomp(n), SCCG(n), SPWM(n), Vini(n) and Vini2($n$)).

Accordingly, for example, a scan driver for providing a VST(n) signal may provide a scan signal VST(n) in the order of row lines based on a start signal provided by the TCON 2000. The scan driver for providing the SP(n) signal may provide the scan signal SP(n) in the order of the row lines based on the start signal provided by the TCON 2000. The scan driver for providing the SCCG(n) signal may provide the scan signal SCCG(n) in the order of the row lines based on the start signal provided by the TCON 2000. The scan driver for providing the SPWM(n) signal may provide the scan signal SPWM(n) in the order of the row lines based on the start signal provided by the TCON 2000. The scan driver for providing the Vcomp(n) signal may provide the scan signal Vcomp(n) in the order of the row lines based on the start signal provided by the TCON 2000. The scan driver for providing the Vini(n) signal may provide the scan signal Vini(n) in the order of the row lines based on the start signal provided by the TCON 2000. The scan driver for providing the Vini2($n$) signal may provide the scan signal Vini2($n$) in the order of the row lines based on the start signal provided by the TCON 2000.

The gate driver may include an emission driver that provides an emission signal in the order of row lines to the sub-pixel circuits such that the inorganic light emitting elements of the pixel array emit light in the order of row lines based on the image data voltage set according to the scan signals. As described above, because the emission signal includes an Emi(n), each of the display modules 1000-1 to 1000-*n* may include an emission driver for providing an emission signal Emi(n).

An emission driver for providing an Emi(n) signal may provide an emission signal Emi(n) in the order of row lines based on the start signal provided by the TCON 2000.

The TCON 2000 controls the overall operation of the display apparatus 10000. According to an embodiment, the TCON 2000 may drive the modular display panel in a high speed continuous scan manner. Hereinafter, for convenience, the 3×3 modular display panel shown in FIG. 18 will be described as an example. FIG. 21B illustrates display modules 1000-1, 1000-4, and 1000-7 disposed in a first column line of the plurality of display modules 1000-1 to 1000-9.

The TCON 2000 may control the driver 500 of each of the display modules 1000-1, 1000-4, and 1000-7 so that the inorganic light-emitting elements of the display modules 1000-1, 1000-4, and 1000-7 arranged in the first column line among the plurality of display modules 1000-1 to 1000-9 arranged in a matrix form sequentially emit light from the first row line of the display module 1000-1 to the last row line of the display module 1000-7.

As described above, because the gate driver 500' of each display module outputs the gate signal in the order of the row lines based on the start signal VST provided by the TCON 2000, the TCON 2000 may control the timing of providing the start signal to control the driving timing of each display module.

Figure 21B:
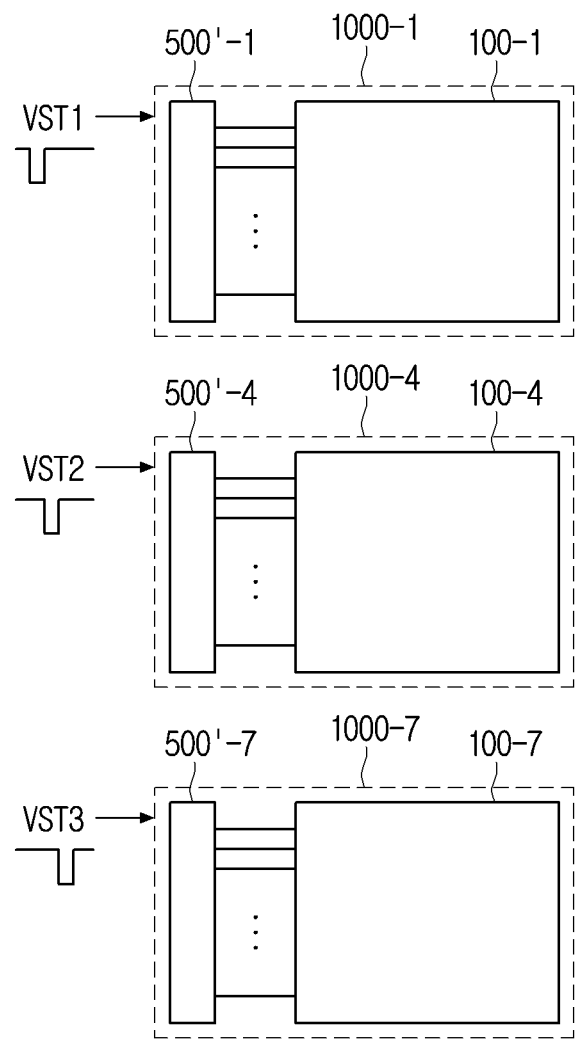
FIG. 21B illustrates display modules disposed in a first column line of the plurality of display modules of FIG. 18 according to an embodiment.

Referring to FIG. 21B, the TCON 2000 may provide the first start signal VST1 to the gate driver 500'-1 of the first display module 1000-1 so that the inorganic light-emitting elements of the first display module 1000-1 among the display modules 1000-1, 1000-4, and 1000-7 arranged in the first column line sequentially emit light from the first row line to the last row line.

When the first start signal VST1 is provided, the scan drivers and the emission driver of the first display module 1000-1 may provide scan signals and emission signal in the order of row lines to the sub-pixel circuits included in the display panel 100-1.

The TCON 2000 may provide a second start signal VST2 to a gate driver 500'-4 of the second display module 1000-4 so that the inorganic light-emitting elements of the second display module 1000-4 disposed adjacent to the lower portion of the first display module 1000-1 emit light in the order row lines following the light-emitting order of the inorganic light-emitting elements included in the last row line of the first display module 1000-1.

The TCON 2000 may provide the second start signal VST2 to the gate driver 500'-4 of the second display module 1000-4 such that the sub-pixel circuits included in the first row line of the second display module 1000-4 are driven following the driving order of the sub-pixel circuits included in the last row line of the first display module 1000-1.

When the second start signal VST2 is provided, the scan drivers and the emission driver of the second display module 1000-4 may provide scan signals and emission signals sequentially in the order of row lines to the sub-pixel circuits included in the display panel 100-4.

The TCON 2000 may provide the third start signal VST3 to a gate driver 500'-7 of the third display module 1000-7 so that the inorganic light-emitting elements of the third display module 1000-7 disposed adjacent to the lower portion of the second display module 1000-4 emit light in the order of row lines following the emission order of the inorganic light-emitting elements included in the last row line of the second display module 1000-4.

The TCON 2000 may provide a third start signal VST3 to the gate driver 500'-7 of the third display module 1000-7 so that sub-pixel circuits included in the first row line of the third display module 1000-7 are driven following the driving order of the sub-pixel circuits included in the last row line of the second display module 1000-4.

When the third start signal VST3 is provided, the scan drivers and the emission driver of the third display module 1000-7 may provide scan signals and emission signals in the order of row lines to the sub-pixel circuits included in the display panel 100-7.

Although the operation of the display modules 1000-1, 1000-4, and 1000-7 disposed in the first column line has been described above, the display modules 1000-2, 1000-5 and 1000-8 disposed in the second column line or the display modules 1000-3, 1000-6, and 1000-9 disposed in the third column line are also the same.

As described above, by driving the modular display panel in a high speed continuous scan method, it is possible to fundamentally eliminate visible image distortion at a boundary between the upper and lower display modules when the panel is driven in the simultaneous scan method.

While the plurality of display modules 1000-1 to 1000-*n* included in the display apparatus 10000 are controlled by one timing controller 2000 in FIG. 20, embodiments are not limited thereto. According to an embodiment, the display apparatus 10000 may include at least one timing controller for controlling the plurality of display modules 1000-1 to 1000-*n*.

As described above, according to various embodiments, by driving the inorganic light-emitting element in a PWM mode by using an active matrix (AM) method, a phenomenon that the wavelength of light emitted by the inorganic light-emitting element changes over a gray level may be prevented from occurring. In addition, a stain due to the difference between the threshold voltage between the driving transistors may be visibly eliminated. In addition, color correction may be facilitated. In a display apparatus including one display module or a modular display panel including a plurality of display modules, stain compensation or color correction of the display panel may be facilitated. Instantaneous peak power consumption may be reduced by driving the display panel such that the inorganic light emitting elements sequentially emit light in the order of row lines. The effect of the drop of the driving voltage generated differently for each position of the display panel may be compensated for by the process of setting the data voltage. When configuring the modular display panel by combining the plurality of display modules, distortion of an image that may occur at the boundary of the upper and lower display modules may be removed.

The description of the disclosure is merely illustrative of the technical idea of the disclosure, and a person skilled in the art to which the disclosure belongs will recognize various modifications and variations without departing from the essential characteristics of the disclosure. For example, although the sub-pixel circuit is implemented as a PMOS TFT, it will be understood by those of ordinary skill in the art that a sub-pixel circuit may be implemented using an NMOS TFT or a CMOS TFT.

While aspects of embodiments have been particularly shown and described, it will be understood that various changes in form and details may be made therein without departing from the spirit and scope of the following claims.

What is claimed is:

1. A display apparatus comprising:
   a modular display panel comprising a plurality of display modules disposed in a matrix form; and
   a timing controller,
   wherein each of the plurality of display modules comprises:
      a display panel comprising a pixel array in which pixels each composed of a plurality of inorganic light emitting elements are arranged in a plurality of row lines, and sub-pixel circuits respectively corresponding to inorganic light emitting elements of the pixel array; and
      a driver comprising a data driver configured to provide data driver signals to the sub-pixel circuits and a gate driver configured to drive the sub-pixel circuits in an order of the plurality of row lines based on a start signal provided from the timing controller,
   wherein the timing controller is further configured to:
      provide a first start signal to the gate driver of a first display module among the plurality of display modules to control the inorganic light emitting elements of the first display module to sequentially emit light from a first row line of the first display module to a last row line of the first display module, according to first data driver signals provided by the data driver of the first display module, and
      provide a second start signal to the gate driver of a second display module disposed adjacent to a bottom of the first display module to control the inorganic light emitting elements of the second display module to sequentially emit light from a first row line of the second display module to a last row line of the second display module, according to second data driver signals provided by the data driver of the second display module,
   wherein the modular display panel is configured to be driven in a first mode such that during one frame time, the second start signal is provided to the gate driver of the second display module after the first start signal is provided to the gate driver of the first display module, and a data setting section successively proceeds from a first row line of a display module disposed uppermost to a last row line of a display module disposed lowermost in a same column line of the modular display panel during one frame time, and
   wherein the modular display panel is configured to be driven in a second mode such that the data setting section of each of the plurality of display modules proceeds simultaneously,
   wherein each of the sub-pixel circuits comprises:
      a constant current generator circuit which comprises a first driving transistor and is configured to provide a constant current to a corresponding inorganic light-emitting element based on a constant current generator data voltage; and
      a PWM circuit which comprises a second driving transistor and is configured to control a time during which the constant current is provided to the corresponding inorganic light-emitting element based on the PWM data voltage, and
   wherein the first driving transistor, the second driving transistor and the corresponding inorganic light-emitting element are connected in series.

2. The display apparatus of claim 1, wherein the driver is further configured to, based on the start signal, provide a gate signal in the order of the plurality of row lines to the sub-pixel circuits to drive the sub-pixel circuits in the order of the plurality of row lines, and
   wherein the gate signal comprises a scan signal configured to provide an image data voltage to the sub-pixel circuits and an emission signal configured to control inorganic light emitting elements of the pixel array to emit light based on the image data voltage.

3. The display apparatus of claim 2, wherein the sub-pixel circuits are driven in an order of the data setting section and a plurality of emission sections for each row line of the plurality of row lines with respect to one image frame, and
   wherein the driver is further configured to provide the scan signal to the sub-pixel circuits of a corresponding row line during the data setting section of the corresponding row line, and apply the emission signal to the sub-pixel circuits of the corresponding row line during each of the plurality of emission sections of the corresponding row line.

4. The display apparatus of claim 3, wherein a first emission section among the plurality of emission sections is temporally adjacent the data setting section, and
   wherein the plurality of emission sections have a preset time interval from each other.

5. The display apparatus of claim 3, wherein the image data voltage comprises the constant current generator data voltage and a pulse width modulation (PWM) data voltage.

6. The display apparatus of claim 5, wherein the constant current generator circuit is further configured to provide, in each of the plurality of emission sections, the constant current to the corresponding inorganic light-emitting element based on a first voltage applied to a gate terminal of the first driving transistor, and
   wherein the first voltage is based on the constant current generator data voltage and a threshold voltage of the first driving transistor.

7. The display apparatus of claim 6, wherein the constant current generator circuit comprises:

a first transistor comprising a source terminal to which the constant current generator data voltage is applied and a drain terminal connected to a source terminal of the first driving transistor; and a second transistor comprising a source terminal connected to a drain terminal of the first driving transistor, and a drain terminal connected to the gate terminal of the first driving transistor, wherein the constant current generator circuit is further configured to apply, in the data setting section, based on the first transistor and the second transistor being turned on while the first driving transistor is turned on, a voltage which is a sum of the constant current generator data voltage and the threshold voltage of the first driving transistor to the gate terminal of the first driving transistor.

8. The display apparatus of claim 5, wherein the PWM circuit is configured to control, in each of the plurality of emission sections, a time during which the constant current is provided to the corresponding inorganic light-emitting element based on a second voltage applied to a gate terminal of the second driving transistor, and wherein the second voltage is based on a threshold voltage of the second driving transistor, the PWM data voltage, and a sweep voltage sweeping between two voltages.

9. The display apparatus of claim 8, wherein a drain terminal of the second driving transistor is connected to a source terminal of the first driving transistor, wherein the constant current generator circuit is configured to, in each of the plurality of emission sections, provide the constant current to the corresponding inorganic light-emitting element while a driving voltage is applied to the source terminal of the first driving transistor, wherein the PWM circuit is configured to, in each of the plurality of emission sections, apply the driving voltage to the source terminal of the first driving transistor during a time period in which the second driving transistor is turned on while the second voltage is changed according to a change of the sweep voltage, and wherein the time period in which the second driving transistor is turned on is based on a magnitude of the PWM data voltage.

10. The display apparatus of claim 8, wherein the sweep voltage is a portion of an input sweep signal selected based on the emission signal, wherein the input sweep signal has a voltage which linearly and repeatedly varies from a first voltage to a second voltage, and wherein the input sweep signal is commonly applied to each of the sub-pixel circuits of the display panel.

11. The display apparatus of claim 10, wherein the sweep voltage, in each of the plurality of emission sections, sweeps voltages between the first voltage and the second voltage one time, and wherein a start voltage at which the sweep voltage starts sweeping varies according to a row line.

12. The display apparatus of claim 5, wherein the PWM circuit is configured to, in each of the plurality of emission sections, control a time during which the constant current is provided to the corresponding inorganic light-emitting element based on a third voltage applied to a gate terminal of the second driving transistor, and wherein the third voltage is based on the PWM data voltage in which a threshold voltage of the second driving transistor is compensated and a sweep voltage sweeping between two voltages.

13. The display apparatus of claim 3, wherein the sub-pixel circuits are driven by a first driving voltage in each of the plurality of emission sections, and are driven by a second driving voltage separate from the first driving voltage in the data setting section.

14. The display apparatus of claim 1, wherein in the first mode, the first row line of the second display module is driven to emit light before a middle row line of the first display module during one frame time, and wherein in the second mode, the first row line of the second display module is driven to emit light after the middle row line of the first display module during one frame time.

* * * * *